(12) United States Patent
Robinson et al.

(10) Patent No.: US 6,409,537 B2
(45) Date of Patent: Jun. 25, 2002

(54) WATTHOUR METER SOCKET ADAPTER WITH AUXILIARY COMPONENT MOUNTS

(75) Inventors: Darrell Robinson, Highland Township; Allen V. Pruehs, Howell, both of MI (US)

(73) Assignee: Ekstrom Industries, Inc., Farmington Hills, MI (US)

(*) Notice: Subject to any disclaimer, the term of this patent is extended or adjusted under 35 U.S.C. 154(b) by 5 days.

(21) Appl. No.: 09/738,480

(22) Filed: Dec. 15, 2000

Related U.S. Application Data

(63) Continuation of application No. 09/327,022, filed on Jun. 7, 1999, now Pat. No. 6,152,764.

(51) Int. Cl.[7] .......................................... H01R 33/945
(52) U.S. Cl. .................................................. 439/517
(58) Field of Search ................................ 439/517, 508; 361/662, 668, 667, 669, 741, 756, 663

(56) References Cited

U.S. PATENT DOCUMENTS

| | | | |
|---|---|---|---|
| 3,061,763 A | 10/1962 | Ekstrom | 361/669 |
| 3,662,224 A * | 5/1972 | Rauch | 439/741 |
| 4,127,924 A | 12/1978 | Koss | 29/413 |
| 4,977,482 A | 12/1990 | Langdon et al. | 361/661 |
| 5,023,747 A | 6/1991 | Lindsay | 361/117 |
| 5,027,056 A * | 6/1991 | Russillo, Jr. et al. | |
| 5,088,004 A | 2/1992 | Howell | 361/669 |
| 5,181,166 A | 1/1993 | Howell | 361/659 |
| 5,377,080 A * | 12/1994 | Lin | 439/756 |
| 5,423,695 A | 6/1995 | Robinson et al. | 439/517 |
| 5,571,031 A | 11/1996 | Robinson et al. | 439/517 |
| 5,572,396 A | 11/1996 | Robinson | 439/517 |
| 5,577,933 A | 11/1996 | Robinson et al. | 439/517 |
| 5,586,913 A | 12/1996 | Robinson et al. | 439/638 |
| 5,590,179 A | 12/1996 | Shincovich et al. | 379/186 |
| 5,704,804 A | 1/1998 | Robinson et al. | 439/517 |

* cited by examiner

Primary Examiner—Tulsidas Patel
(74) Attorney, Agent, or Firm—Young & Basile, PC

(57) ABSTRACT

A support supports a circuit board in a non-interferingly manner with electrical contacts in a watthour meter socket adapter housing. In one aspect, slots are formed in posts and receive opposed ends of the circuit board. An end support post having an outwardly projecting, downwardly inclined top surface provides a snap connection of the circuit board to the housing. Alternately, the support includes legs carrying conductive elements formed on the circuit board and extending through apertures in the base of the housing for electrical connection external of the socket adapter. In another aspect, a circuit board is provided with contacts along one edge which form spring jaws for receiving a terminal. A conductive tab on the circuit board resiliently completes an electrical circuit between a contact in the housing and a circuit or electrical component on the circuit board. The supports also releasably receive flanges on electrical components for direct mounting of the components.

22 Claims, 36 Drawing Sheets

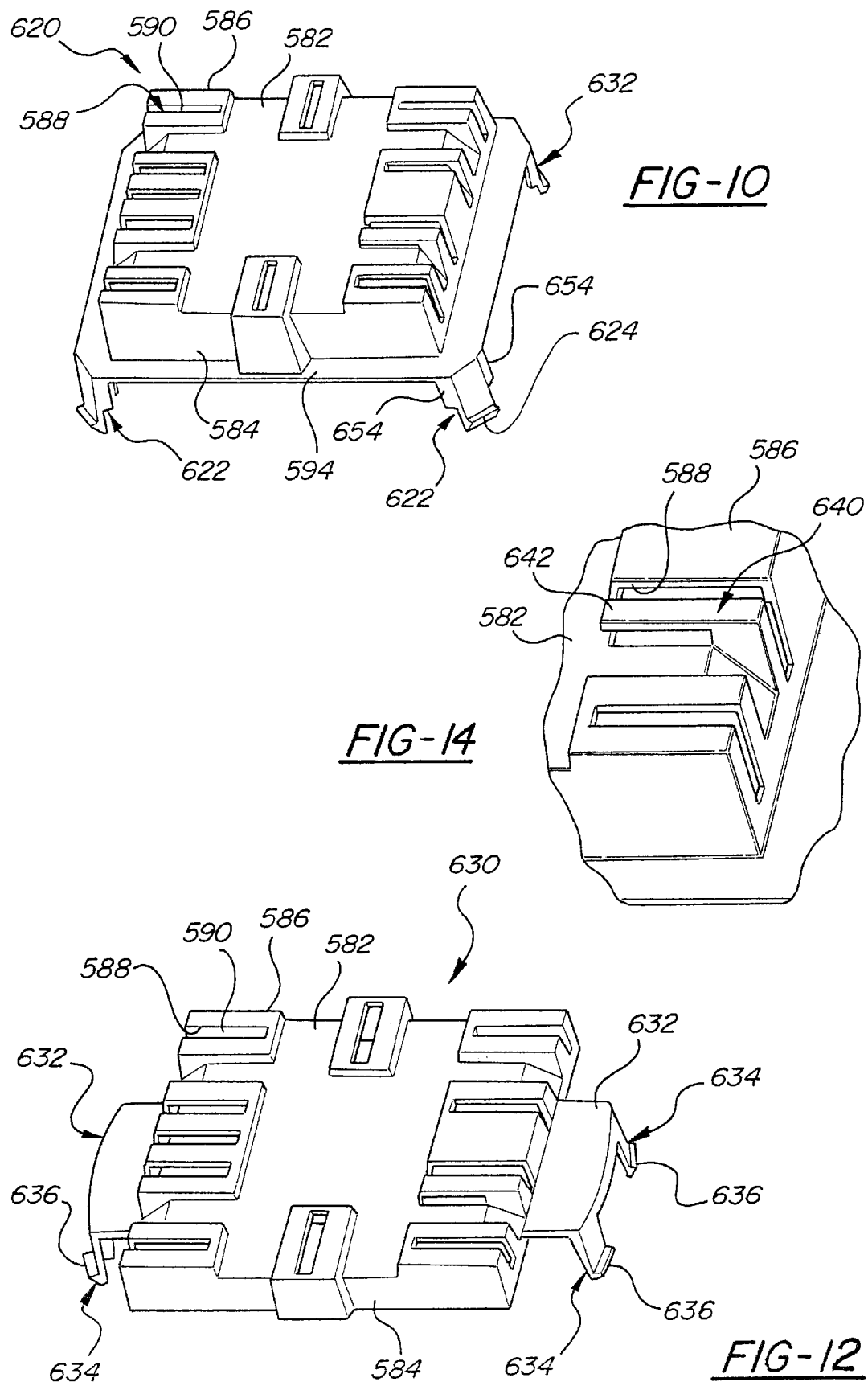

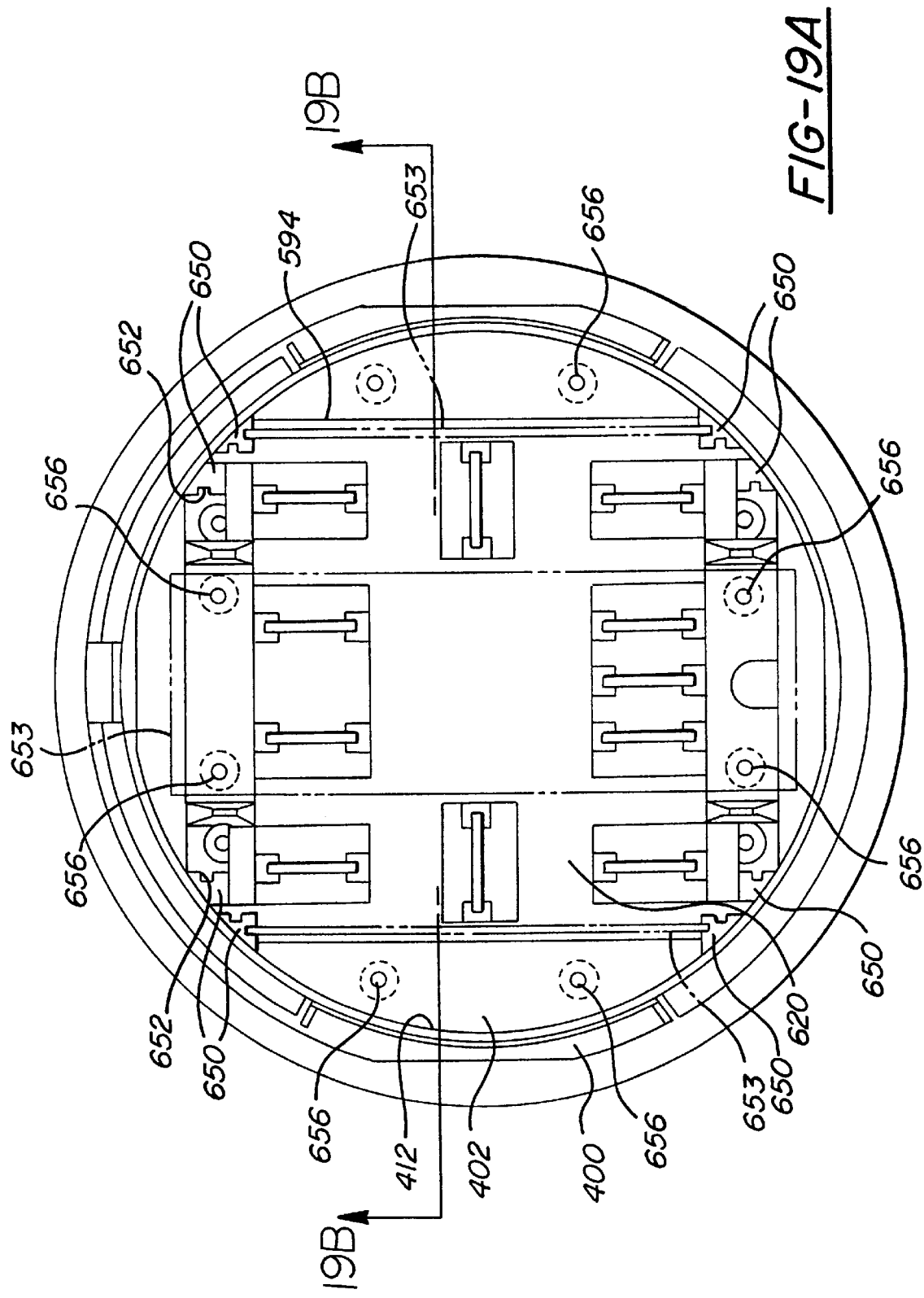

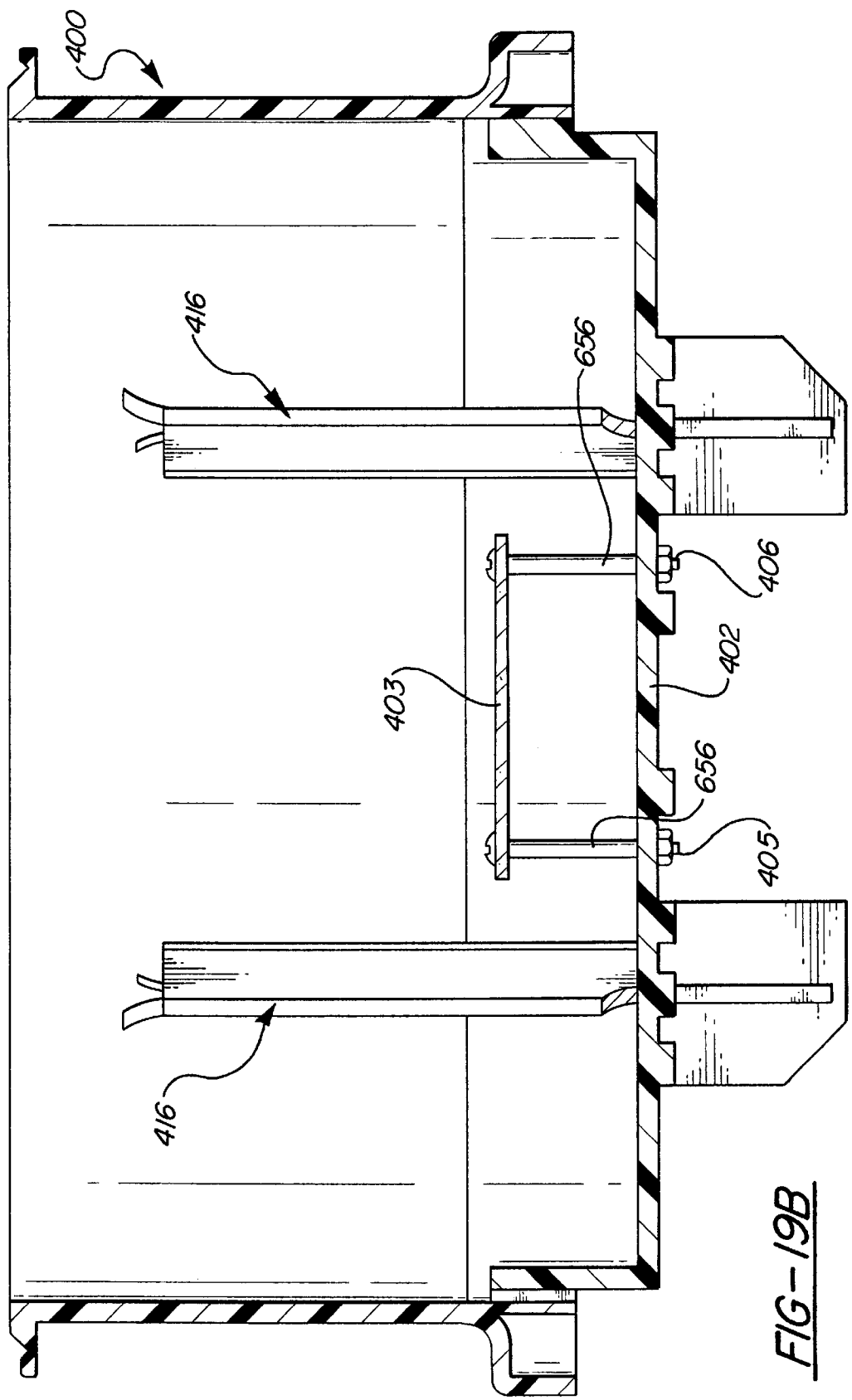

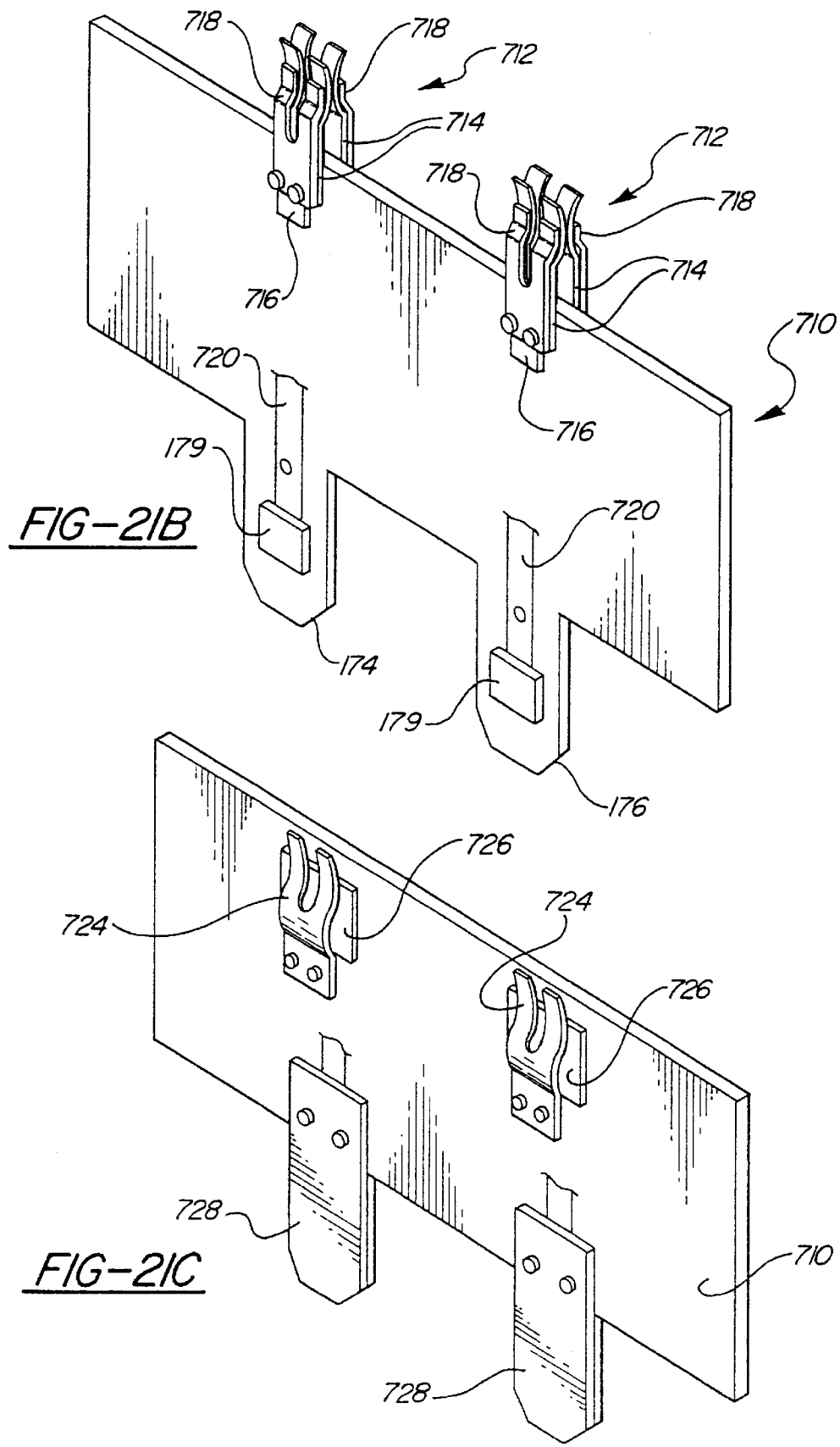

WATTHOUR METER SOCKET ADAPTER WITH AUXILIARY COMPONENT MOUNTS

CROSS REFERENCE TO RELATED APPLICATION

This application is a continuation U.S. patent application Ser. No. 09/327,022, filed Jun. 7, 1999, now U.S. Pat. No. 6,152,764, and entitled "WATTHOUR METER SOCKET ADAPTER WITH CIRCUIT BOARD MOUNTS," the entire contents of which are incorporated herein by reference.

BACKGROUND OF THE INVENTION

1. Field of the Invention:

The present invention relates, in general, to electrical watthour meters and, specifically, to watthour meter mounting enclosures or socket adapters.

2. Description of the Art

Electrical power is supplied to an individual site or service by external electrical power line conductors located above or below ground. In a conventional arrangement, electrical power line conductors are connected to terminals in a watthour meter socket mounted on a building wall. Electrical load conductors are connected to another set of terminals in the meter socket and extend to the electrical distribution network in the building. A watthour meter is connected to both pairs of terminals in the meter socket to measure the electric power drawn through the load conductors.

Due to the current trend toward the use of plug-in watthour meters, A to S type socket adapters have been devised which convert A-base type bottom connected watthour meter sockets to receive plug-in watthour meters. Another type of socket adapter has been devised which allows the installation of other devices between the watthour meter socket and a plug-in watthour meter.

Such socket adapters employ a generally annular base having a shell joined thereto and extending outward from one side of the base. Jaw contacts are mounted in the shell and base. Each jaw contact has a female jaw portion disposed interiorly within the shell and a male blade terminal connected to the female jaw portion and extending outward through the base for plug-in connection to the terminals in the meter socket housing.

In previous watthour meter socket adapters, the jaw contacts were of two different constructions. In one construction, the jaw contacts have a folded over design formed of a base wall fixedly mounted by a fastener to the shell of the socket adapter and two spaced sidewalls extending therefrom. The outer ends of the sidewalls are folded over inwardly between the sidewalls and terminate in parallel end flanges which slidably receive a blade terminal of a watthour meter. A blade terminal is usually fixedly connected to the base wall of the jaw contact for connection to jaw contact in a meter socket.

In the second construction, the jaw contacts are formed of a generally planar terminal having opposed first and second ends. An angularly bent spring clip is riveted at one end to an intermediate portion of the terminal and extends to a contact edge disposed in separable engagement with the first end of the terminal to form a jaw for receiving the blade terminal of a watthour meter. The spring clip forcibly biases the watthour meter terminal into secure electrical engagement with the terminal. The second end of the blade terminal extends exteriorly from the base of the watthour meter socket adapter for releasable engagement in a socket jaw contact. A cotter pin is inserted through an intermediate aperture in the terminal to fixedly mount the terminal and jaw contact in position in the watthour meter socket adapter.

In certain applications, such as automatic metering, surge suppression, etc., it is necessary to mount one or more circuit boards in the socket adapter housing. Such circuit boards must be mounted in a manner so as not to interfere with the slide-in connection of the meter blade terminals with the jaw contacts in the socket adapter. In order to mount such circuit boards in prior socket adapters, modifications to the socket adapter housing were typically necessary.

U.S. Pat. Nos. 5,023,747 and 5,572,396 disclose circuit boards mounted in close proximity to or directly on the base wall of a watthour meter socket adapter. The circuit boards have planar electrically conductive extensions with a slot therein which overlays an aperture in the base wall and receives a blade terminal or contact in a watthour meter socket adapter to electrically connect the contact and the electrical elements carried on the circuit board. While the circuit boards shown in these patents do not necessarily require modification to the socket adapter housing, the planar extensions which receive the jaw contact therethrough consume a considerable amount of space within the socket adapter housing. This poses a problem due to the limited amount of available space within a conventional socket adapter housing and limits the overall size and, therefore, the amount of circuitry that can be mounted on a circuit board.

Thus, it would be desirable to provide a watthour meter socket adapter which includes means for conveniently mounting one or more circuit boards in the housing in a non-interfering position with respect to the jaw blades of the socket adapter. It would also be desirable to provide a watthour meter socket adapter which includes means for mounting one or more circuit boards in the socket adapter housing in engagement with a safety shield mounted in the socket adapter housing. It would also be desirable to provide a watthour meter socket adapter which includes a number of separate circuit board supports which may be employed to mount one or more circuit boards in a number of different positions within the socket adapter housing. It would also be desirable to provide a unique circuit board for use in a watthour meter socket adapter which is capable of receiving an external blade terminal. It would also be desirable to provide a circuit board construction for use in a watthour meter socket adapter which enables the circuit board to automatically and, specifically, the circuit or components on the circuit board make an electrical connection to one of the contacts mounted within the socket adapter.

SUMMARY OF THE INVENTION

The present invention is a watthour meter socket adapter having unique means for mounting one or more circuit boards in a non-interfering position with respect to the jaw blades or contacts of the socket adapter.

According to the present invention, a support is carried on the housing. In one aspect of the present invention the support includes, at least one pair and, preferably, a plurality of aligned pairs of slots are formed in the housing of a socket adapter, generally at the junction of the base and sidewall of the socket adapter housing. The slot pairs can extend in any angular orientation within the socket adapter housing. The aligned pairs of slots support a circuit board generally perpendicular to the base of the socket adapter housing.

In another aspect of the invention, a plurality of posts are mounted on the base of the socket adapter housing and support a circuit board in an orientation generally parallel to the base of the socket adapter housing.

In yet another aspect of the invention, certain of the slot pairs are alignable with similar slots formed in a safety shield mountable within the housing to provide additional support for a printed circuit board which is generally disposed exteriorly of the safety shield, between the outer peripheral portion of the safety shield and the adjacent sidewall of the socket adapter housing.

In yet another aspect of the present invention, the support is in the form of aligned pairs of tubular support posts carried on the base and projecting outward therefrom for receiving a circuit board in a generally perpendicular position relative to the base.

In another aspect, an end support member is disposed adjacent to each pair of support posts and includes an outer projecting lip on an inclined end to snap mount the circuit board in the housing.

In another aspect, one of the pins of each pair of pins is formed with a shorter height relative to the base wall for supporting a circuit board in conjunction with the other pin of each pair as well as the end support pin in a generally parallel orientation with respect to the base.

In another aspect, the support includes a printed circuit board having at least one and preferably two outwardly projecting legs, each leg carrying an electrically conductive terminal or pad on one or both sides. The legs project through apertures in the base of the socket adapter housing for electrical connection to an external electrical circuit.

The support, according to one aspect of the invention, provides at least one and, preferably, a pair of open notches are formed in opposed side edges of a printed circuit board which are positioned to receive the bendable tab formed on a surge ground conductor mounted in the socket adapter housing.

In yet another aspect of the invention, the support is in the formed of aligned pairs of tubular support posts carried on the base and projecting outward from the base. Each support has a sidewall discontinuity opening to a through bore extending through the support or post. The discontinuity and open end of the through bore enable the circuit board to be inserted between aligned pairs of supports in a generally perpendicular orientation with respect to the base wall of the socket adapter housing. The open end of the through bore also enables fasteners to be inserted through aligned apertures in a circuit board oriented generally parallel to the base wall of the socket adapter housing, and into the through bore in the supports for securely fixing a circuit board in a generally parallel position with respect to the base wall.

In another aspect of the present invention, a circuit board includes at least one and possibly two opposed spring contact clips which are fixedly mounted on an outer edge of the circuit board and spaced apart to receive a blade terminal, such as a blade terminal of a watthour meter therein. An electrical circuit and/or a conductive path on the circuit board is disposed in electrical communication with the contact clips.

In yet another aspect of the invention, access is provided through the socket adapter to an electrical component mounted on the circuit board. Access is provided by an aperture formed in one of the sidewall and/or base wall of the socket adapter in which an electrical control component, such as a connector, switch, etc., can be electrically connected to the electrical component internally within the socket adapter housing and controllable externally of the socket adapter or connected to external control circuits in the case of a connector. Alternately, an aperture formed in an insulated shield mounted over the electrical contacts in the socket adapter housing may support a switch or connector to again provide electrical connection between the electrical component mounted on the circuit board and an external source.

In another aspect of the present invention, a biased arm is mounted on a circuit board and is electrically connected with a circuit, component or conductive path carried on the circuit board. An outer end portion of the biased arm projects outwardly from the circuit board. The circuit board is positioned in close proximity to one of the electrical contacts, jaw contacts, blade terminals or jaw blades of a watthour meter socket adapter such that the biased arm electrically contacts the electric contact of the socket adapter to complete an electrical circuit between the circuit or component mounted on the circuit board and the electrical contact.

In another aspect of the invention, a spring mounting jaw is releasably mountable about an edge portion of a jaw blade and receives a circuit board between the jaw blade and one spring arm of the mounting jaw. A conductive terminal or pad on the circuit board engages the mounting jaw or is biased into contact with one jaw blade by the mounting jaw to complete a circuit with the jaw blade and provide electrical power from the jaw blade to the electrical components on the circuit board. In this configuration, electrical power is delivered to the circuit board without the need for mechanical fasteners or connectors usually used to supply power to circuit boards in a socket adapter housing.

In another aspect, the circuit board mounting supports described in the present invention are also adapted for receiving flanges carried or formed on electrical components, such as relays, timers, telephone modems, circuit breakers, etc. This enables such components to be releasably mountable in the housing of a socket adapter again without the need for mechanical fastening arrangements. This reduces the overall cost of manufacturing the socket adapter as well as making the socket adapter extremely versatile in receiving auxiliary components without the need for modification to the existing socket adapter housing and jaw blade structure.

In the various embodiments of the present invention, one or more circuit boards can be easily mounted in the housing of a watthour meter socket adapter housing. The circuit board supports can be positioned to support the circuit boards exteriorly of a safety shield in the space between the shield and the adjacent sidewall of the housing. Alternately, the circuit board supports may be employed without a shield and positioned at various locations around the periphery of the sidewall of the housing and/or on the base wall or on the base wall between the socket adapter jaw contacts for supporting one more circuit boards in various orientations about the jaw blades without interfering with the function of the jaw blades in releasably receiving blade terminals of a watthour meter.

The present invention also provides a unique snap-in connection of a circuit board in a socket adapter housing thereby eliminating the need for separate mechanical fasteners and manufacturing/assembling operations necessary to securely fasten the circuit board to the base wall of the socket adapter as in prior socket adapters.

The unique provision of a circuit board with outwardly projecting legs enables a circuit board to be mounted in any one or more pair of apertures typically disposed in a socket adapter. The circuit board provides a convenient location for mounting electrical components within a socket adapter, with access being provided to the electrical component through plugs or switches mounted in apertures in the sidewall or base wall of the socket adapter or in an aperture in a safety shield overlaying the jaw contacts of the socket adapter.

The provision of a resilient arm projecting from the circuit board and electrically connected to an electrical component or circuit on the circuit board enables an electrical circuit to be completed between a circuit or electrical component on the circuit board and one of the electrical contacts in the socket adapter, such as a line jaw blade or jaw contact, to provide electrical power or a ground connection to the circuit board.

BRIEF DESCRIPTION OF THE DRAWINGS

The various features, advantages and other uses of the present invention will become more apparent by referring to the following detailed description and drawing in which:

FIG. 10 is a perspective view of yet another embodiment of a safety shield according to present invention;

FIG. 12 is a perspective view of another embodiment of a safety shield according to the present invention;

FIG. 14 is an enlarged, partial, perspective view showing a feature of the safety shields shown in FIGS. 7, 10 and 12;

FIG. 19A is a plan view showing one embodiment of circuit board mounts in a socket adapter;

FIG. 19B is a partially cross sectioned view generally taken along line 19B—19B in FIG. 19A;

FIG. 21B is a perspective view of a modified printed circuit board according to the present invention;

FIG. 21C is a perspective view of another embodiment of a printed circuit board according to the present invention;

DESCRIPTION OF THE PREFERRED EMBODIMENTS

Figure 1:
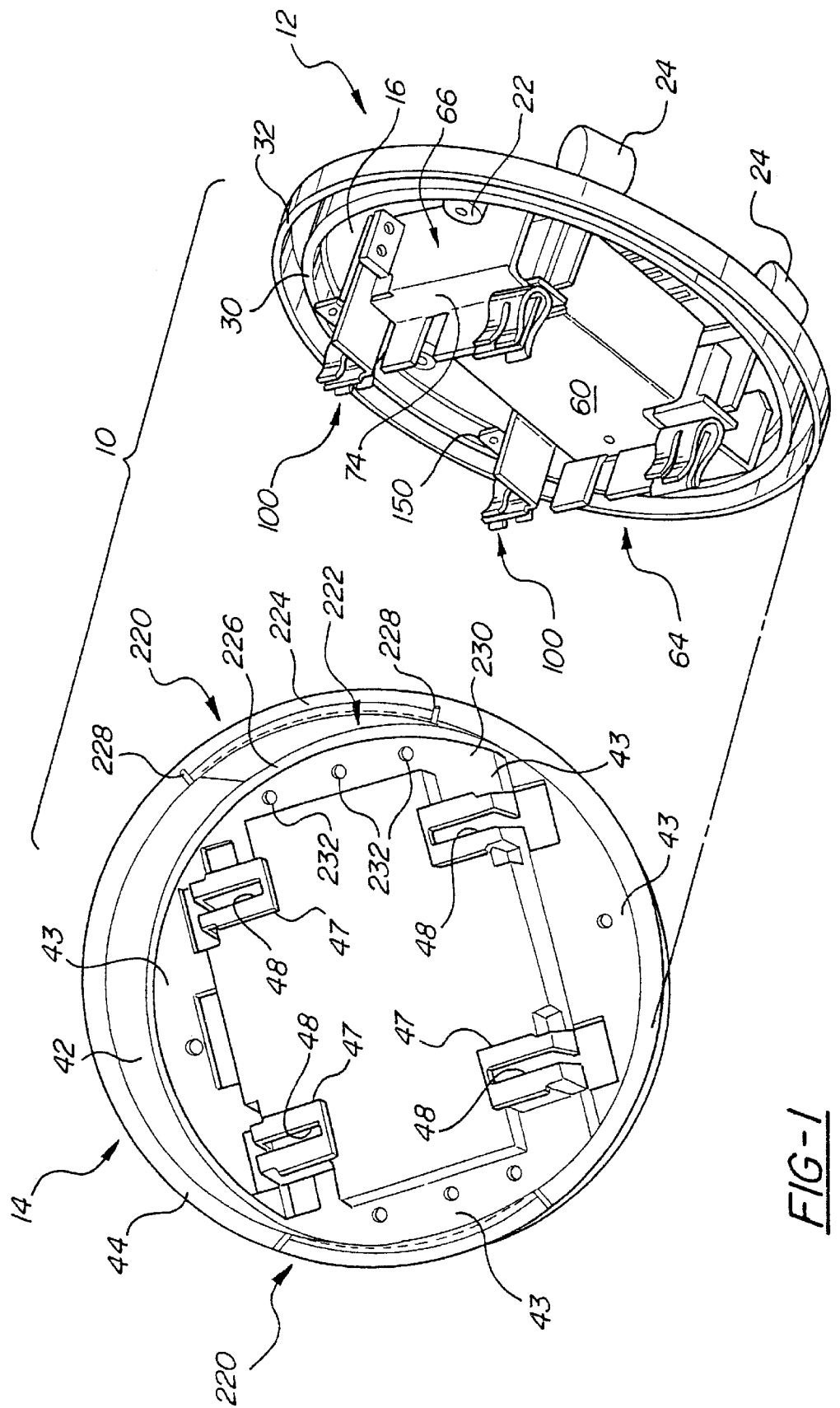
FIG. 1 is an exploded, perspective view showing one embodiment of a watthour meter socket adapter according to the present invention.
Figure 2:
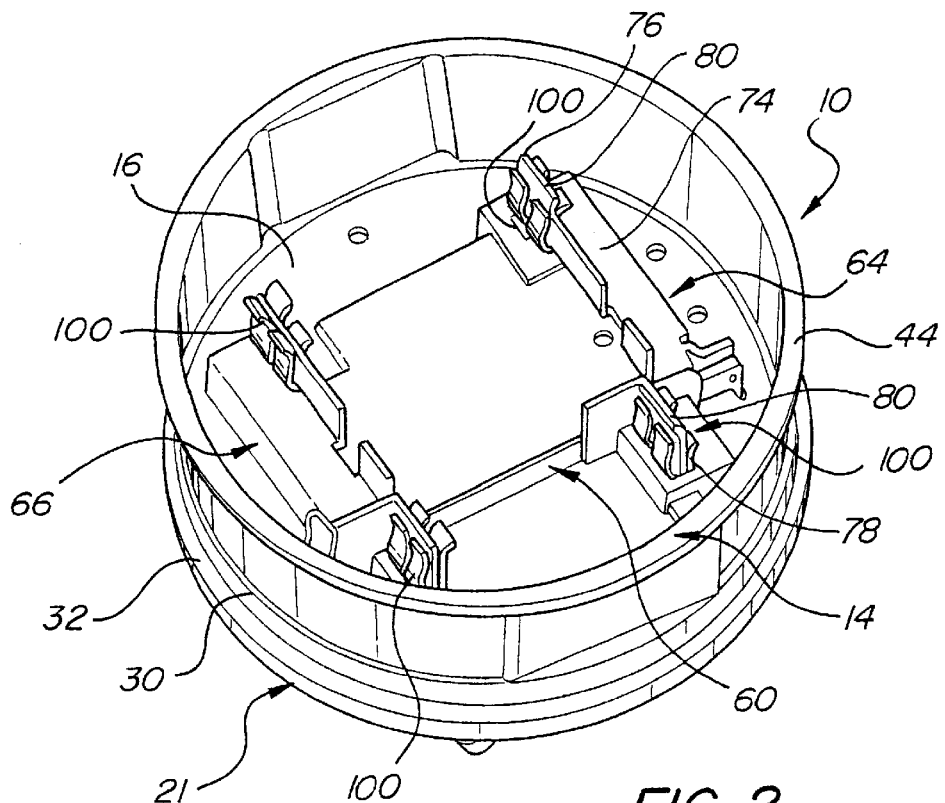
FIG. 2 is a perspective view of the watthour meter socket adapter shown in FIG. 1, with the dead front shield portion of the shell removed.
Figure 3:
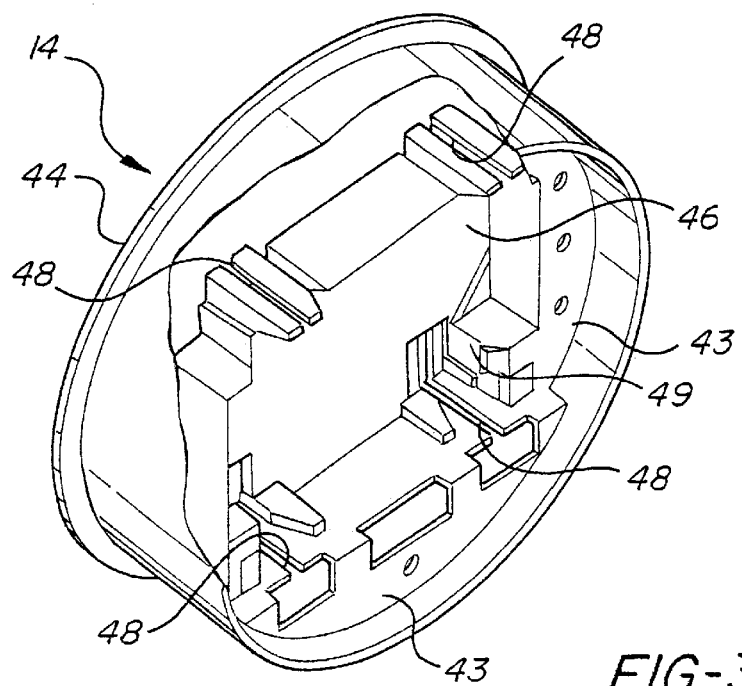
FIG. 3 is a partially broken-away, rear, perspective view of the shell of the socket adapter shown in FIG. 1.

In order to better describe and appreciate the advantages of the present invention, a description of the conventional construction of an electric watthour meter socket adapter or socket extender/adapter, both hereafter referred to as a socket adapter, will be provided with reference to FIGS. 1 and 2. A conventional socket adapter 10 includes contacts designed to receive blade terminals of a conventional electric watthour meter, not shown, in a releasable connection. The socket adapter 10 includes terminals, described hereafter, which plug into mating contacts in a watthour meter socket. The number of contacts and terminals in the socket adapter 10 will vary depending upon the type of electric service at a particular user site, FIG. 1 depicts, by way of example only, a single phase electric service.

As shown in FIGS. 1, 2, 3, and 4, the socket adapter 10 includes a base portion 12 and a shell portion 14 which are fixedly joined together by suitable means, such as fasteners. The base 12 has a central wall 16 of generally circular shape. A plurality of generally rectangular bosses 18 are formed on the central wall 16. Each of the bosses 18 has a slot 20 formed therein which extends completely through each boss 18 and the central wall 16 to receive a blade terminal therethrough, as described hereafter. A plurality of cylindrical bosses 22 are also formed on and extend outward from one surface of the central wall 16. Through bores are formed in each boss 22 for receiving a fastener to join the shell 14 to the base 12. A plurality of outwardly extending legs 24 are formed on a back surface of the central wall 16 and are provided in an appropriate number and spaced from one of the contacts or blade terminals which extends through the base 12.

An annular, raised, inner peripheral edge flange 30 is formed on the base 12 and extends outward from one surface of the central wall 16. An outer peripheral edge flange 32 is spaced radially outward from the inner flange 30. A plurality of circumferentially spaced ribs 34 extend radially between the inner and outer peripheral edge flanges 30 and 32.

The inner peripheral edge flange 30 includes an annular seat for receiving a peripheral edge portion of the shell 14 when the shell 14 is engaged with the base 12. The outer peripheral edge flange 32 extends radially outward from the inner peripheral edge flange 30 and forms a mounting flange which mates with the mounting flange on the cover of the watthour meter socket, not shown. A conventional sealing ring, also not shown, is employed to surround and lockingly join the outer peripheral edge flange 32 to the mounting flange on the meter socket.

The shell 14 of the socket adapter 10 is formed with a generally annular sidewall 42. The sidewall 42 terminates in an enlarged diameter exterior end mounting flange 44. The mounting flange 44 is designed to mate with a corresponding mounting flange on a conventional watthour meter, not shown. A sealing ring, not shown, may be employed to encompass and lockingly connect the mounting flange 44 on the shell 14 and the mounting flange on a watthour meter.

The annular sidewall 42 of the shell 14 has an opposed annular edge 45 spaced from the exterior end mounting flange 44. A generally solid wall 46 is integrally connected to the sidewall 42 by a plurality of flanges 43 and is spaced between the exterior mounting flange 44 and the opposed edge 45. The wall 46 projects above the flanges 43 and acts as a dead front or safety shield covering all of the exposed portions of the jaw blades and an optional disconnect switch in a cavity between the base 12 and the shell 14.

Figure 11:
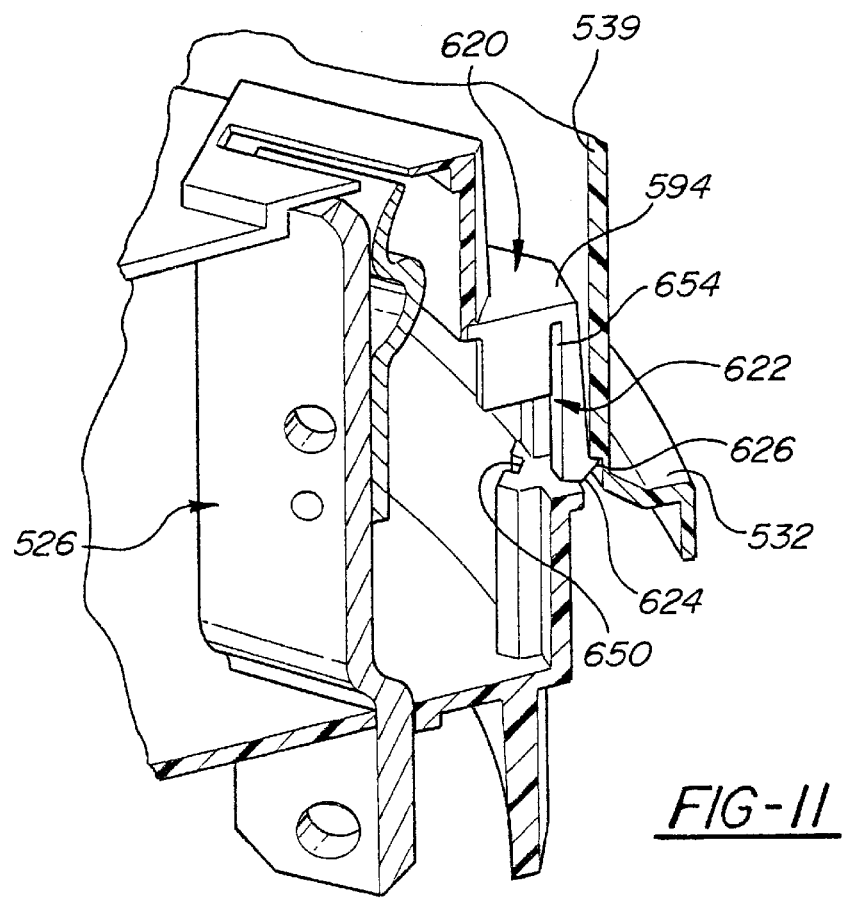
FIG. 11 is a partial, enlarged, perspective view showing the interlocking of the safety shield of FIG. 10 with the socket adapter housing depicted in FIG. 6.

The wall 46 has a plurality of raised bosses 47, each of which includes a slot 48 defining an opening for receiving a blade terminal 120 of an electrical device, such as a watthour meter, therethrough as shown in FIG. 11. Each raised boss 47 extends a short distance above the generally planar wall 46 and forms a recess or cavity 49 on the back surface of the wall 46 which receives and locates a jaw blade mounted on the base 12. Each slot 48 extends across the planar wall 46 and down a sidewall connecting the planar wall 46 to one flange 43 to permit easy angular insertion and removal of blade terminals through the slots 48.

As shown in FIG. 1, at least one and preferably two identical surge ground conductors 220 are diametrically mounted opposite each other on the mounting flange 44 of the shell 14. Each surge ground conductor 220 is removably mounted in one pair of slots in the mounting flange 44 and includes an arcuate wall portion 222 which conforms to the inner diameter of the annular sidewall 42 of the shell 14. The arcuate wall portion 222 has an upper edge 224 and a lower edge 226. A pair of radially extending tabs 228 are formed on opposite side ends of the arcuate wall portion 222 generally adjacent the upper edge 224. Each tab 228 seats in the slots on the mounting flange 44 of the shell 14. Each tab 228 has an upper edge disposed slightly above the upper edge of the mounting flange 44. This places the upper edge of each surge ground conductor 220 at a position to electrically engage a ground terminal mounted on the rear surface of a conventional watthour meter.

Each surge ground conductor 220, as shown in FIG. 1, has a mounting foot or tab 230 connected to the lower edge 226 of the arcuate wall portion 222. The mounting foot 230 has a generally planar shape with apertures 232 positioned to receive fasteners to secure each surge ground conductor 220 to one of the bosses 22 in the base 12. Each aperture 232 is formed as a stamped threaded aperture so as to receive a threaded screw without need for a nut.

FIGS. 1–4 depict a jaw blade 64, 66 and a spring clip 100 which are depicted as but one example of a jaw contact or jaw blade assembly which can be employed in the socket adapter 10. Further details concerning the construction and use of the jaw blade 64, 66 and spring clip 100 can be had by referring to U.S. Pat. No. 6,152,764, the entire contents of which are incorporated herein by reference.

Figure 4:
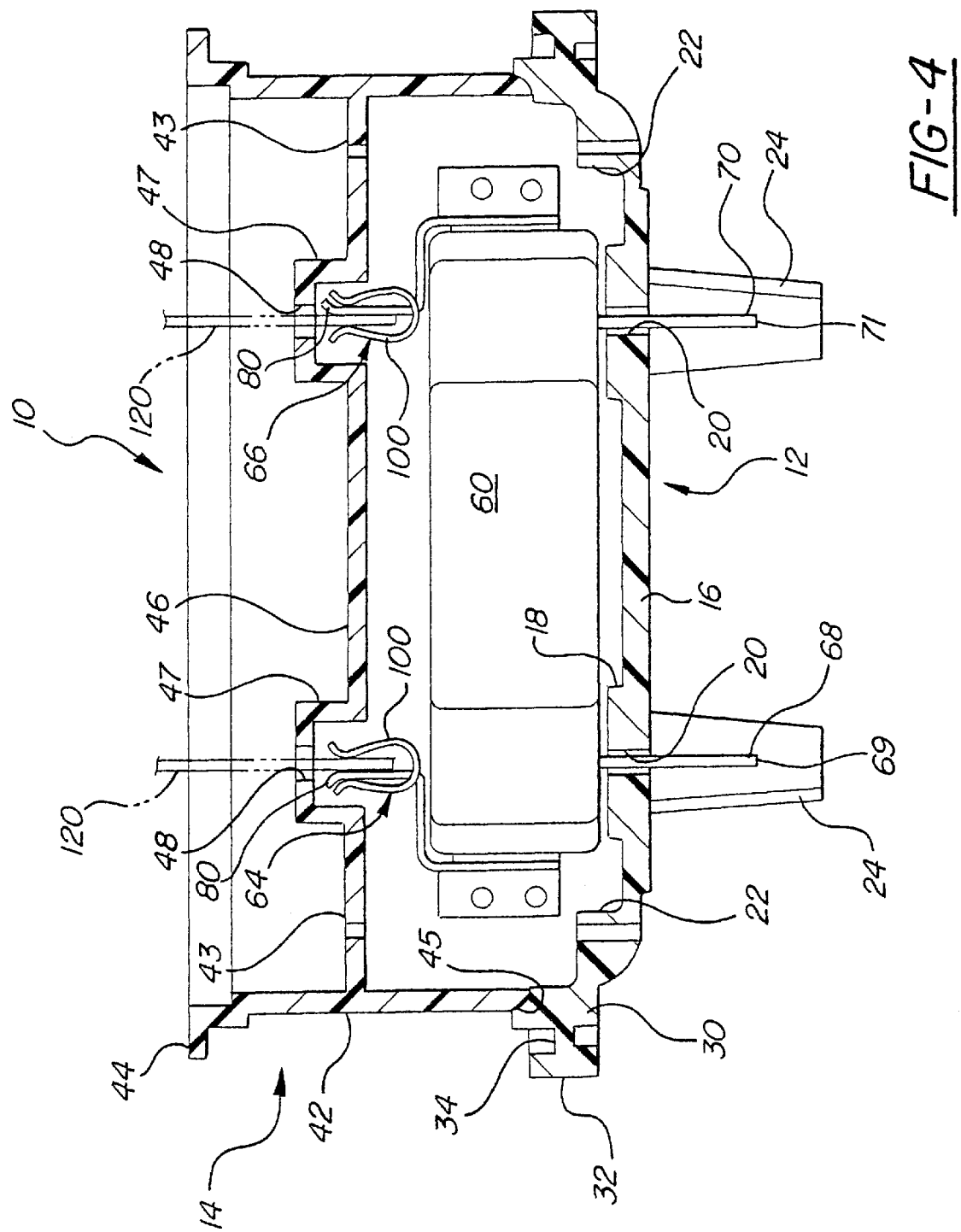
FIG. 4 is a partially cross-sectioned, side view of FIGS. 1 and 2.

As shown in FIG. 4, a pair of load blade terminals 68 and 70 each comprise a generally planar member as is conventional in watthour meters and watthour meter socket adapters. One end of each load blade terminal 68 and 70 is connected to two internal bus bars within a disconnect switch 60 shown only by example in FIGS. 1, 2 and 4. Outer ends 69 and 71 of the load blade terminals 68 and 70 have a length sufficient to enable the outer ends 69 and 71 to project through the bottom or central wall 16 of the base 12 exteriorly of the housing of the socket adapter 10 for insertion into mating jaw contacts in a watthour meter, not shown.

It will be understood that the following described load jaw blade structure may also alternately be employed for the line jaw blade structure or for both the line and load jaw blade structures in the socket adapter 10.

By way of example, each of a pair of load jaw blades 64 and 66, with only load jaw blade 64 being described in detail hereafter, includes a generally planar bus bar 74 which projects angularly and generally perpendicularly from the top surface of the housing of a switch 60. The planar bus bar 74 has an opposed first and second ends 76 and 78. Further, flange 80 projects angularly above and outward from the generally planar extent of the bus bar 74 to form a blade terminal guide as is conventional in watthour meter socket adapters.

The opposed load jaw blade 66 is identical to the load jaw blade 64, but is formed of a mirror image to form a pair of left and right hand jaw blades 64 and 66. However, the spring clip 100 mounted on the load jaw blade 66 is identical to the spring clip 100 used with jaw blade 64.

A remotely controlled disconnect switch 60, shown in FIGS. 1, 2, and 4 as an option only, is located at the central wall 16 of the base 12. The disconnect switch 60 may be any commercially disconnect switch which may include an internally movable member and at least one pair of contacts which are electrically connected between one of the pair of line and load jaw blades within the socket adapter 10 and the corresponding one of the pair of line and load blade terminals projecting outwardly from the socket adapter 10 and to certain jaw contacts in a watthour meter socket, not shown. The switch 60 may be remotely actuated by means of signals provided on wires 62 which extend exteriorly of the housing of the socket adapter 10.

Figure 5:
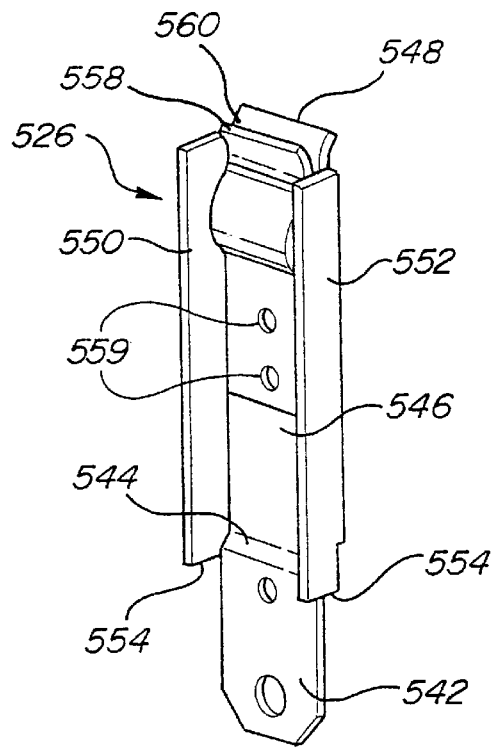
FIG. 5 is a perspective view of another embodiment of a jaw blade according to the present invention.
Figure 6:
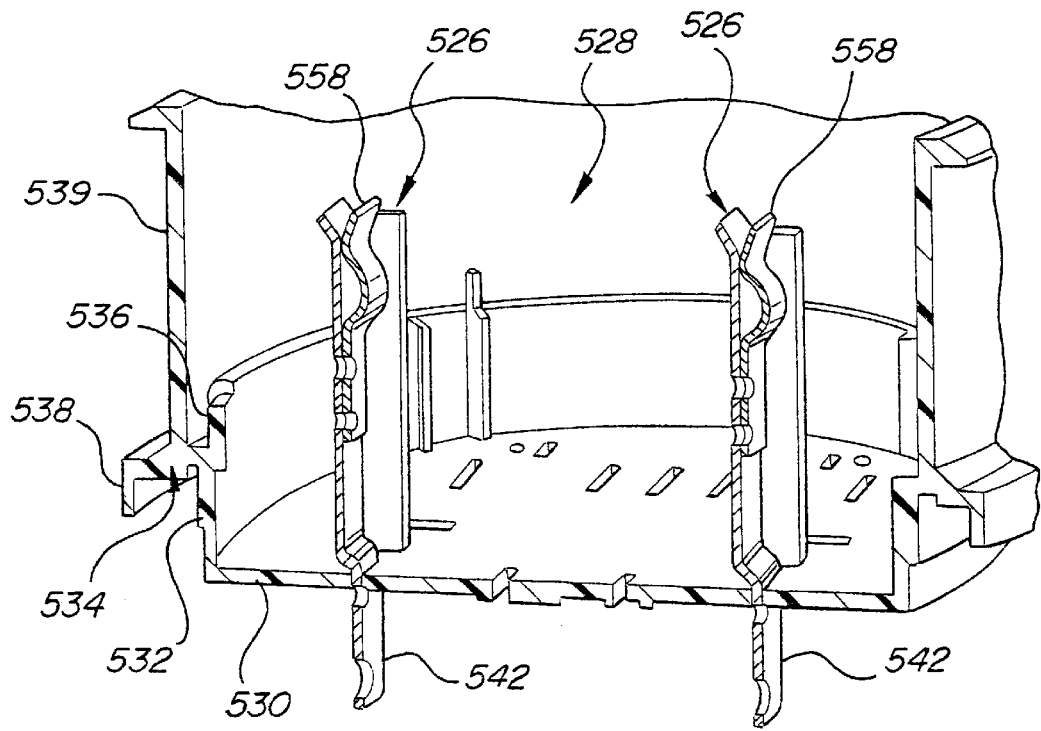
FIG. 6 is a partially cross sectioned, perspective view showing the mounting of the jaw blade depicted in FIG. 5 in a watthour meter socket adapter extender housing constructed according to the present invention.

Referring now to FIGS. 5 and 6, there is depicted yet another embodiment of an electrical contact or jaw blade 526. The jaw blade 526 has an elongated shape and is particularly suited for use in a socket adapter extender 528 shown in FIG. 6. The socket adapter extender 528 is similar to the socket adapter 402 described hereafter with several modifications. The housing of the socket adapter extender 528 includes a generally planar base or bottom wall 530 and lower sidewall 532. The sidewall 532 terminates at a radially outward extending mounting flange 534. The mounting flange 534 has an inward extending, annular shelf 536 disposed interiorly within the socket adapter extender 528 and an outwardly extending flange terminating in a depending lip 538 spaced from the lower sidewall 532. The lip 538 is positioned for receiving a sealing ring to mount the socket adapter extender 528 on a ring-style socket adapter cover, not shown. An upper sidewall 539 extends from the mounting flange 534 and terminates in a mounting flange.

The jaw blade 526 has a unitary, one piece construction formed of a blade terminal end 542 which is offset by an intermediate offset 544 from an elongated jaw contact end 546. A blade terminal edge guide 548 is formed at one end of the jaw contact end 546.

A pair of side flanges 550 and 552 project perpendicularly from opposite side edges of the jaw contact end 546 and extend from an upper end adjacent the blade terminal guide 548 and to an opposite end 554 approximate the intermediate offset 544. The second end 554 of each side flange 550 and 552 seats on the base 530 of the socket adapter extender 528 to prevent sideways movement of the jaw blade 526 relative to the base 530.

A conventional spring clip 558 is fixedly connected to the jaw contact end 546 by two fasteners, such as rivets, not shown, extendible through apertures 559. The upper end of the spring clip 558 angles outwardly to form a mating blade terminal guide 548 on the jaw contact end 546. The end 560 of the spring clip 558 is spaced from the adjacent jaw contact end 546 to define a slot for receiving a watthour meter blade terminal in a conventional manner.

Figure 7:
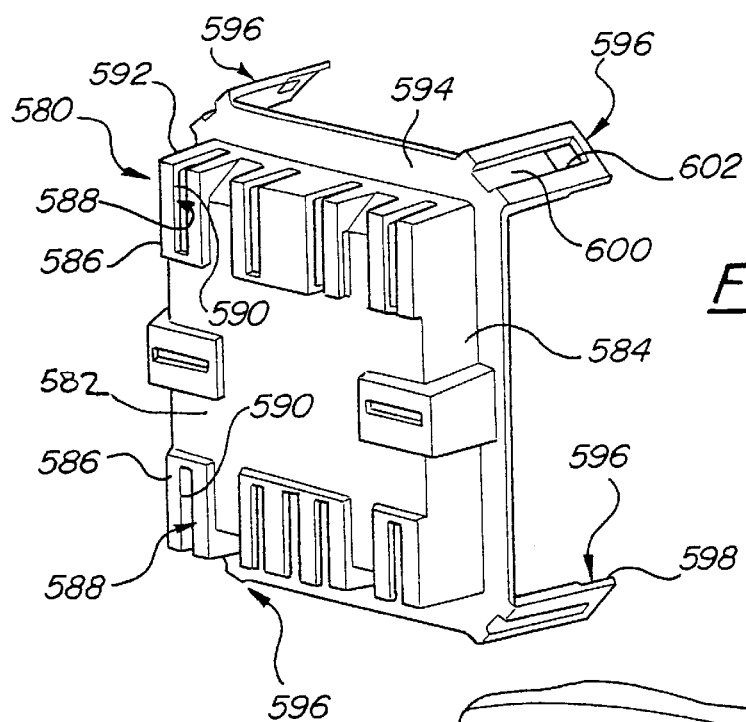
FIG. 7 is a perspective view of another embodiment of a safety shield according to the present invention.
Figure 8:
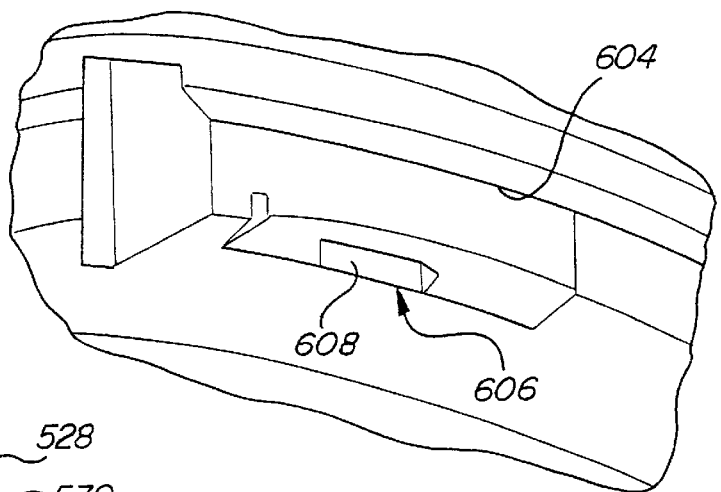
FIG. 8 is an enlarged, partial, perspective view of FIG. 7 showing the jaw contact safety shield mounting aperture and latch projection.
Figure 9:
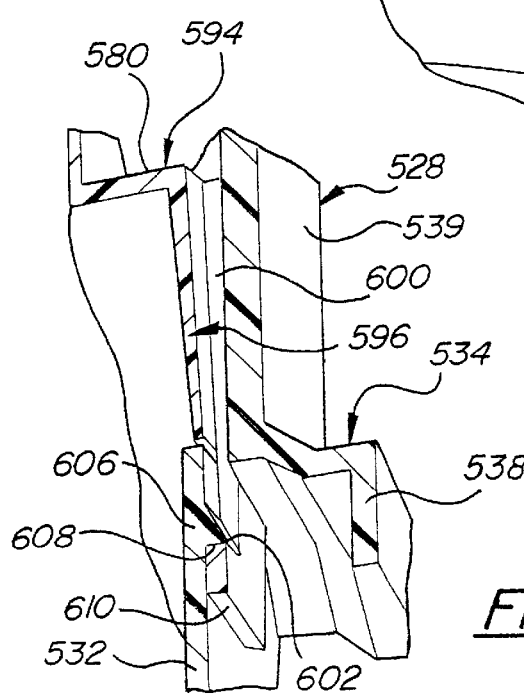
FIG. 9 is an enlarged, partial, perspective view of FIG. 7 showing the interlocking of the safety shield with the latch projection depicted in FIG. 8.

Referring now to FIGS. 7–9, there is depicted a jaw contact safety shield 580 which is mountable in the socket adapter extender 528. The safety shield 580 is formed of a one piece electrically insulating material, such as a suitable plastic, and is formed of an enclosure which, when the safety shield 580 is mounted in the socket adapter extender 528, completely surrounds all of the line and load jaw blades within the socket adapter extender 528 except for small slots allowing the insertion of a watthour blade terminal into engagement with each line and load jaw blade.

The safety shield 580 includes a top or outer wall 582 and a plurality of sidewalls all denoted by reference number 584. A plurality of raised bosses 586 are formed in the top wall 582. The bosses 586 are positioned at the normal jaw contact positions of a watthour meter socket adapter.

Each boss 586 has an aperture or slot 588 formed therein. Each slot 588 has a top wall portion 590 extending parallel to the plane of the top wall 582 and a contiguous sidewall portion 592 forming a continuous L-shaped slot along the top wall 582 and the sidewall 584 of the safety shield 580. The unique provision of the sidewall slot portion 592 simplifies the insertion and removal of a watthour meter into and out of the jaw contacts of the socket adapter extender 528 through the safety shield 580.

A peripheral flange 594 extends outward from a lower edge of the sidewall 584 of the safety shield 580. The peripheral flange 594 has a polygonal or square shape, by example only. Other shapes, such as octagonal, round, etc., may also be employed.

A plurality of legs 596 project from the peripheral flange 594, generally at each corner of the peripheral flange 594. Each leg 596 has a generally planar configuration with a notched inner surface 598. A slot 600 is formed on the outer side of each leg 596 extending from the peripheral flange 594 to an aperture 602 in each leg 596.

Latch means is provided for releasably latching each leg 596 and the entire safety shield 580 in the socket adapter extender 528. The latch means includes a plurality of apertures 604 formed in the lower sidewall 632 of the extender 528 adjacent to the mounting flange 534 as shown in FIG. 8. A latch projection 606 is unitarily formed with the sidewall 532 and projects outwardly therefrom. The latch projection 606 has a flat edge surface 608 for releasable engagement with the aperture 602 in each leg 596 as shown in FIG. 9. As the legs 596 of the safety shield 580 are urged toward each latch projection 606, the outer end of each leg 596, which has an angled end surface 610, rides along the latch projection 606 until the aperture 602 slides over the edge 608 of the latch projection 606 releasably latching the leg 596 to the housing of the extender socket adapter 528. Since the aperture 604 in the sidewall 532 opens outwardly underneath the mounting flange 534, the legs 596 of the safety shield 580 may be released from the latch projection 606 by forcing a tool, such as a screwdriver, underneath the lower end of each leg 596 disengaging the leg 596 from the latch projection 606.

A modified safety shield 620, which is substantially similar to the safety shield 580 shown in FIG. 7 is depicted in FIGS. 10 and 11. Accordingly, like reference numbers are used to identify like components in both of the safety shields 580 and 620.

In this embodiment, the plurality of legs 622 are also located at the outer corners of the safety shield 620. Each leg 622 terminates in an outwardly extending latch projection 624 which is positioned to engage an inner lip 626 formed in the sidewall 539 adjacent the mounting flange 532 as shown in FIG. 11 to releasably latch the safety shield 620 to the housing of the socket adapter extender 528. The latch projection 624 is accessible from the bottom of the mounting 532 and can be urged radially inward from the mounting flange 532 to disengage the latch projection 624 from the lip 626 and enable the safety shield 620 to be removed from the extender 528.

Figure 13:
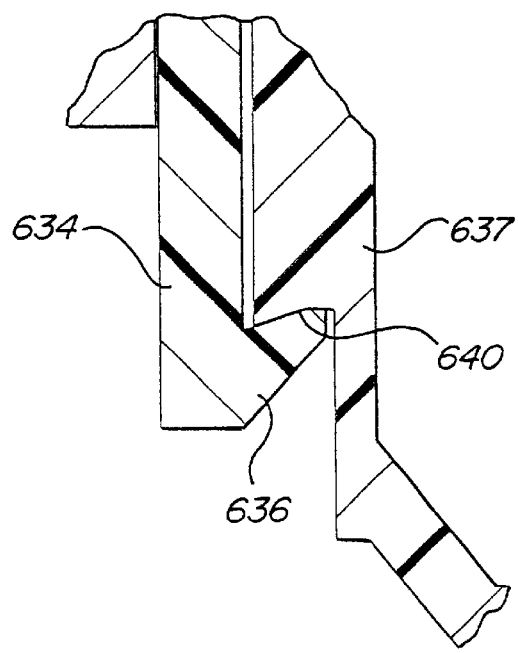
FIG. 13 is a partial, enlarged, perspective view showing the interlocking of the safety shield of FIG. 12 in the socket adapter depicted in FIG. 6.

Referring now to FIGS. 12 and 13, there is depicted another embodiment of a jaw contact safety shield 630 which is particularly suited for use with a low profile socket adapter, not shown, having a short height sidewall. Again, since the safety shield 630 is similar to the safety shields 580 and 620 described above, like components are depicted by the same reference number. In this embodiment, a pair of spaced end flanges 632 are formed on opposite portions of the sidewalls 584 and project outwardly from the adjacent sidewall 584. Each end flange 632 has a pair of downwardly depending legs 634 extending therefrom, each leg 634 terminating in an outwardly extending latch projection 636. The latch projection 636 on each leg 634 in releasably insertable through an aperture in the base and the adjacent ring of a socket adapter in the same manner as the latch projection 624 engages an aperture in the sidewall 539, as shown in FIG. 11.

As shown in detail in FIG. 13, each latch projection 636 snaps into engagement with an underlying surface 640 on the sidewall of the socket adapter housing to releasably mount the safety shield 630 to the housing. Each latch projection 636 may be released from engagement with the back surface of the base 637 of the socket adapter by means of a sharp tool inserted from behind the base 637.

FIGS. 12 and 14 depict a unique feature of the safety shields 630, 580 and 620. As shown therein, one leg 640 of the boss 586 adjacent to the slot 588 positioned at the eighth jaw contact position is cantilevered from an outer edge adjacent the sidewall 584. This provides the cantilevered flange 640 with a freely movable end 642 which enables the flange 640 to bend inward about the outer edge in a watthour application where a single phase watthour meter has a potential clip at this position. The potential clip engages the flange 640 and bends it inward about the outer end enabling the watthour meter to properly seat in the socket adapter.

Referring now to FIGS. 15–18, there is depicted a modification to the above-described safety shield in which a safety shield 110 is mounted in the socket adapter extender 528 in a unique manner. Further, it will be understood that the safety shield 110 may also be employed in other types of socket adapter housing constructions.

The safety shield 110 is formed of a one piece, electrically insulating material and has a construction which, when mounted in the socket adapter extender 528, completely surrounds and substantially encloses all of the line and load jaw blades within the socket adapter extender 528 except for small slots allowing the insertion of watthour blade terminals into engagement with each line and load jaw blades or contacts.

The safety shield 110 includes a top or outer wall 112 and a peripheral sidewall 114 depending therefrom. The top wall 112 and the sidewall 114 are depicted by example only as having a generally square configuration. A pair of opposed outwardly extending side edge flanges 116 and 118 project from the lower edges of two opposed sidewalls 114. A pair of laterally extending flanges 120 and 122 project perpendicularly outward from opposed sidewalls 114. An outer end of each lateral flange 120 and 122 communicates with perpendicular, downward depending sides 124 and 126, respectively. The sides 124 and 126 are oriented, when the safety shield 110 is mounted with the socket adapter extender 528, immediately adjacent to the inner wall of the surge ground conductors 128 and 130, respectively.

A plurality of raised bosses 132 are formed in the top wall 112 and are located at the normal jaw contact positions of a watthour meter socket adapter. Each boss 132 has an aperture or slot 134 extending therethrough. As described above, the slots 134 extend over the top wall 112 and along the sidewall 114 to permit easy, angled insertion and/or removal of a watthour meter blade terminal into and out of contact with a jaw contact position behind each slot 132.

A polygonal or rectangular shaped aperture 136 is formed in each lateral flange 120 and 122 for enabling mounting or access to a current transformer shorting switch 121. The aperture 136 can also serve as a mounting window for any connector, such as a multi-pin connector, also not shown.

An open space formed between the side edge flanges 116 and 118 of the shield 110 and the underlying base wall of the socket adapter 528 enables access to a circuit board mounting in the socket adapter and/or for the passage of conductors from the circuit board to a switch, plug, or connector mounted in the sidewall 539 of the socket adapter.

Figure 15:
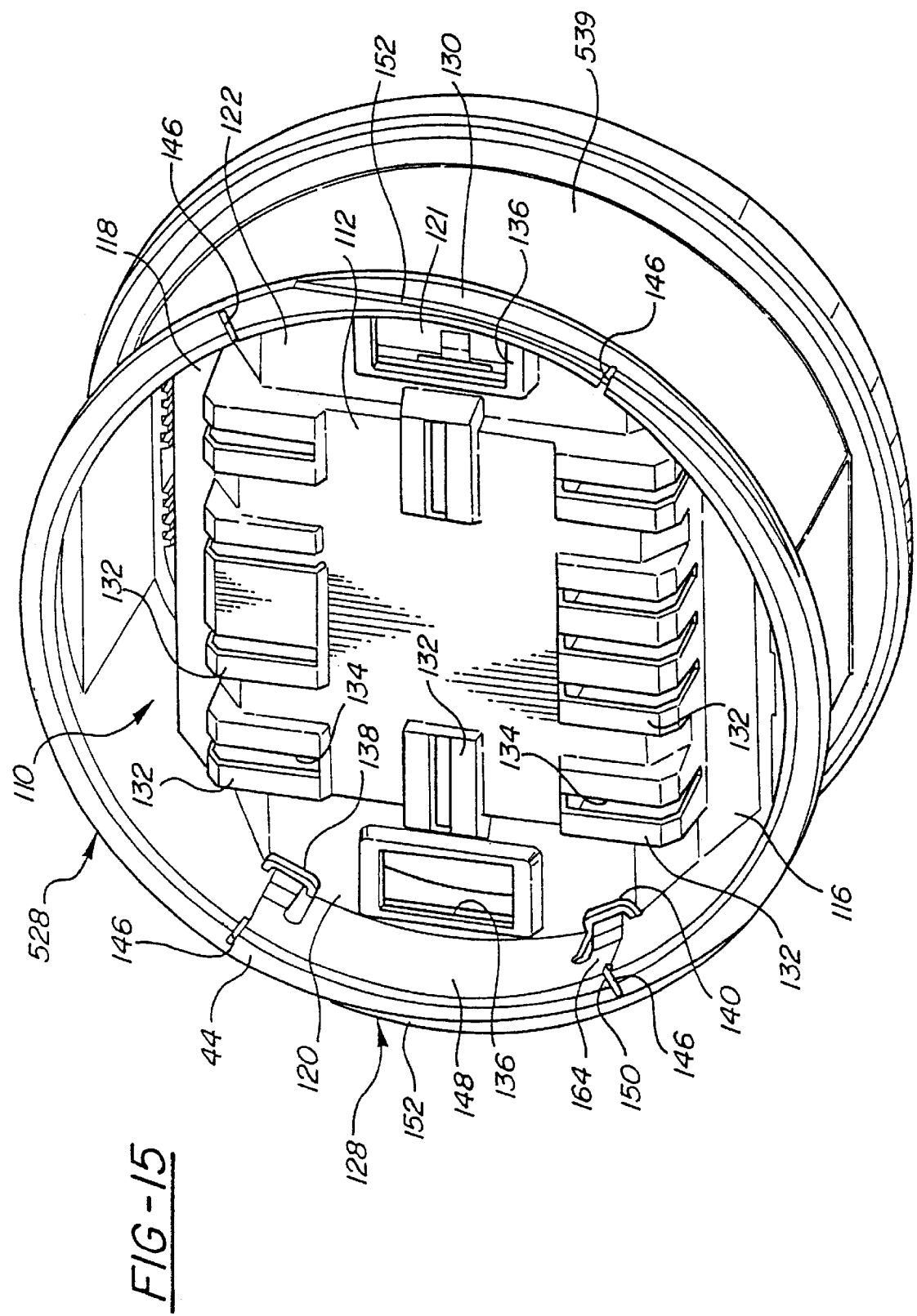
FIG. 15 is a perspective view of another embodiment of a safety shield according to the present invention.
Figure 17:
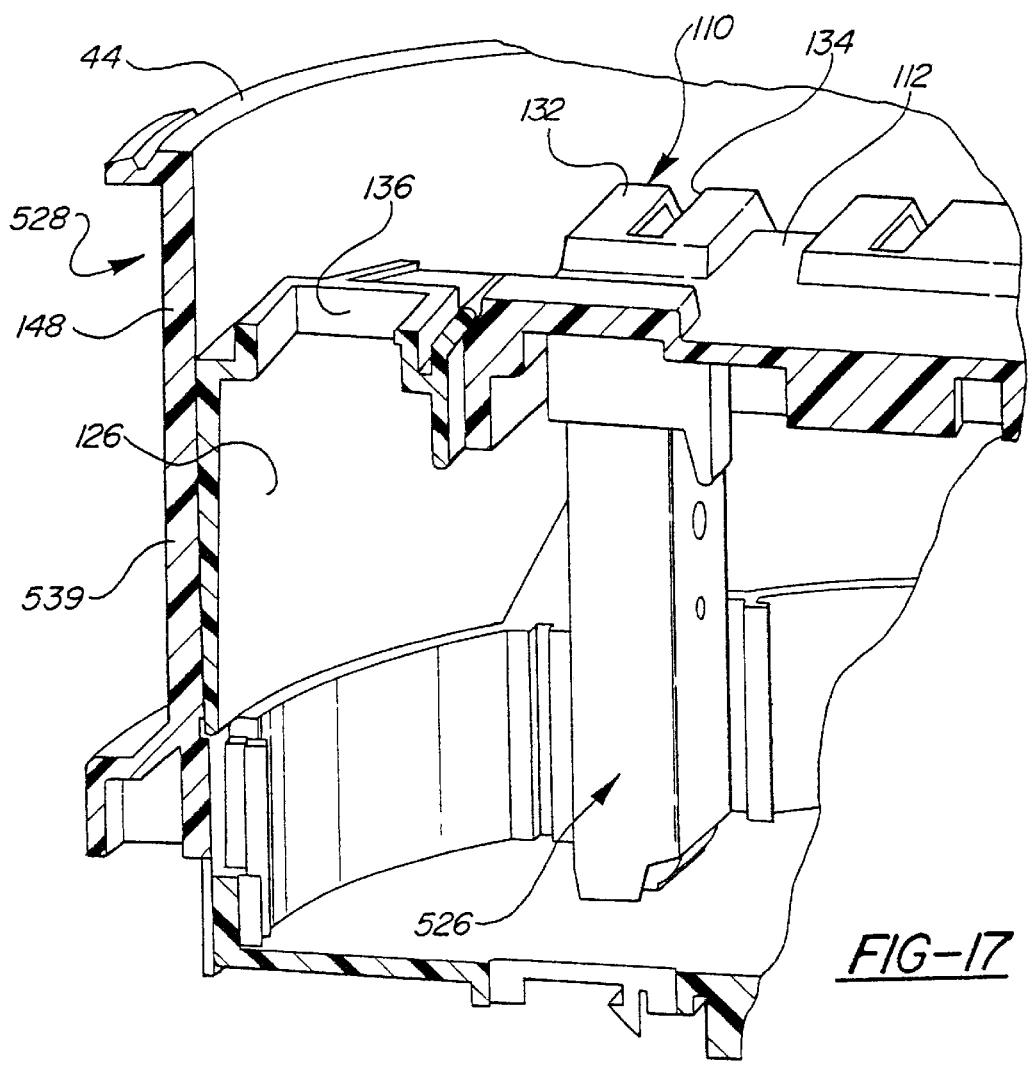
FIG. 17 is a partial, lateral, cross-sectional view showing the mounting of the safety shield and one surge ground conductor of FIG. 16 in the socket adapter shown in FIG. 15.
Figure 18:
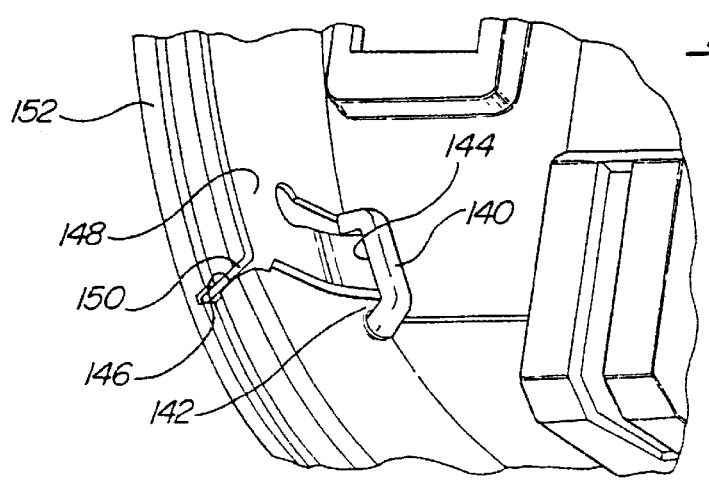
FIG. 18 is an enlarged, partial, perspective view showing the interconnection of the spring fingers on the surge ground conductor with the safety shield shown in FIG. 15.

As shown in FIGS. 15, 17 and 18, at least one and preferably two circumferentially spaced receivers or bosses 138 and 140 are formed on the outer edge of each lateral flange 120 and 122 and surround a flat 142 shown in FIG. 18. The flat 142 is positioned approximately in line with one lateral flange 120 and 122. Each boss 138 and 140 and the associated flat 142 form a radially outward opening cavity 144.

The surge ground conductors 128 and 130 are identically constructed. The two ground surge conductors 128 and 130 are diametrically mounted opposite each other on the mounting flange 44 of the socket adapter extender 528 in a pair of slots 146 formed in the mounting flange 44.

Figure 16:
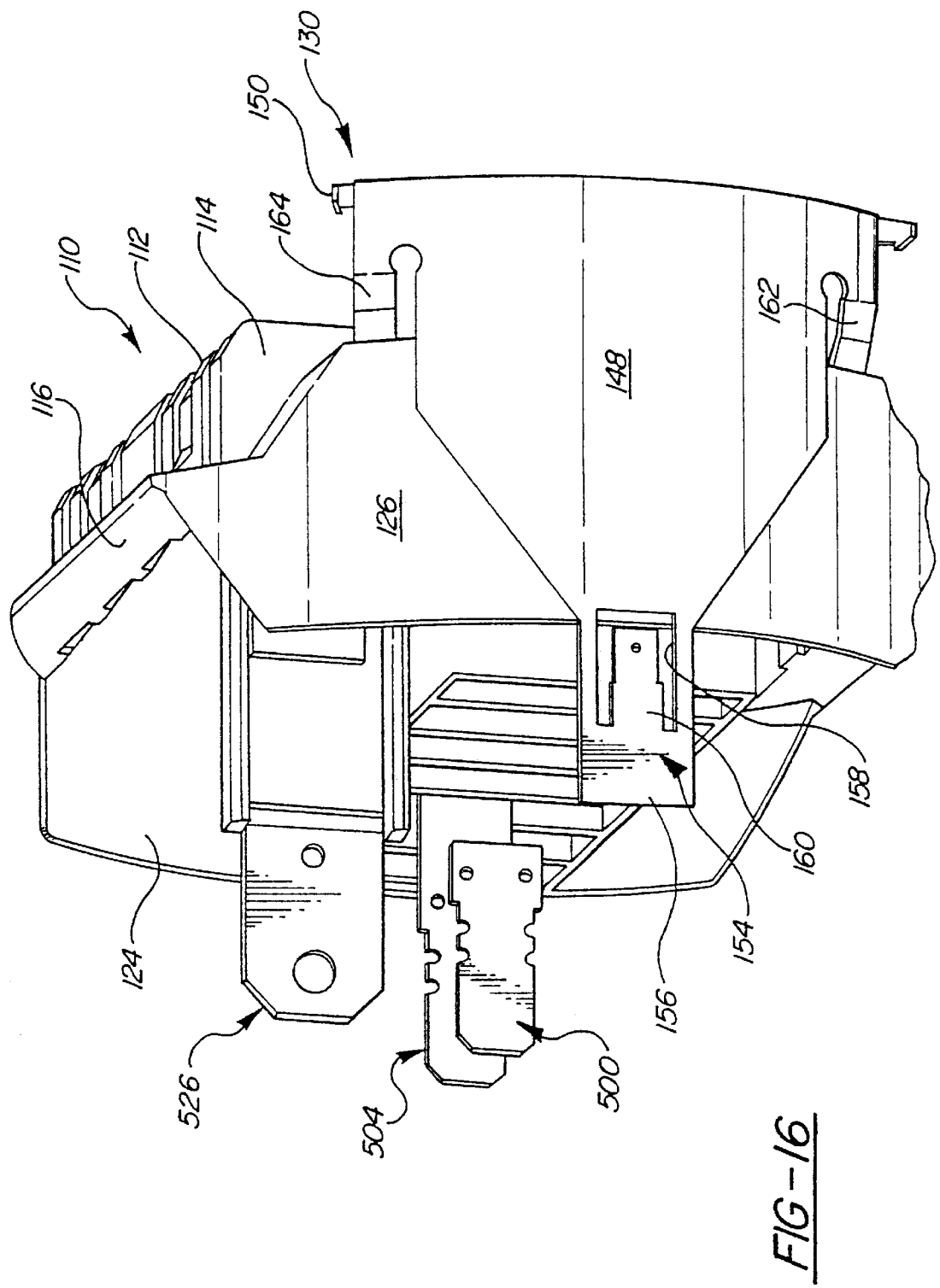
FIG. 16 is a rear perspective view of a safety shield and a surge conductor shown in FIG. 15.

As clearly shown in FIG. 16, each surge ground conductor 128 and 130 includes an arcuate wall 148 which conforms to the inner diameter of the annular sidewall 539 of the socket adapter extender 528. A pair of radially extending tabs 150 are formed on an upper edge 152 of each surge ground conductor 128 and 130 and seat within one of the slots 146 in the mounting flange 44 to support each surge ground conductor 128 and 130 from the mounting flange 44 of the socket adaptor extender 528. The upper edge 152 of each surge ground conductor 128 and 130 overlays a portion of the mounting flange 44 and is in position to electrically engage a ground terminal mounted on the rear surface of a conventional watthour meter.

As shown in FIG. 16, each surge ground conductor 128 and 130, has a lower mounting foot 154 which is formed as an extension of the arcuate sidewall 148. The mounting foot 154 has a distal end 156. An aperture 158 is formed within the mounting foot 154 and surrounds a tab 160 which integrally extends from the end 156. In use, the mounting foot 154 is bent generally perpendicularly outward from the arcuate sidewall 148, in a direction opposed to the radially inward extending direction of the tab 160. This bending movement of the distal end 156 enables the mounting foot 154 to slide through an aperture formed in the sidewall 539 of the socket adapter extender 538 to secure the surge ground conductor 128 or 130 in position on the sidewall 139 of the socket adapter extender 528.

According to a unique feature of the present invention, each surge ground conductor 128 and 130 is formed with at least one and preferably two arcuately spaced fingers 162 and 164. Each pair of the spring fingers 162 and 164 has an angularly bent portion projecting away from the surface of the arcuate sidewall 148. Each of the spring fingers 162 and 164 is spaced from opposite sides of the arcuate sidewall 148 as shown in FIG. 16. The distal end of each of the spring fingers 162 and 164 is positioned to engage the cavity 144 formed by the boss 140 and the flat 142 in the lateral flanges 120 and 122 of the safety shield 110 to securely retain the safety shield 110 in position within the interior of the socket adapter 110. In this mounting position shown in FIG. 17, the bottom edge of the arcuate sidewalls 148 directly seats on the interior ring of the socket adapter extender 528. This mounting arrangement eliminates the use of any separate mechanical fasteners to fixedly mount the safety shield 110 within the interior of the socket adapter extender 528. At the same time, the safety shield 110 can be easily removed by merely urging the distal ends of each of the spring fingers 162 and 164 radially outward until the distal ends of each spring finger 162 and 164 disengage from the flats 132 on the lateral flanges 120 and 122 in the safety shield 110.

Figure 20A:
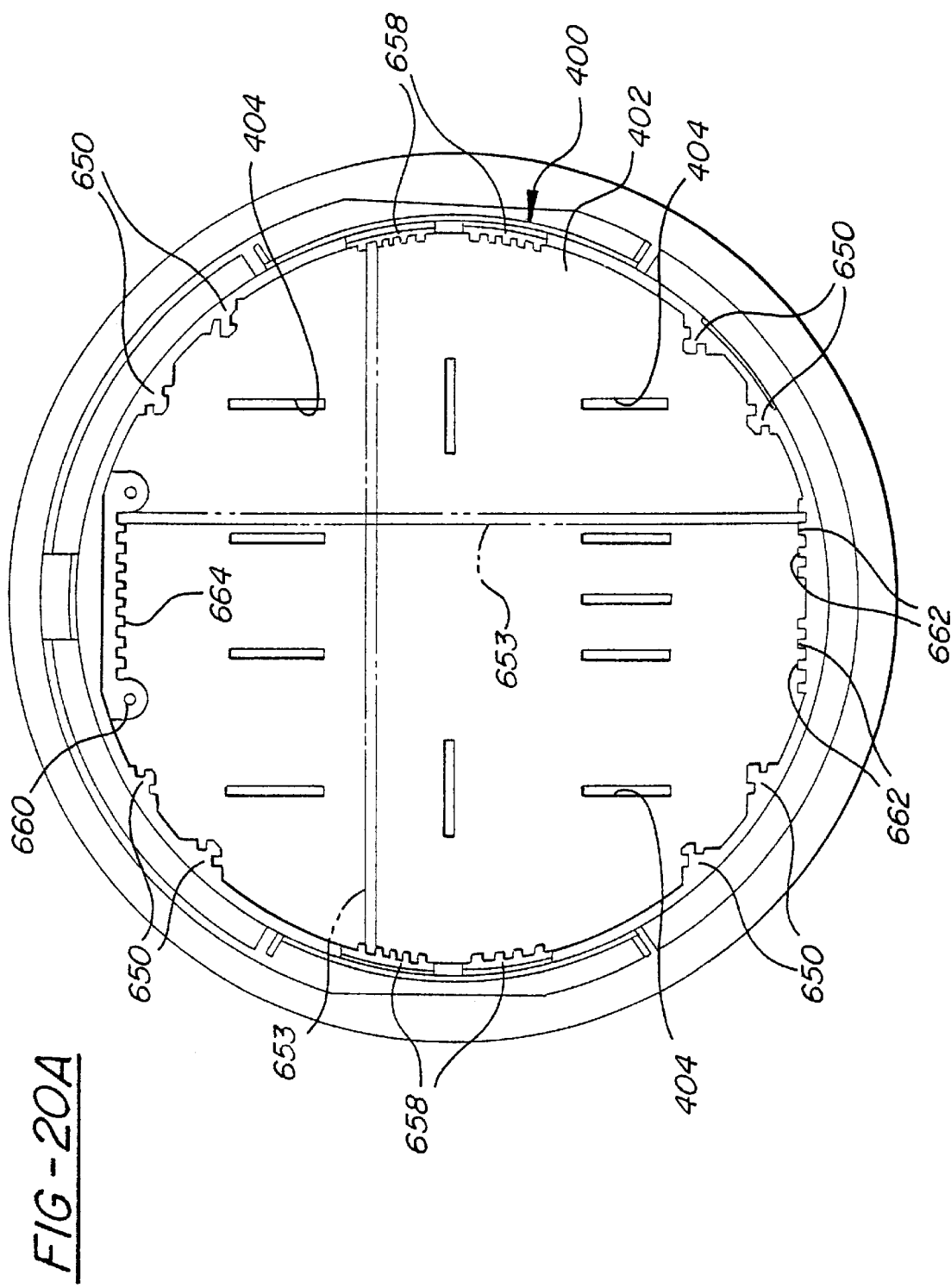
FIG. 20A is a front elevational view of another embodiment of a watthour meter socket adapter housing according to the present invention with circuit board mounting means.
Figure 20B:
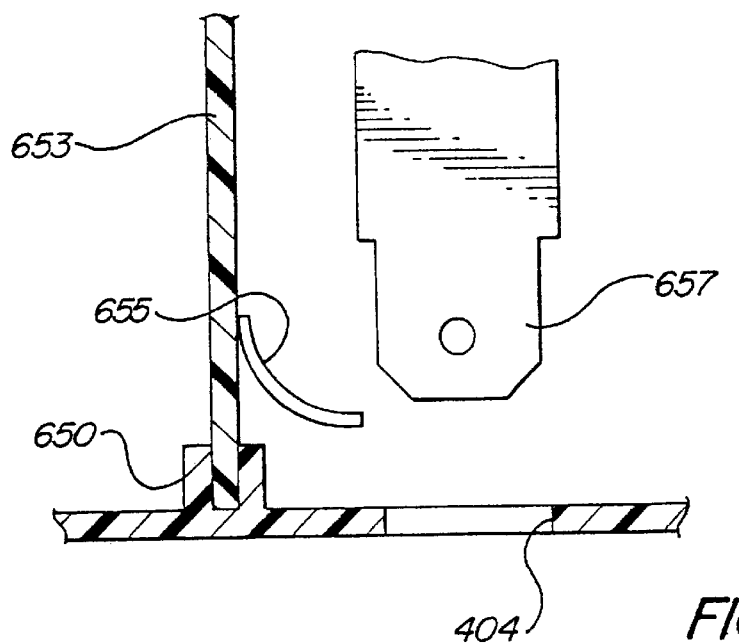
FIG. 20B is a cross sectional view showing a power connection between a blade terminal and a circuit board mounted in the socket adapter of FIG. 20A.

Referring now to FIGS. 19A and B, there is depicted a socket adapter 400 which has means for mounting or supporting auxiliary components, such as generally planar circuit boards 653, adjacent to or preferably on the base 402. The mounting means comprises at least one pair and, preferably, a plurality of pairs of posts 650 which are arranged in diametrically opposed pairs. Each post 650 is formed at the juncture of the base 402 and the ring 406 of the socket adapter 400 and extends upward therefrom. A U-shaped channel 652 is formed in each post 650. The U-shaped channel 652 in one post is linearly aligned with a U-shaped channel of a post 650 in one adjacent pair of posts 650 as shown in FIG. 20A. This arrangement forms a pair of channels 652 adjacent to the inner surface of the sidewall 412 of the socket adapter 400.

Although the peripheral flange 594 of the shield 620 may be cut out or shortened to allow the circuit boards 653 mounted within the pairs of posts 650 to extend upward along side of the sidewall 592 of the shield 620, in a preferred embodiment, a U-shaped slot 654, one wall of which is shown in FIG. 11, is integrally formed adjacent to opposite side edges of each leg 622 of the shield 620 and engages the upper end of a circuit board 653 disposed adjacent to each slot 654. In this manner, the circuit board 653 is mounted in the posts 650 and the slots 654 and is seated against the peripheral flange 594 of the shield 620.

Also shown in FIG. 19B is a further modification to the socket adapter 400, or more preferably, the socket adapter 528, in which a plurality, such as four or more, of standoffs 656 are mounted on the base 402 of the socket adapter 400 for securing a circuit board 403 in a horizontal orientation between the line and load jaw blades 416 and 418. Fasteners 405 are insertable through apertures into the circuit board 403 and end bores or a through bore in the standoffs 656.

FIG. 20A shows a further modification to the socket adapter 400 in which the socket adapter 400 is devised for carrying one or more circuit boards 653 at various positions inside of the sidewall 412. Although FIG. 20A depicts the pairs of posts 650 generally arranged in two diametrically opposed pairs, it will be understood that the embodiment shown in FIG. 20A need not necessarily include such posts 650.

Auxiliary support members 658, 660 and 662 are provided at various locations about the periphery of the sidewall 412 at the juncture of the sidewall 412 and the base 402. In addition to a mounting function, the posts and support members also add strength to the sidewall-base joint of the one piece socket adapter housing.

The auxiliary support members may take a variety of forms as shown by the different support members 658, 660 and 662. The support members 658, 660 and 662 all include at least one or more U-shaped slots 664. The support members 658, 660 and 662 are arranged in opposed pairs, as shown in FIG. 20A, by example only, such that one slot in one support member linearly aligns with one slot in an opposed support member. The pairs of aligned slots are thus capable of supporting opposite edges of a circuit board 653 oriented perpendicularly with respect to the base 402 of the socket adapter 400. This enables many circuit boards 653 to be housed within the socket adapter 400 between the jaw contact ends of the line and load jaw blades 416 and 418. The support members 658, 660 and 662 may also be provided outside of the shield 620 to support a circuit board between the sidewall 412 and the sidewall 594 or the shield 620.

Figure 34:
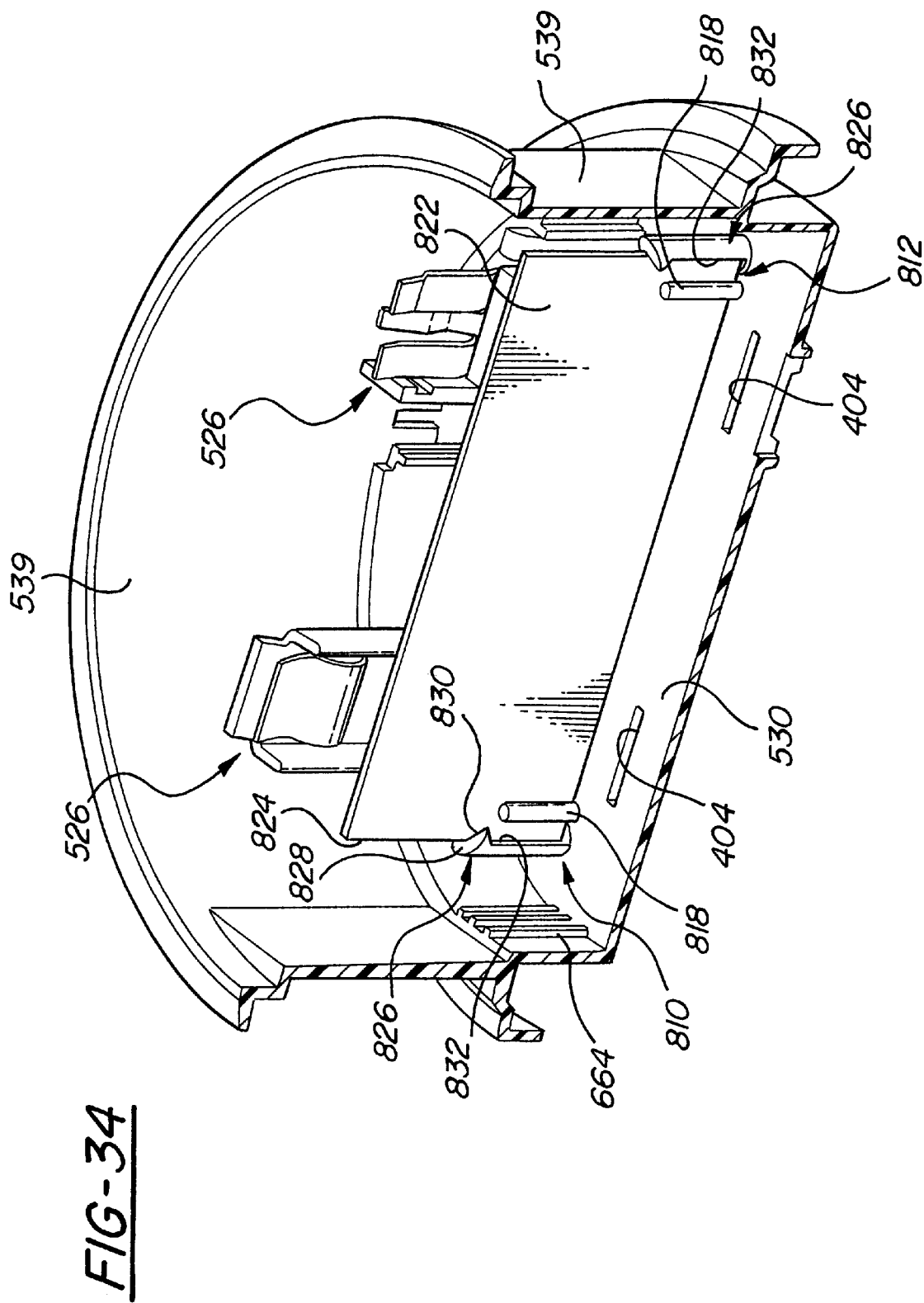
FIG. 34 is a partially cross sectioned, lateral view showing another embodiment of the circuit board support according to the present invention.
Figure 35:
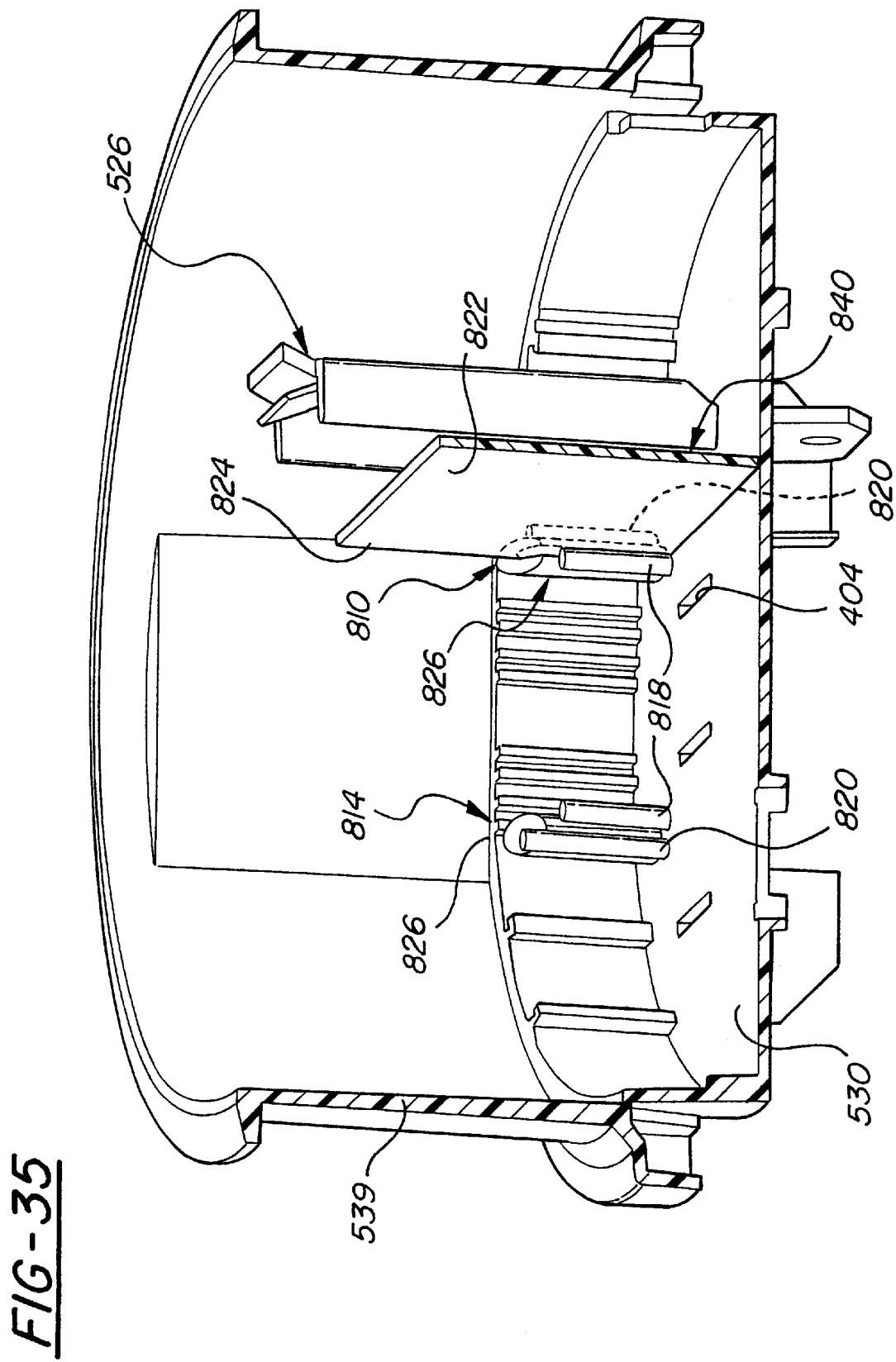
FIG. 35 is a cross-sectional view taken generally perpendicular to the view shown in FIG. 34.
Figure 36:
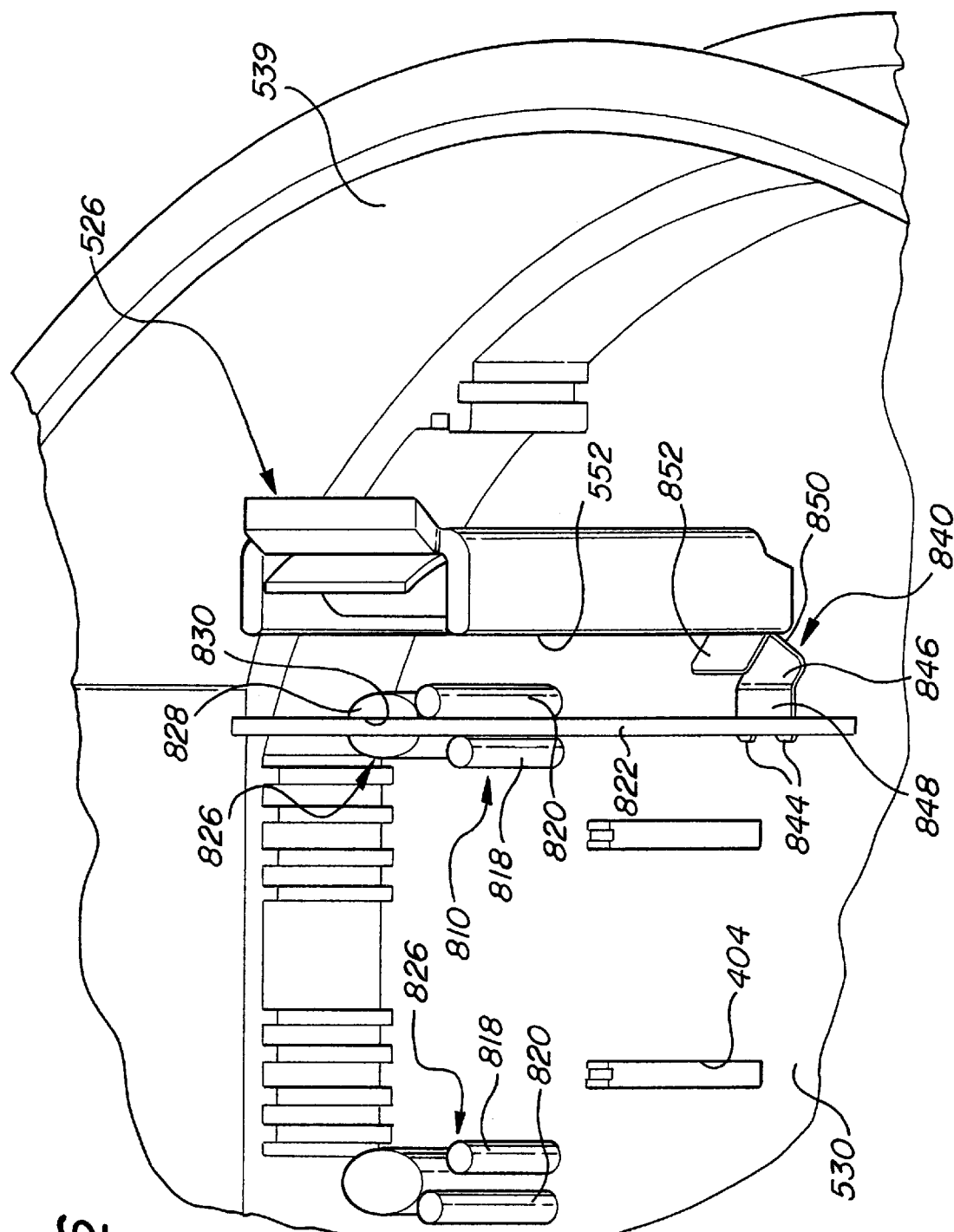
FIG. 36 is an enlarged, partial, perspective view of the circuit board support shown in FIGS. 34 and 35.

Referring now to FIGS. 34–36, there is depicted another aspect or embodiment of the present invention wherein an alternate circuit board support is depicted. In this embodiment, the mounting means or circuit board supports are non-interferingly positioned with respect to the electrical contacts or jaw blades 526 in the socket adapter. By example only, in this embodiment, the circuit board supports are disposed adjacent to the peripheral edge of the base 530 and are arranged in aligned pairs parallel to the jaw blades 526.

In this embodiment, the circuit board supports include at least one and, alternately, a plurality of spaced pairs of pins or posts, such as the opposed pairs of circuit board supports 810 and 812 and the pair of opposed circuit board supports 814, only one of the pairs being depicted in FIGS. 35 and 36. Each individual circuit board support of each pair of circuit board supports 810, 812, 814, etc., are formed of a first tubular member 818 and a second pin, post or tubular member 820, both in the form of pins or posts. The opposed circuit board support 812 is formed of a similarly arranged tubular members 818 and 820. The posts 818 and 820 of each support pair, such as circuit board support pair 810, are fixedly mounted on the bottom wall or base 530 of the socket adapter and project angularly upward therefrom, generally perpendicular to the base 530. In one aspect of the present invention, the post 818 and 820 are each integrally molded as a unitary one piece part of the base 530.

The posts 818 and 820 of each support pair 810, 812 and 814 are spaced apart at a distance suitable for slidably receiving a generally planar circuit board 822 in an upright generally perpendicular to the base 530 as shown in FIGS. 34–36. Each pair of posts 818 and 820 are positioned generally adjacent the outer side edge 824 of the circuit board 822.

Although the tubular members or posts 818 and 820 are depicted as being generally cylindrical in shape with a constant cross section or diameter from one end to the other, it will be understood that each post 818 and 820 may have other tubular shapes, such as polygonal with flat sides facing each other, etc. The posts 818 and 820 may also be fixedly attached to the base or bottom wall 530 of the socket adapter by means other than integral molding, such as by an adhesive, a fastener, etc.

The top ends of each of the posts 818 and 820 may be inclined toward each other to aid in guiding the insertion of the circuit board 822 therebetween.

For the reasons which will become apparent hereafter, each post 818 which is disposed inboard of each support pair 810, 812 and 814, is spaced from the post in the adjacent pair of posts 818 and has a height extending from the base or bottom wall 530 less than the height of the adjacent post 820.

In another aspect of the present invention, the circuit board support is provided with a unique snap-in feature for securely mounting each circuit board 822 in a non-movable position within the housing of the socket adapter; while still being able to be easily removed from the socket adapter for replacement, etc.

The snap-in feature is provided by an end located tubular member 826. The end post or tubular member 826 has, by example only, a generally cylindrical shape. A top surface 828 inclines downward from the outer peripheral portion of the base wall 530 toward the center of the base wall 530. This enables the top surface 828 to act as a guide during insertion of the circuit board 822 between the posts 818 and 820 and the end post 826.

A slot 830 is formed in the top surface 828 opening from the side of the post 826 adjacent the posts 818 and 820. A small notch, not shown, extending in from the side edge 824 of the circuit board 822 snaps into the slot 830 for fixedly mounting the circuit board 822 in the socket adapter. Outward movement of the top end of the end post 826 enables the circuit board 822 to be disengaged from the end post 826 and removed from the socket adapter.

Although not necessarily providing a snap-in connection, the pins 818, 820 and the end support post 826 may also be configured as a single support member integrally molded with and projecting from the base wall 530 of the socket adapter in which the single support member has a generally U-shape formed of two opposed side legs interconnected at one end by an end wall. Further, one U-shaped support may be provided at each opposed end of a single circuit board. Alternately, a single elongated U-shaped support may be formed integrally with the base wall of the socket adapter with the opposed side legs projecting generally perpendicularly from the base wall of the socket adapter and the end wall formed as part of the base wall. Such a configuration would support a circuit board along a lower edge contiguous with the base wall of the socket adapter.

A recess 832 is formed in an upright portion of the end post 826 closely adjacent to the top surface 828. This forms the top surface 828 as a lip which extends outward from an upright leg of the end post 826.

Figure 37:
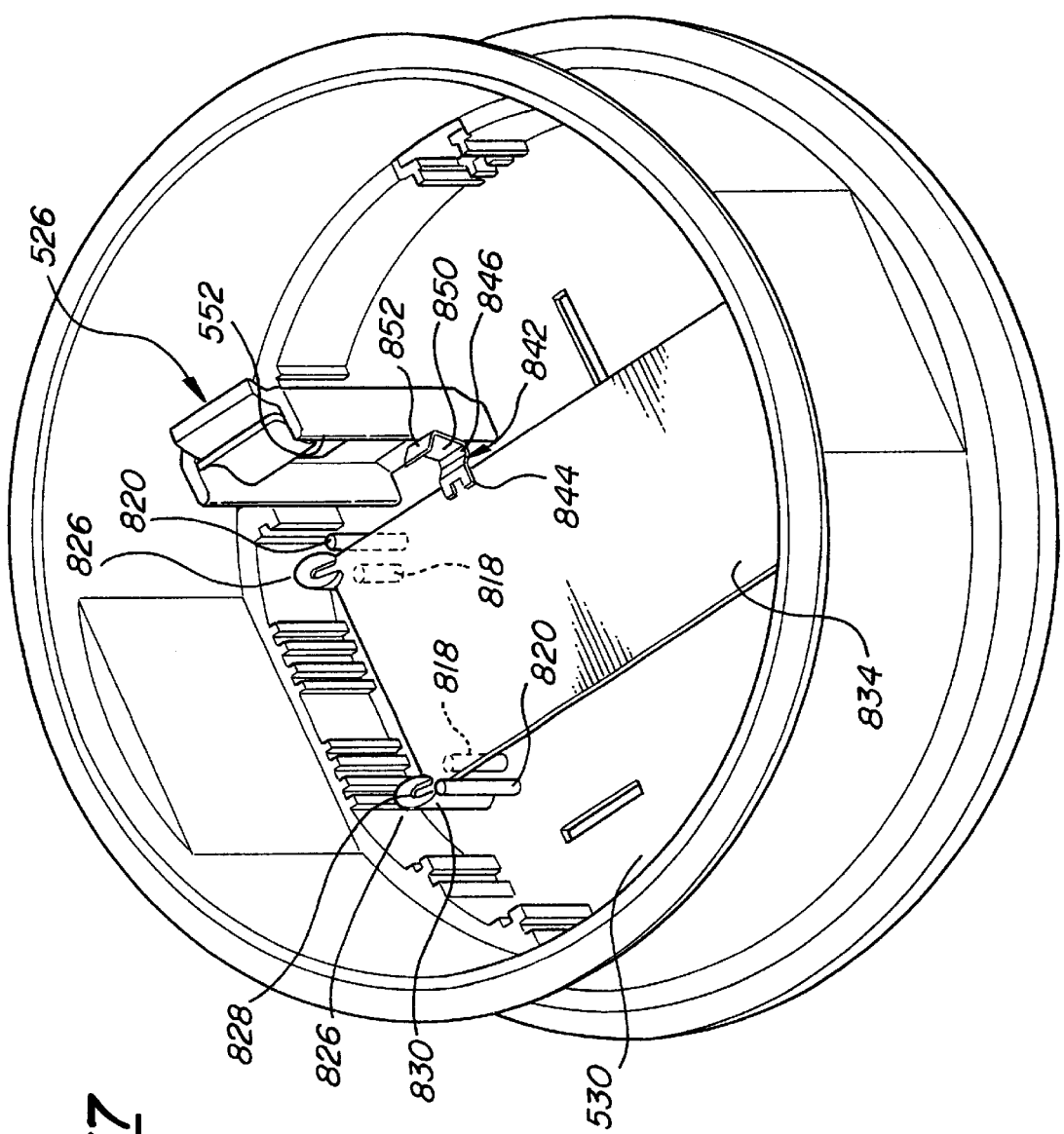
FIG. 37 is a front perspective view depicting another circuit board support according to the present invention.
Figure 38:
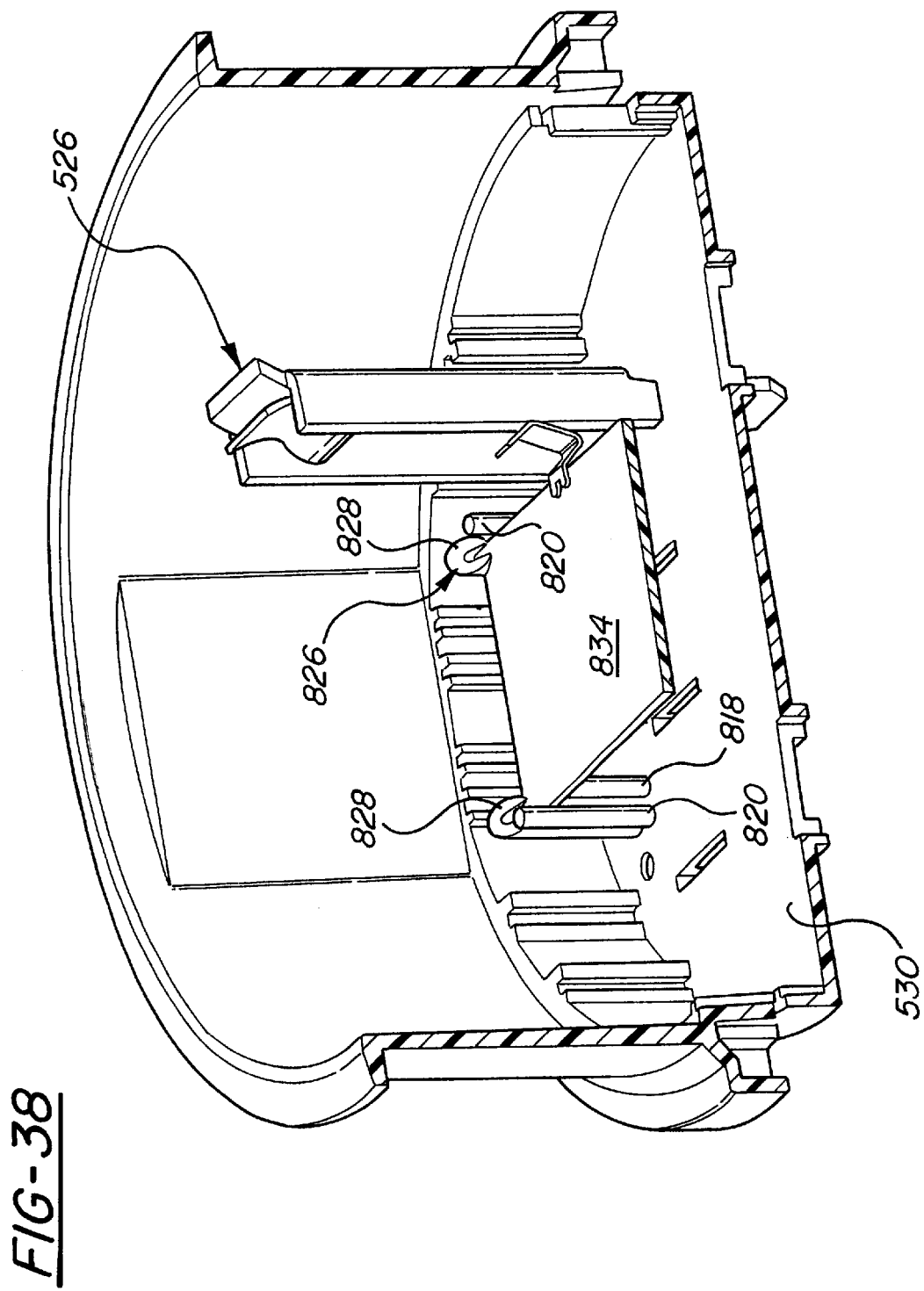
FIG. 38 is a lateral, cross-sectional view of the socket adapter shown in FIG. 37.
Figure 39:
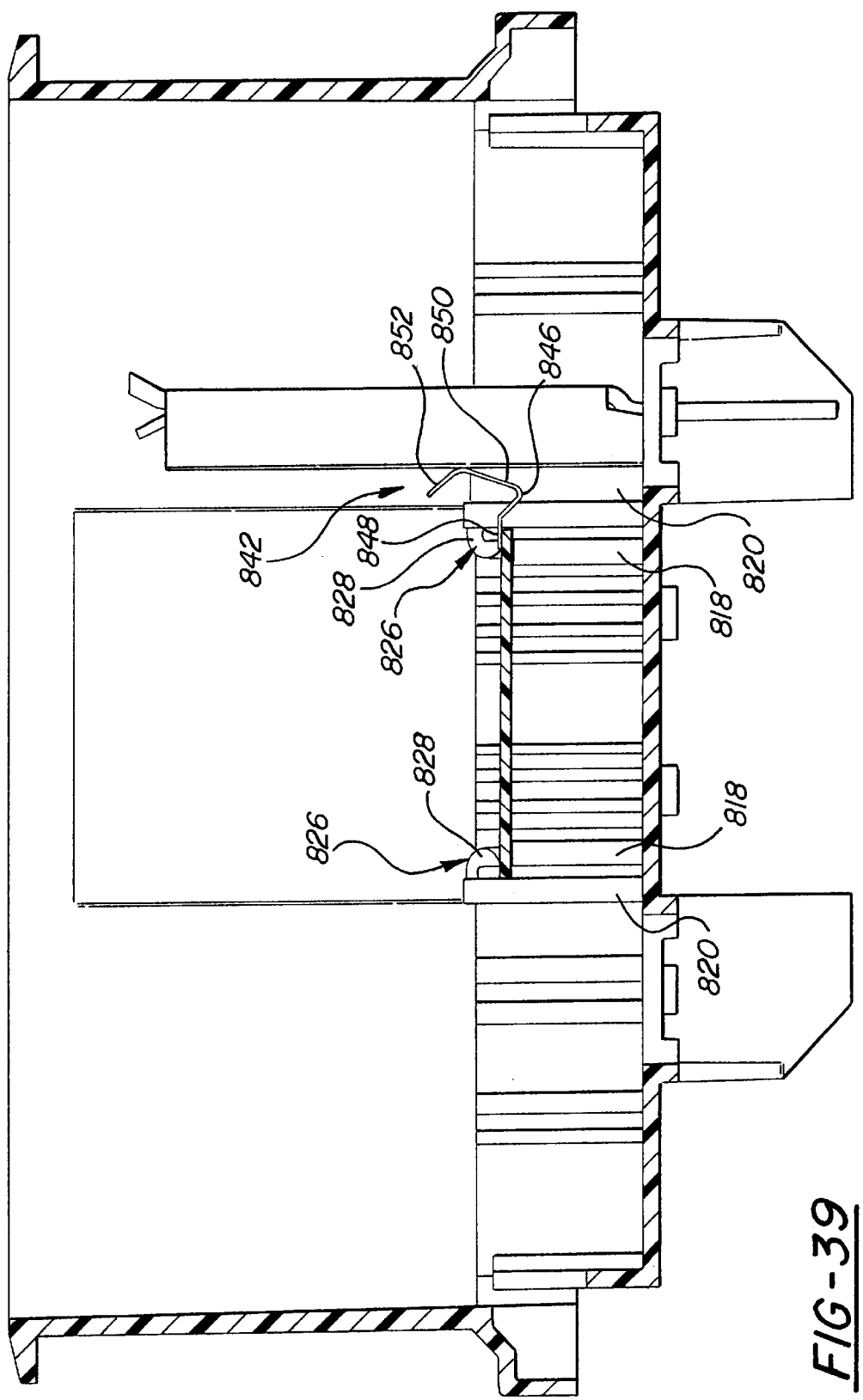
FIG. 39 is a lateral, cross-sectional view showing the circuit support depicted in FIGS. 37 and 38.

Referring now to FIGS. 37–39, there is depicted the circuit board supports described above and shown in FIGS. 34–36 and formed of individual posts 818 and 820 and an intermediately disposed end post 826 which also function to support a circuit board 834 within the housing of the socket adapter generally parallel to the bottom wall 530 of the socket adapter.

In this aspect of the present invention, the shorter inner length, posts 818 cooperate with the lip formed by the top surface 828 of each end post 826 to support an outer edge of the circuit board 834 in a snap-in connection. The outer edge of the circuit board 834 is supported on the top end of the shorter, inner post 818 and along one outer side edge by the higher outer post 820 of each pair of support members 810, 812, etc. The outer edge of the circuit board 824 snaps under the lip formed below the top surface 828 by urging the top surface 828 radially outward from the center of the base wall 530 of the socket adapter until the outer edge of the circuit board 834 can pass freely underneath the lip. The lip then snaps back to its normal position trapping the outer edge of the circuit board 834.

As shown in FIGS. 37–39, the circuit board 834 is supported generally parallel to the base wall 530 of the socket adapter and is located between the conventional mounting positions of the line and load jaw contacts, blade terminals or combined line and load jaw blades 526.

Figure 40:
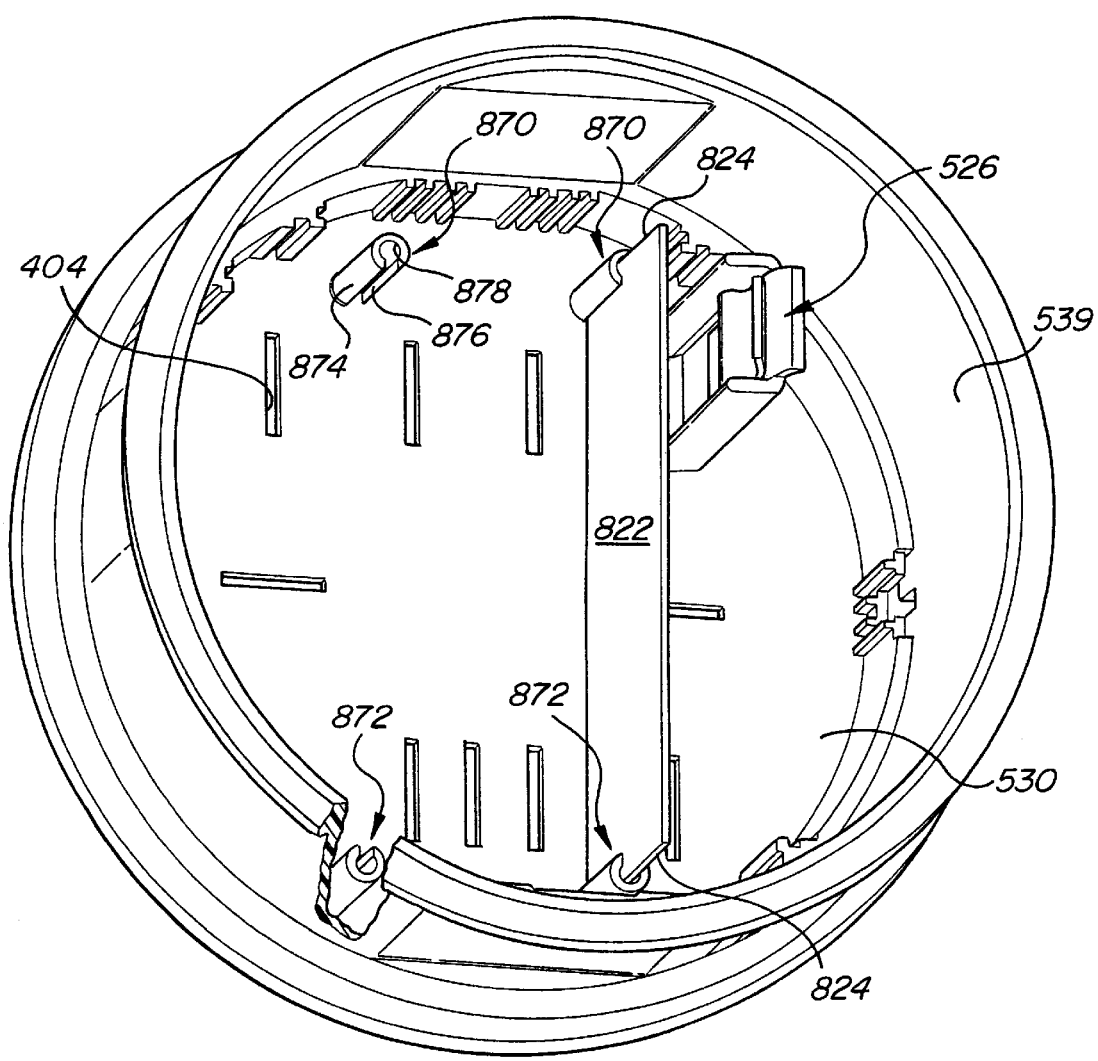
FIG. 40 is a perspective view depicting another aspect of a circuit board support according to the present invention.
Figure 41:
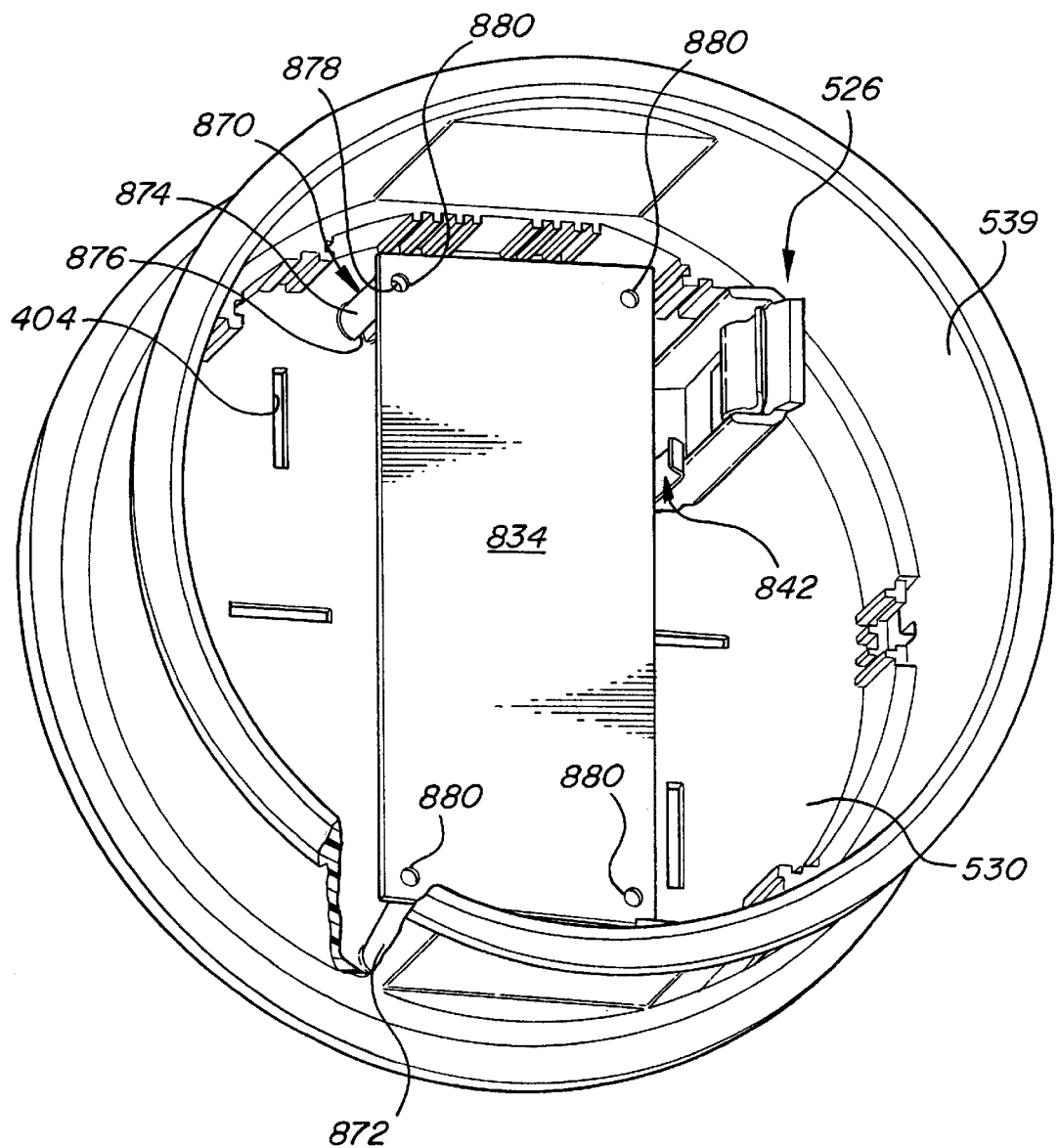
FIG. 41 is a perspective view, similar to FIG. 40, but showing a different mounting orientation for a circuit board in a socket adapter according to the present invention.

Referring now to FIGS. 40 and 41, there is depicted another aspect of the auxiliary component mounting means or circuit board supports according to the present invention. At least two pairs of support members 870 and 872, with one support member 870 and one support member 872 comprising each pair of support members, are mounted on the base wall 530 of the socket adapter, by suitable means, such as by integral, unitary molding with the base wall 530 or by means of mechanical fasteners, such as screws, passing through the base wall 530 into the bottom end of each support member 870 and 872.

Each pair of support members 870 and 872 is coaxially aligned and generally disposed between the normal line and load jaw contact positions in a conventional socket adapter as shown in FIGS. 40 and 41.

The support members 870 and 872 are identically constructed, but reversed 180° from each other in each pair of support members 870 and 872. According to one aspect of the present invention, each support member 870 and 872 is in the form of a tubular member having a generally circular cross section sidewall 874 which projects from the base wall 530 of the socket adapter housing. The sidewall 874 has a discontinuity 876, such as a slot extending along the entire length of the sidewall 874. A through bore 878 extends through the entire length of the sidewall 874 and terminates in an open end adjacent the end of the sidewall 874 furthest from the base wall 530 of the socket adapter housing. While the outer end portion of the bore 878 could be threaded, in a preferred embodiment, the bore 878 is smooth and is capable of receiving a fastener, such as self-tapping screw, therein.

As shown in FIG. 40, each pair of support members 870 and 872 are arranged in coaxial pairs with the slot 876 in support member 870 aligned with and facing the slot 876 in the opposed support member 872 of each pair of support members. This enables the outer side edges 824 of the circuit board 822 to be slidably inserted through the open end of the bore 878 in each support member 870 and 872 and into the slots 876 in the support members 870 and 872. The dimension of the edges of the sidewalls 874 forming the slot 876 is selected to provide a snug fit for fixedly supporting the circuit board 822 in each pair of support members 870 and 872; while still enabling easy insertion and removal of the circuit board 822 with respect to the support members 870 and 872.

It will be understood that additional pairs of support members 870 and 872 may also be mounted in the socket adapter housing, such as on the base wall 530, at other positions spaced from the positions of the support members 870 and 872 shown in FIG. 40.

Further, the circuit board 822 could be provided with a projection extending outward from each side edge 824 which releasably engages a correspondingly formed recess in the sidewall 874 of each support member 870 and 872. This would enable the through bore 878 to be eliminated from each support member 870 and 872 except for a shorter length bore extending only from the outer end of each support member 870 and 872 into the interior of the otherwise solid support member 870 and 872.

Referring now to FIG. 41, there is depicted the use of the pairs of support members 870 and 872 in supporting the circuit board 834 in a generally parallel position with respect to the base wall 530 of the socket adapter housing as compared to the generally perpendicular orientation of the circuit board 822 with respect to the base wall 530 in FIG. 40.

The open end of the bore 874 in the support members 870 and 872, which can extend the full length of each support member or only a short distance from the outer end of each support member 870 and 872 is alignable with apertures 880 generally positioned adjacent the outer corners of the circuit board 834. This enables a suitable fastener, such as self-tapping screw, not shown, to be inserted through the apertures 880 into the bores 878 in each support member 870 and 872 to securely mount the circuit board 834 in a generally parallel position with respect to and spaced from the base wall 530 of the socket adapter housing.

It will also be understood that a special purpose socket adapter housing could be developed wherein the support members 870 and 872 have a solid construction with only a short length bore extending from the outer end for receiving fasteners used to fixedly mount the circuit board 834 in a generally parallel position with respect to the base wall 530 of the socket adapter housing. In this specific application, the discontinuities or slots 876 in each support member 870 and 872 are not required.

However, manufacturing economies can be realized by forming each support member 870 and 872 as shown in FIG. 40 with the open ended through bore 878 and the discontinuity or slot 876 in each support member 870 and 872 to provide versatility in mounting circuit boards 822 and 834 in a variety positions or orientations with respect to the base wall 530 of the socket adapter housing.

FIGS. 34–39 depict another aspect of the present invention in which an electrically conducted tab or arm 840 or 842 is mounted on one of the circuit boards 822 and 834, respectively, for automatically contacting an electrical contact, jaw contact, blade terminal or combined jaw blade, such as the jaw blade 526 shown in FIGS. 34–39, when the circuit board 822 or 834 is inserted into the circuit board supports in the socket adapter. This enables electrical power to be automatically applied to the components or electrical circuit on the circuit board 822 or 834 when the circuit board 822 and 834 is mounted in the housing. This requires that the circuit board supports 810, 812, 814, etc., be located in the position which enables the circuit board 822 or 834 to be disposed in close proximity to one of the electrical contacts or jaw blades 526. It is also possible with a different mounting position of a circuit board 822 or 834 to use the conductive tab 840 or 842 to provide a ground connection to electrical contacts normally mounted in the standard fifth and sixth contact positions in a watthour meter socket adapter.

As shown in FIG. 36, the conductive tab 840 has a first end in the form of a pair of fingers 844 which extend through apertures formed in the circuit board 822. The fingers 844 are soldered or otherwise fixedly mounted to the circuit board 822. A multi-section, intermediate portion 846 extends from a base 848 from which the legs 844 extend and terminates in a first portion 850 extending angularly outward from the plane of the circuit board 822 and an outer end portion 852 which extends angularly from the first portion 850 back toward the circuit board 822.

The conductive tab 840 is formed of a spring or resilient material, such as copper, copper alloy, etc. The angled portions 850 and 852 ensure that the conductive tab 840 wipes along the edge 552 of the jaw blade 526 as the circuit board 822 is inserted into the supports 810 and 812. The resilient nature of the conductive tab 840 ensures that a contact point or contact edge 854 between the intermediate first portion 850 and the end portion 852 is biased or urged toward the side edge 552 of the jaw blade 526 for a secure electrical connection.

The conductive tab 842 in the horizontally position circuit board 834 shown in FIGS. 37–39 is identically constructed to the tab 840, but has a different orientation and mounting on the circuit board 834. As shown in FIGS. 37–39, the legs 844 extending from the base 848 of the conductive tab 842 overlay a side edge of the circuit board 834 and are soldered or otherwise electrically connected to conductive traces formed in the circuit board 834 in a conventional manner. The conductive tab 842 automatically makes secure electrical contact with the side edge 552 of the jaw blade 526 when the circuit board 534 is mounted in the housing of the socket adapter.

It should also be noted that the heights of the posts 818, 822 and 826 in the embodiment shown in FIGS. 34–39 are selected to enable the circuit board 822 or the circuit board 834, when mounted on the respective supports, to be contained completely within the interior of one of the safety shields described above. The safety shield thus provides protection for the components mounted on the circuit boards 822 and 834 and prevents any access thereto.

However, the unique circuit board supports of the present invention may also be employed by themselves without a safety shield. In this type of construction, the posts 818, 820 and 826 could have a longer length or height extending from the base wall 530. With appropriate notches and angled edges, multiple circuit boards 834 could be oriented in a vertical stack, each parallel to the adjacent circuit boards 834 and the bottom wall 530 of the socket adapter. Further, the circuit boards 822 and 834 as well as the mounting position of the conductive tabs 840 and 842 on such circuit boards 822 and 834, respectively, can be modified so as to enable the conductive tabs 840 or 842 to contact any portion of the adjacent electrical contact used in a watthour meter socket adapter. For example, mounting the conductive tab 840 adjacent the uppermost edge of the circuit board 822 spaced farthest from the bottom wall 530 of the socket adapter could enable the conductive tab 840 to contact the jaw contact portion of an electrical contact mounted adjacent to the circuit board 822. Mounting the conductive tab 840 in the position shown in FIG. 35 on the bottom edge of the circuit board 834 would enable the tab 840 to electrically contact the blade terminal portion of an electrical contact in a watthour meter socket adapter. Further, either mounting position of the conductive tab 840 could be employed with the coupler described hereafter and shown in FIGS. 31–33 to enable electrical contact between the components on the circuit board 822 via the conductive tab 840 to either the jaw contact or blade terminal mounted in the coupler.

Figure 21A:
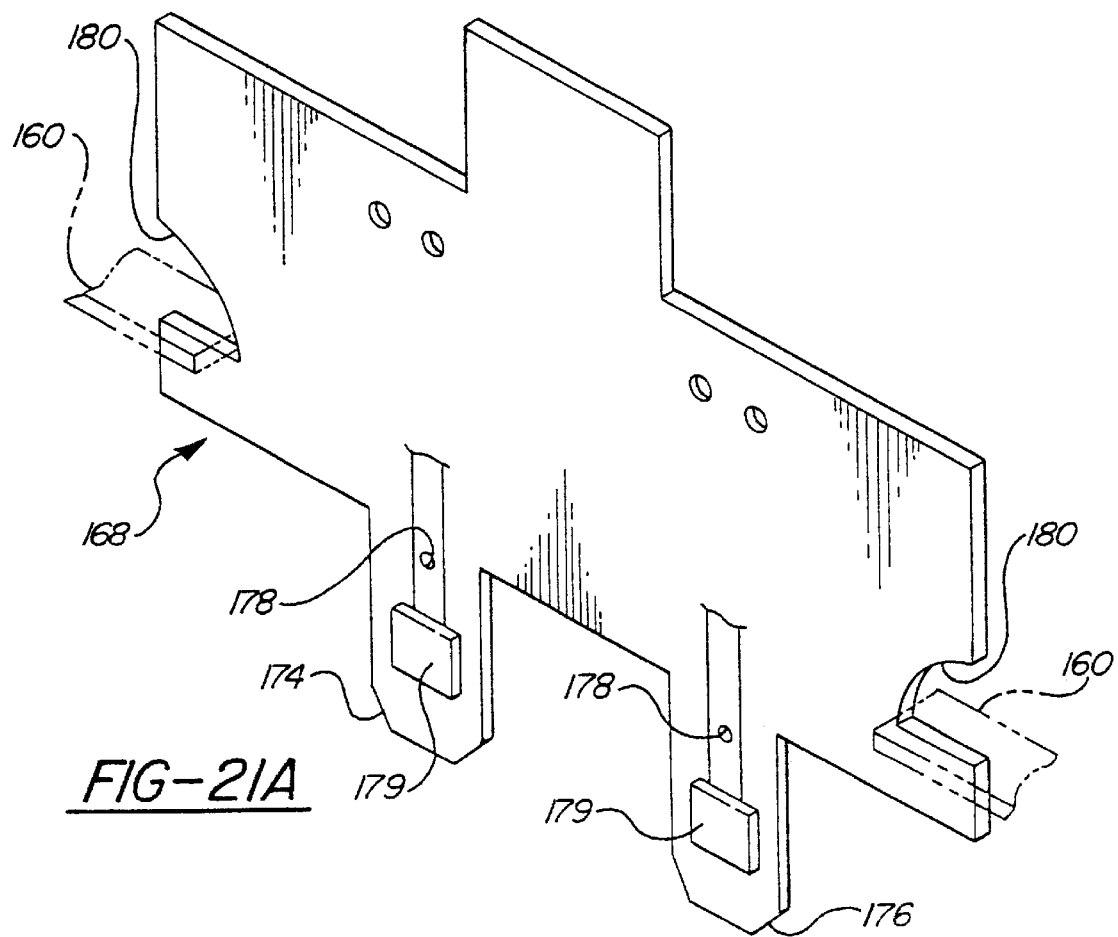
FIG. 21A is a perspective view of a printed circuit board mountable in the socket adapter according to the present invention.
Figure 22:
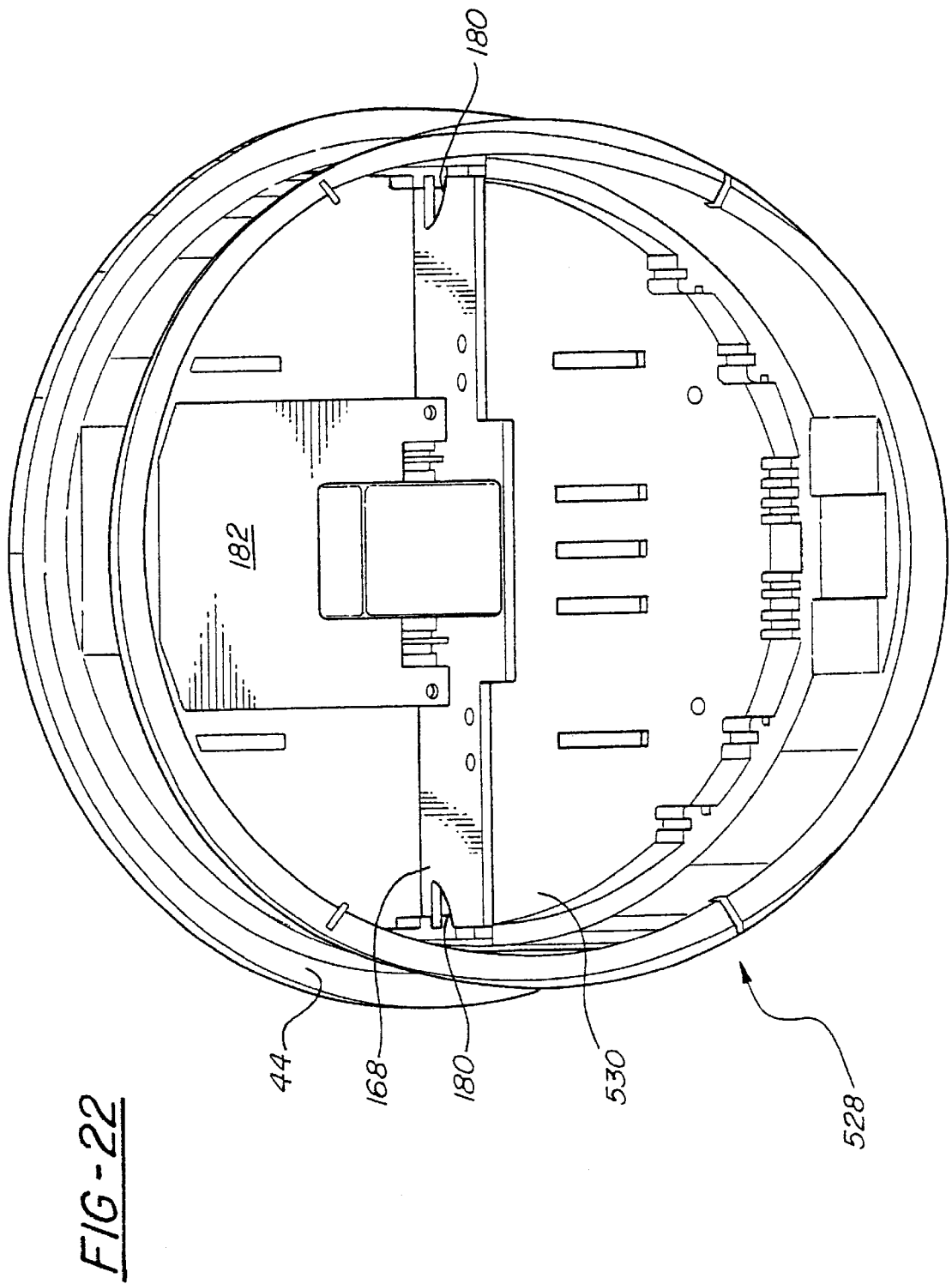
FIG. 22 is a front perspective view showing the mounting of a circuit board and timer in a watthour meter socket adapter.
Figure 23:
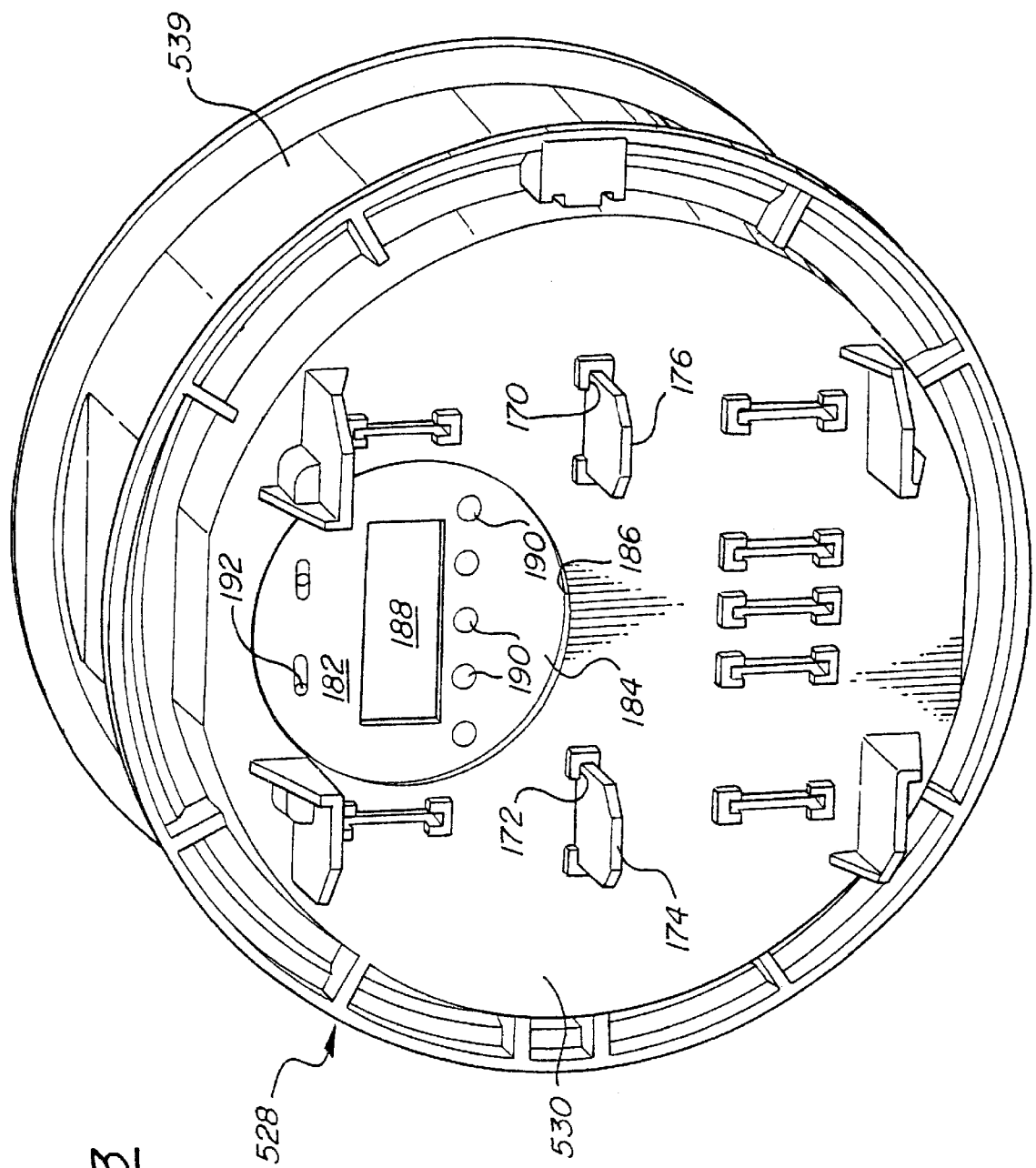
FIG. 23 is rear perspective view showing the printed circuit board and timer mounted in the socket adapter.

In addition to mounting circuit boards between aligned pairs of slots along the periphery of the interior sidewall 539 and base 530 of the socket adapter extender 528, the support of the present invention includes one or more circuit boards mounted between any two blade terminal apertures. A circuit board 168, shown in FIGS. 21A, 22 and 23, is mounted through the slots 170 and 172 in the base 530 which normally receive the fifth and sixth contacts of a watthour meter socket adapter, if present. It will be understood, however, that the circuit board 168 could also be mounted between any pair of line and load contact receiving slots in the socket adapter as described hereafter. The outer edge of the circuit board 168 engages the inner surface of the wall 112 of the shield 110 to assist in holding the circuit board 168 in position without the use of separate fasteners.

As clearly shown in FIG. 21A, the circuit board 168 has a conventional planar circuit board shape with a at least one and, preferably, a pair of depending terminal portions 174 and 176 which are sized to be slidably inserted through the slots 170 and 172 in the base 530. Apertures 178 may be formed in each terminal end for receiving a cotter pin or other fastener to securely retain the printed circuit board 168 in position. Electrically conductive pads or terminals 179 such as a copper foil pad bonded to the circuit board, are carried on the legs 174 for connection to an electrical circuit or component external to the socket adapter 528 by a jaw connection, connector, solder or clamp connection.

The printed circuit board 168 may be used as a mounting surface for any electrical, electromechanical or electronic component or circuit which is to be mounted in a watthour meter socket adapter.

In addition to the use of fasteners or cotter pins extending through the aperture 178 in the terminal ends 174 and 176, the circuit board 168 may also be secured in position by means of an engagement with the bent tab 160 on each surge ground conductor 128 and 130 shown in FIG. 16. The tabs 160 are designed to slid into arcuate shaped notches 121 formed in opposed side edges of the printed circuit board 168 as shown in FIG. 21A.

In one example of an application or use of the printed circuit board 168, as shown in FIGS. 22 and 23, a timer 182 is mounted on the circuit board 168. The timer 182 includes a face plate or dial 184, shown in FIG. 23 which is visible thorough an aperture 186 formed in the base 530 of the socket adapter extender 528. A time display 188 as well as individual pushbuttons or switches 190 and 192 are also mounted on the dial 184 for controlling operation of the timer 182, such as setting the current time, resetting the time. Event times may also be programmed via the switches 190. An output signal from the timer 182 at one event time may energize one or more relays mounted on the circuit board 168 to control components within the socket adapter extender, such as a power disconnect switch, service limiter, etc., to break the circuit between the line and load contacts to shed loads, such as a hot water heater, at a preprogrammed time.

Figure 30:
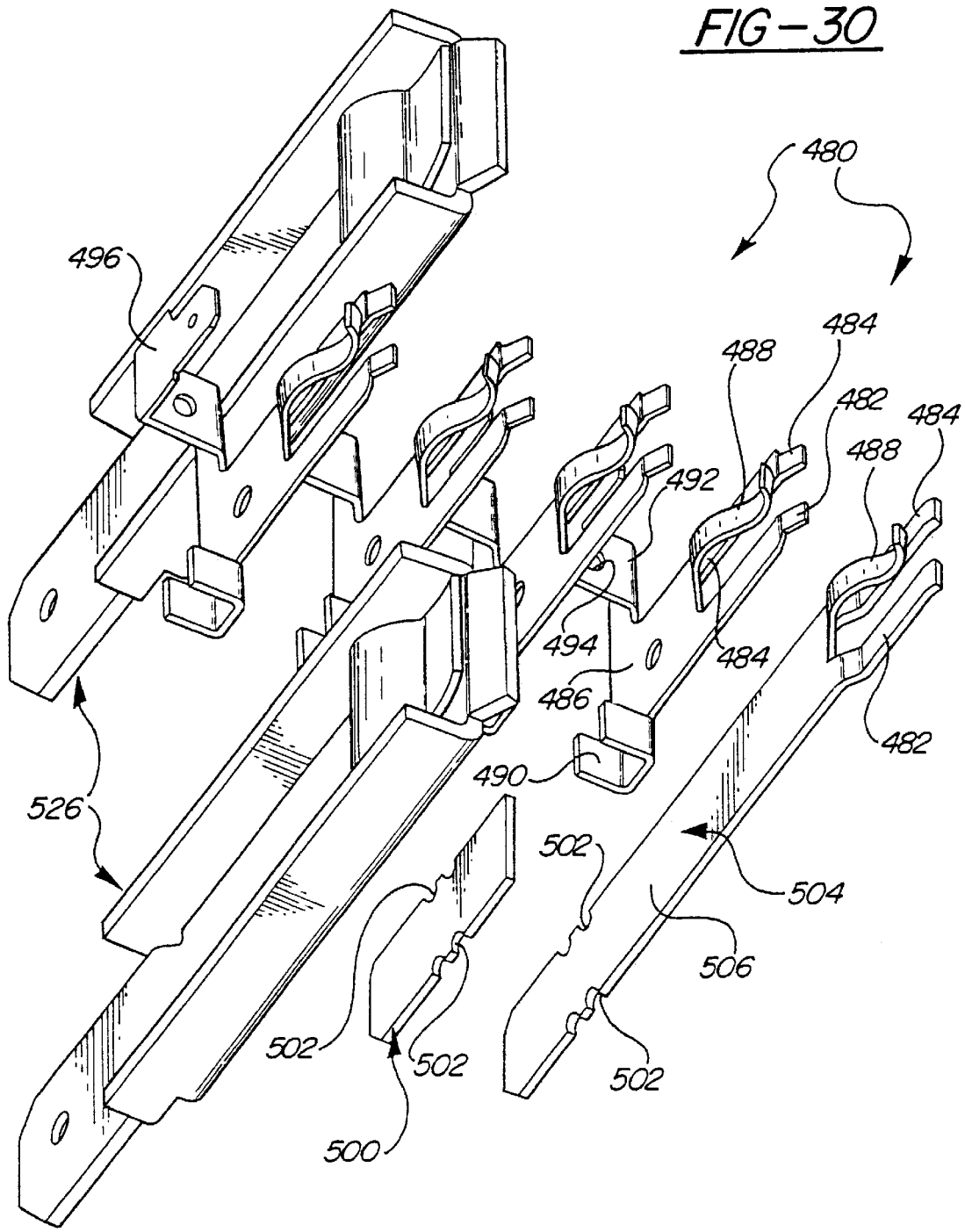
FIG. 30 is a perspective view showing the various jaw contacts, blade terminals and jaw blade terminals mounted in the socket adapter depicted in FIG. 25.

Referring now to FIG. 21B, there is depicted a modified circuit board 710. The circuit board 710 can be mounted between any aligned pair of apertures in the base of a socket adapter, such as between the fifth and sixth terminal positions, or between any pair of line and load terminal positions, or in additional apertures separate from the normal contact mounting apertures. In this embodiment, the circuit board 710 is provided with a two pairs of apertures, not shown, located near the upper edge of the circuit board 710. A conventional socket adapter jaw contact 712 is mounted to the circuit board 710 by means of fasteners extendable through apertures in the jaw contact 712 and the apertures in the circuit board 710. Thus, the jaw contacts 712 can comprise a three finger jaw contact as shown in FIG. 30, and described hereafter. By way of example only, the jaw contact 712 comprises a pair of contact clips 714 which are mounted on opposite sides of the circuit board 710 in an aligned pair. Each of the clips 714 includes apertures alignable with the apertures in the circuit board 710 for receiving mechanical fasteners, such as rivets, therethrough to affix the contact clips 714 to the circuit board 710. The contact clips 714, on at least one side of the circuit board 710, are electrically connected to conductive traces 716 conventionally formed in the circuit board 710. A spring clip 718 is mounted on each contact clip 714 and has an end portion which biases the contacting portions of each contact clip 714 toward the opposed contact clip 714 to provide a secure electrically connection between the contact clip 714 and an inserted electrical terminal.

The contact clip 714 as well as the spring clip 716 may be formed as a one piece member having a single end portion. Alternately, as shown in FIG. 21B, each contact clip 714 and each spring clip 716 may be soldered to form two end portions. Further, the end portions of each contact clip 714 may be provided at different lengths to provide a staggered electrical terminal insertion force.

As also shown in FIG. 21B, the conductive pads 179 mounted on the terminal end portions 174 and 176 of the circuit board 710 are also electrically connected to conductive traces 720 carried on the circuit board 710. Any electrical circuit or electrical component may also be mounted on the circuit board 710 and electrically connected to the conductive traces 716 and 720 in a conventional manner.

FIG. 21C depicts a further modification to the circuit board 710. In this aspect of the invention, each jaw contact clip 724 is mounted directly on the circuit board 710 such that the contact fingers of each contact clip 724 are spaced from a conductive pad 726, such a copper foil pad, bonded or otherwise mounted on the circuit board 710. In this aspect of the invention, each jaw contact clip 724 and opposed conductive pad 726 form a single jaw contact for receiving a blade terminal therebetween in electrical connection.

Further, the terminal end portions of the circuit board 710, in this embodiment, may be formed solely by flat, electrically conductive plates 728, such as copper-tin plates which are fixedly mounted to the circuit board 710 by means of fasteners, such as rivets mounted through aligned apertures in each plate 728 and the lower portion of the circuit board 710. It is also feasible, in the present invention, to directly overlay the conductive plates 728 on the terminal portions 174 and 176 extending from the main portion of the printed circuit board 710.

One or more relays may be mounted on the printed circuit board 710, each relay including at least one switchable contact which is movable between a normally open and a normally closed position. The contact terminals can be electrically connected by separate wires or conductors or by means of conductive traces on the circuit board 710 between one jaw contact 712 and one plate terminal portion 179 in the embodiment shown in FIG. 21B or between one jaw contact 724, 726 and one conductive terminal plate 728 in the embodiment shown in FIG. 21C. The relay(s) can serve as a power disconnect or service limiter such that in normal operation, the relay contacts are closed allowing electrical current to flow between one jaw contact and one associated conductive plate or blade portion. However, when the relay (s) are activated, the contacts switch positions to an open position thereby opening or breaking the circuit between each jaw contact and blade terminal pair to disconnect electrical power to the use site.

The spring arm 840 described above and shown in FIG. 36, for example, may also be employed on the circuit board 168 having at least one and preferably a pair of spaced legs extending therefrom and projectable through aligned apertures formed in the base wall of a socket adapter. Since the circuit board 168 must be positioned in general proximity with one of the socket adapter contacts, additional apertures are formed in the base wall of the socket adapter to accommodate the leg(s) of the circuit board.

The circuit boards described above, such as circuit board 168 shown in FIG. 21A by example, are designed for separate stand alone use in a watthour meter socket adapter as well as in conjunction with one of the shields described above, such as shield 110 shown in FIG. 15. When used with the shield 110, each circuit board 168 has an overall height from a lower edge contacting the base wall of the socket adapter such that the opposed edge of the circuit board contacts the inner surface of the shield to assist in supporting the circuit board in the desired position and orientation within the socket adapter.

In addition, the groups of support pins 818, 820 and 826 described above and shown in FIGS. 34–39, may also be formed as an integral molded part of one of the shields, such as shield 10. This arrangement enables the circuit board to be placed in the shield prior to mounting the entire shield in the socket adapter.

Figure 24:
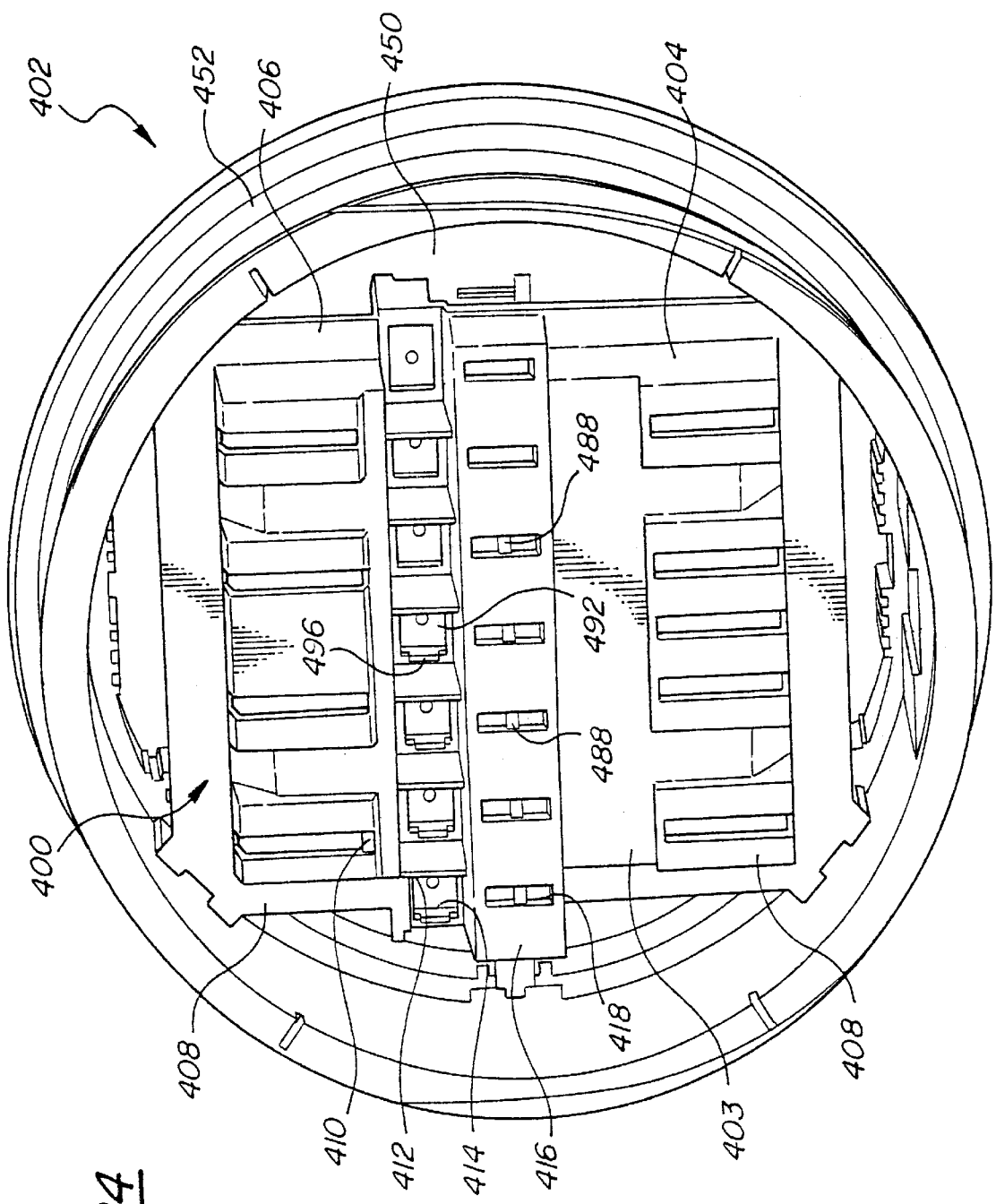
FIG. 24 is a perspective view of another embodiment of a safety shield according to the present invention usable with a current transformer rated watthour meter socket adapter.

Referring now to FIG. 24, there is depicted a safety shield 400 which is specifically designed for use in a current transformer rated watthour meter socket adapter 402. In general, the safety shield 400 is similar to the safety shield 580 described above and shown in FIG. 7 in that it includes a top wall 403, a plurality of depending sidewalls 404, and a peripheral flange 406 projecting generally perpendicularly outward from each sidewall 404. A plurality of raised bosses 408 extend upward a slight distance above the surface of the top wall 403 and carry individual slots 410 opening to the interior of the shield 400 and providing access to jaw contacts mounted on the base of the socket adapter 402. The top wall 403 is also formed with a plurality of laterally spaced dividers or walls 412 which form laterally spaced apertures 414 between adjacent dividers 412. Further, in a centrally located, raised portion 416, a plurality of laterally spaced slots 418 are formed to provide access to current transformed rated jaw contacts mounted within the socket adapter 402, as described hereafter.

The safety shield 400 may be securely or fixedly mounted to the socket adapter 402 by any of the mounting or latch means described above for the safety shields 580 and 620.

Figure 25:
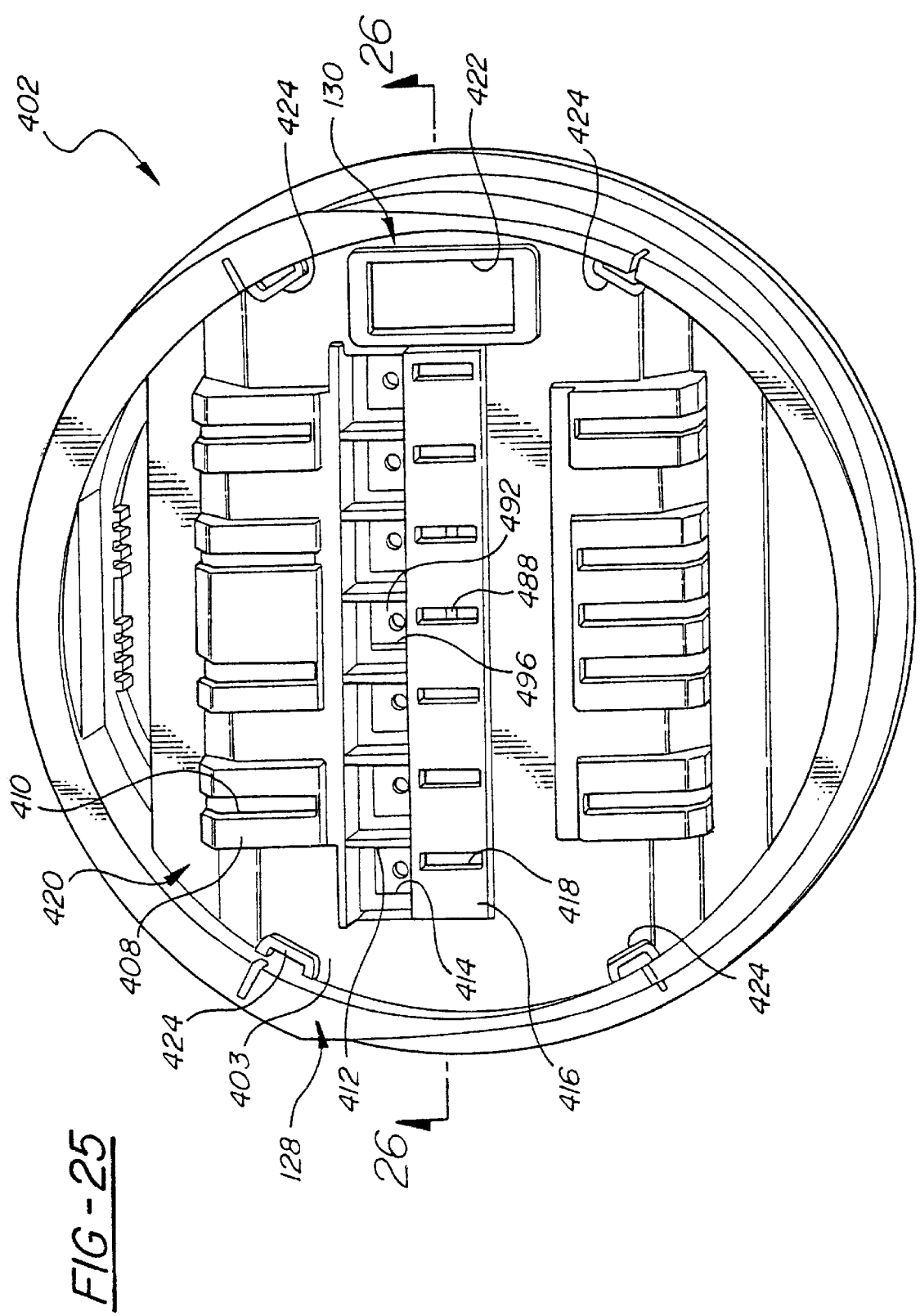
FIG. 25 is a perspective view of another embodiment of a safety shield usable in a current transformer rated socket adapter.
Figure 26:
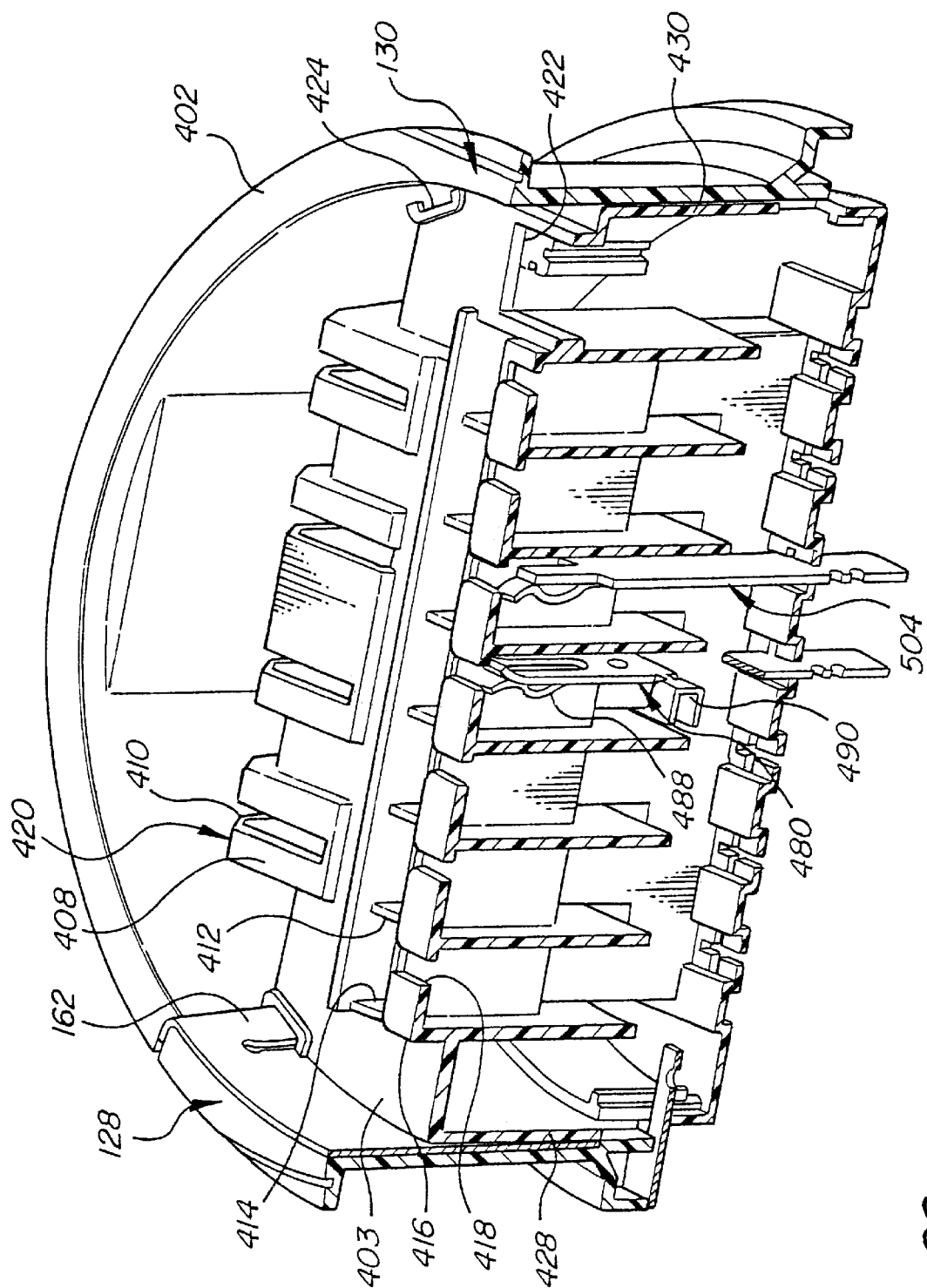
FIG. 26 is a lateral cross-sectional view generally taken along lines 26—26 in FIG. 25.

FIGS. 25 and 26 depict a modified safety shield 402 which is similar to the safety shield 400 in that it includes raised bosses 408 extending from a top wall 403, slots 410 formed in each boss 408, spaced dividers 412 forming laterally spaced apertures 414, and a raised portion 416 carrying laterally spaced slots 418. However, in this embodiment, the top wall 403 has a greater lateral extent so as to closely conform to the inner sidewall of the socket adapter 402. A polygonal shaped aperture 422 is formed along one lateral side edge of the top wall 403 for receiving a current transformer shorting switch, or electrical pin connector, not shown.

Opposed pairs of raised bosses 424 formed along lateral opposed side edges of the top wall 403 and form recesses designed to receive spring fingers 162 and 164 on the surge ground conductors 128 and 130 in the same manner as described above and shown in FIGS. 15–18. In this manner, the spring fingers 162 and 164 on the surge ground conductors 128 and 130 fixedly, yet releasably mount the safety shield 420 within the interior of the socket adapter 402.

The safety shield 420 is formed with a pair of spaced arcuate sidewalls 428 and 430 which are diametrically opposed on opposite sides of the safety shield 420. The arcuate sidewalls 428 and 430 are disposed adjacent to the arcuate wall portions 148 of the surge ground conductors 128 and 130.

Figure 27:
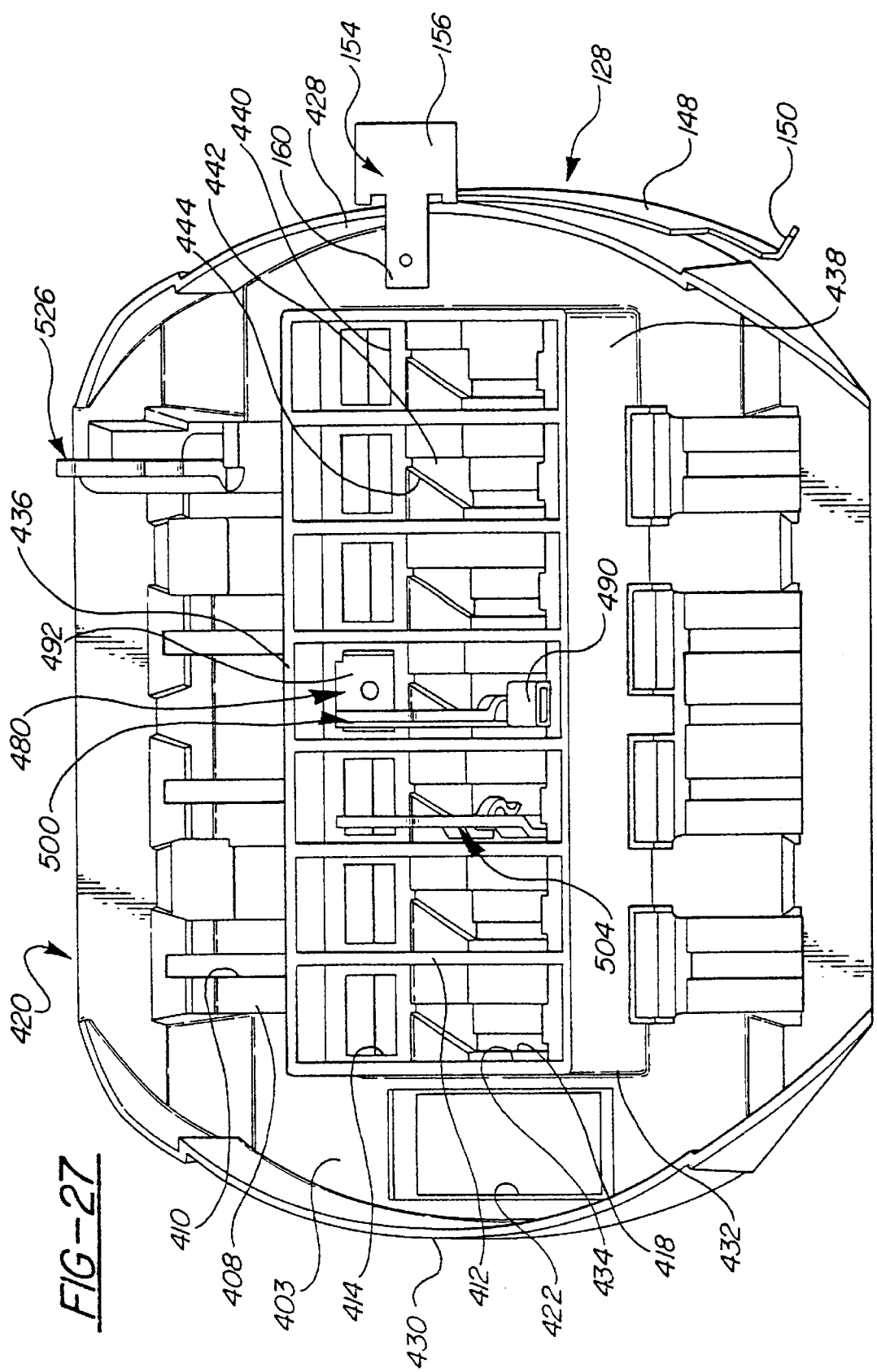
FIG. 27 is a bottom perspective view of the safety shield shown in FIGS. 25 and 26.

As shown in FIG. 27 which depicts a rear or bottom view of the safety shield 420, a rectangular frame 432 formed of four interconnected sidewalls projects from the rear surface of the top wall 403 of the safety shield 420. The dividers 412 extend from the top to the bottom of the frame 432 and between opposed elongated sidewalls of the frame 432. The frame 432 and spaced dividers 412 form a plurality of pairs of cavities, including the cavities 414 opening through the top wall 403 of the safety shield 420 and a plurality of interior cavities 434 opening to the slots 428 in the top wall 403 and defining a jaw contact mounting area.

The frame 432 also includes a first laterally extending wall 436, a spaced second laterally extending wall 438 and a plurality of intermediate short walls 440 which extend between each of the dividers 412. An enlargement 442 having a tapered or angled edge 444 on one side thereof facing the cavity in the frame 432 opening to the slots 418. The angled or tapered surface 444 acts as a guide for urging the potential jaw contacts into the proper location within the cavity in the frame 432 into alignment with the slot 418 so as to be positioned to receive a blade terminal of a watthour meter inserted through the slot 418.

Figure 28:
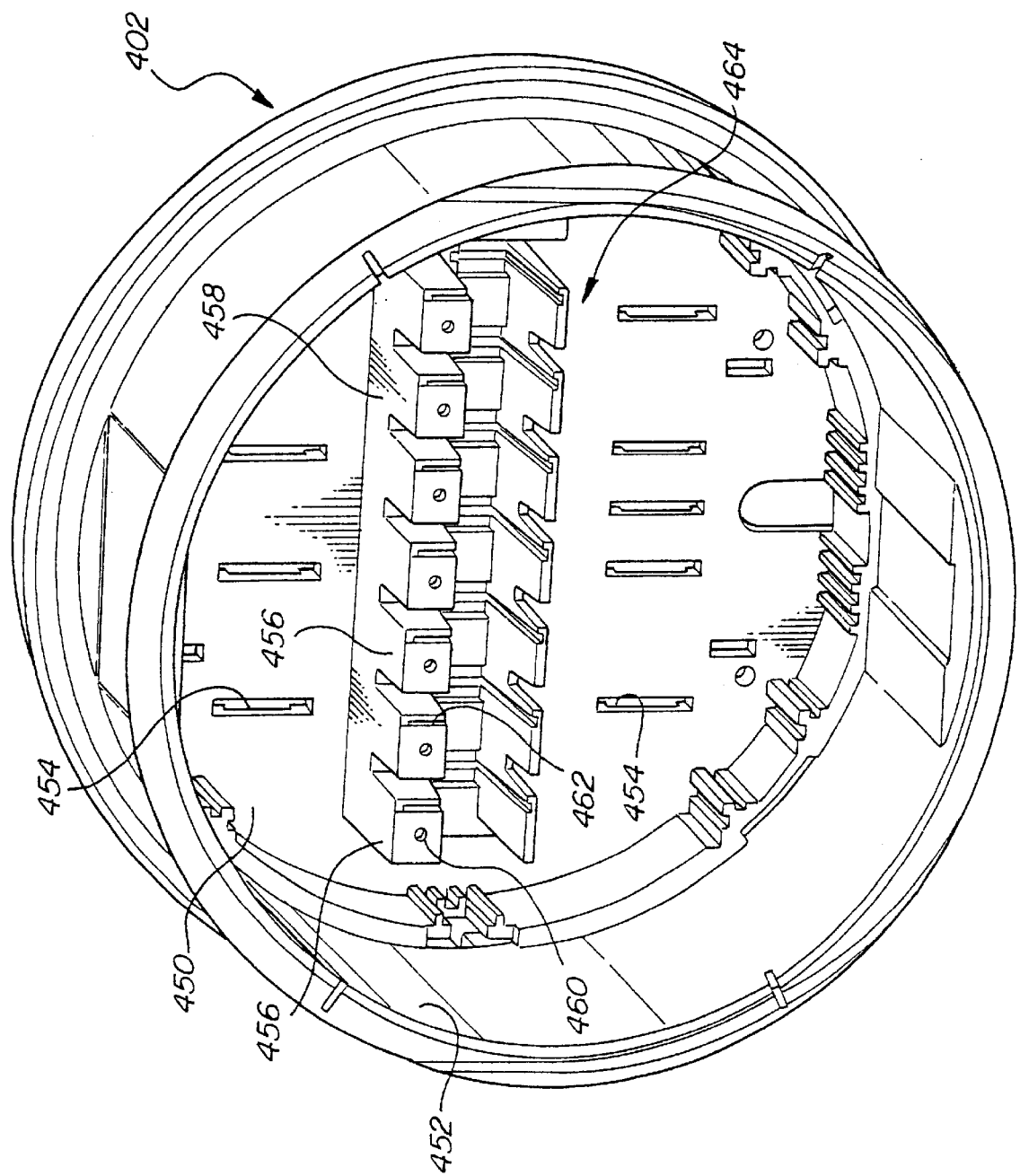
FIG. 28 is a front perspective view of the socket adapter shown in FIG. 25, with the safety shield removed.
Figure 29:
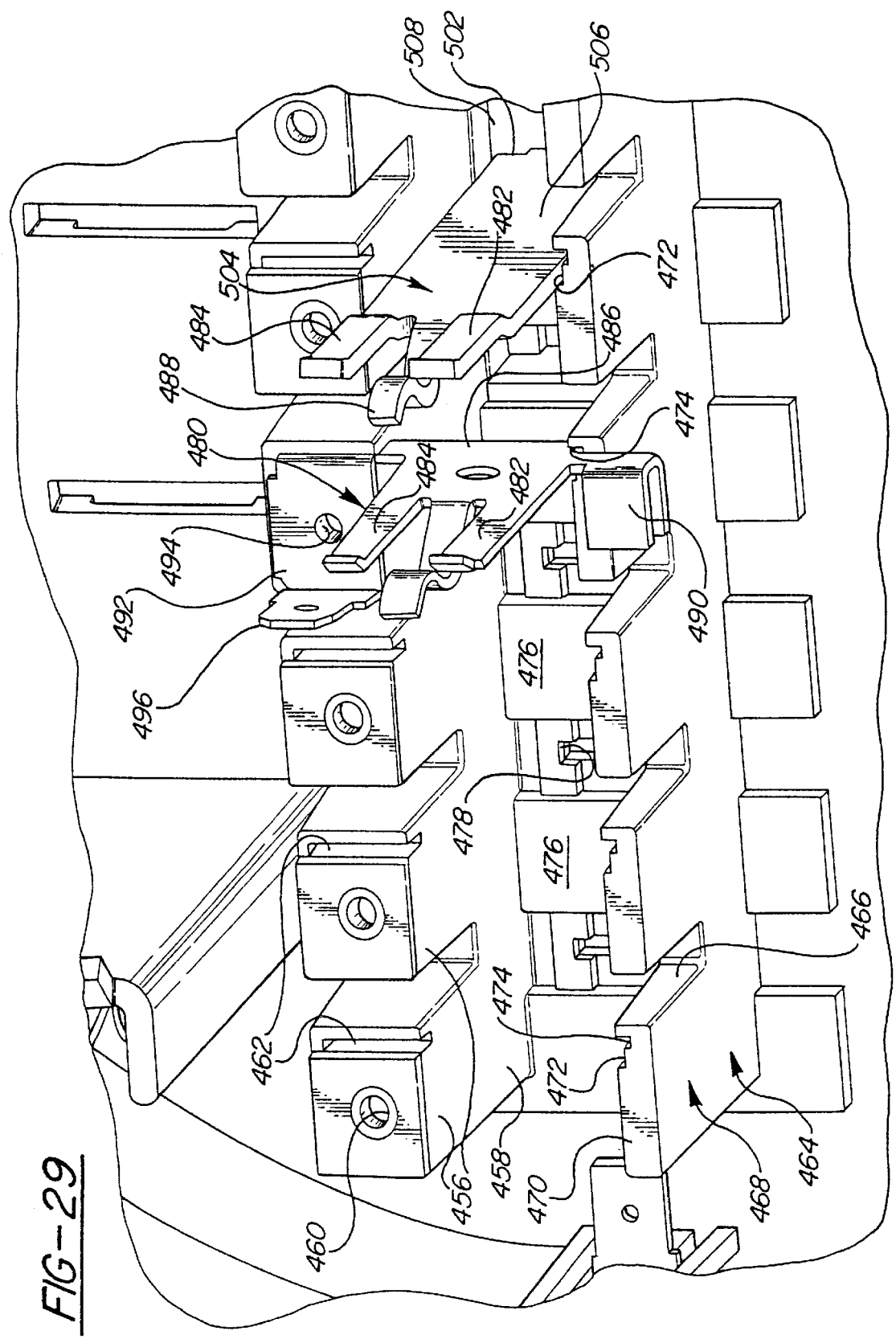
FIG. 29 is an enlarged, perspective view of a portion of the socket adapter shown in FIG. 28 depicting the mounting of potential jaw contacts.

FIGS. 28 and 29 depict interior views of the socket adapter 402, with the shield 400 removed. As shown in FIG. 28, the socket adapter 402 includes the generally planar base 450 and an annular sidewall 452 projecting therefrom. A plurality of line and load watthour meter blade terminal receiving slots 454 are formed in the base 450 at the normal watthour meter blade terminal positions. In order to support auxiliary electrical contacts on the base 450, a plurality of posts 456 are integrally formed with the base 450 and project generally perpendicularly therefrom. The posts 456 are disposed between the line and load jaw blade receiving slots 454. The posts 456 have a generally square cross section extending from a common lower portion 458 and are laterally spaced across the base 450.

An aperture 460 is formed in the top end of each post 456 for receiving a fastener or screw as described hereafter. Also, a notch 462 is formed in the outer end of each post 456 and has a configuration for receiving a planar flange on an electrical contact as described hereafter.

A barrier 464 is also formed on the base 450 and is spaced from the posts 456. The barrier 464 also extends laterally across the base 450 and has a plurality of laterally spaced recesses 466 which divide the barrier into a plurality of walls 468. Each wall 468 has a top edge 470 and a stepped recess formed on one side facing the posts 456. The recess is formed with a first shallow notch 472 and a second, adjacent, deeper notch 474.

A pad 476 is formed on the base 450 of the socket adapter 402 and extends between one post 456 and one wall 468. A generally rectangular slot 478 is formed between two adjacent pads 476. The slots 478 open through the base 450 of the socket adapter 402 and are sized to receive one end of a conventional blade terminal, as described hereafter.

Although each of the safety shields 110, 400 420, 580, 620 and 630 have been described above as being releasably mountable in a watthour meter socket adapter housing by a snap-in connection, it will be understood that each safety shield, instead of the snap-in connection, or in combination with the snap-in connection, may be more fixedly mounted in the housing of a socket adapter by applying adhesive between adjoining portions of each safety shield and adjacent wall surfaces of the socket adapter housing, or the wall portion 148 of the surge ground conductor 128 shown in FIG. 17. While referring briefly to FIG. 17, adhesive can also be applied to the bottom edge of the safety shield 110 and the upper surface of the ring or collar formed on the inner surface of the sidewall 539 of the socket adapter 528.

Before describing mounting of the electrical contacts on the posts 456 and walls 468, a brief description of the construction of several configurations of electrical contacts will be provided.

One embodiment of an electrical contact 480 is shown in FIGS. 29 and 30. The electrical contacts 480 are identical to the three finger jaw contacts disclosed in U.S. Pat. No. 5,853,300, assigned to the Assignee of the present invention, the entire contents of which pertaining to the three finger contact construction are incorporated herein by reference.

In general, each contact 480 has a three finger jaw-type contact design formed of first and second outer legs 482 and 484 which extend linearly from a generally planar base 486. Each of the legs 482 and 484 terminates in a angularly bent outer end portion, both of which extend in the same direction to one side of the base 486. An intermediate leg 488 is disposed between the outer legs 482 and 484 and has a generally curved shape extending from the base 486 to an opposite side of the base 486 from the outer ends of the outer legs 482 and 484. The outer ends of the intermediate leg 488 also curves or bends outward from one side of the base 486 to form, in conjunction with the legs 482 and 484, a jaw contact which receives a blade terminal extending outward from the base of a watthour meter, not shown.

A wire crimp collar 490 formed of two angularly disposed, bendable flanges, extends from one end of the base 486. The two flanges of wire crimp collar 490 are bendable into registry with one end of an external conductor, not shown, to electrically connect one end of the external conductor to the contact 480. Alternately, solder may be used to connect the external conductor to the flanges of the wire crimp collar 490.

A support flange 492 is formed contiguous with the base 486 and extends generally perpendicularly from an opposite end of the base 486. A threaded aperture 494 is formed in the support flange 492 and is alignable with the aperture 460 on the top edge of one post 456. A screw fastener, not shown, threadingly engages the aperture 494 on the support flange 492 and the aperture 460 in the post 456 to fixedly mount the jaw contact 480 on the base 450 of the socket adapter 402. An external conductor, not shown, may also be connected to the support flange 492 by connecting the external conductor to the screw fastener extending through the aperture 494 in the support flange 492. A washer may be interposed between the head of the screw fastener in the support flange 492 for secure electrical engagement of the external conductor with the support flange 492.

Finally, a mounting tab 496 extends perpendicularly from an outer end of the support flange 492. The mounting tab 496 provides a separate connection to another external electrical conductor, not shown, such as a conventional fast-on or quick connector which is fixedly attached to one end of an electrical conductor and slidable engaged over a complimentary formed mounting tab 496 to connect the external conductor to the contact 480.

Referring again to FIGS. 29 and 30, one jaw contact 480 is mounted on one aligned pair of a post 456 and a wall 468. One end of the base 486 projecting downward from the wire crimp collar 490 is seated in the deeper notch 474 in the wall 468. Since the notch 474 extends only a short distance along the wall 468 from the top edge 470, one end of the contact 480 is located such that the wire crimp collar 490 seats on the top edge 470 of the wall 468 and the support flange 492 rests on the top edge of the post 456, with the end portion of the base 486 seated within the notch 462 in the post 456.

A planar blade terminal 500 is associated with the contact 480. The blade terminal 500 has a generally planar extent with intermediate shoulders 502 designed to seat on the base 450 of the socket adapter 402, with the lower portion of the blade terminal 500 extending through one slot 478 in the base 450. The blade terminal 500 is secured in position within the socket adapter 402 by means of a cotter pin, not shown.

Referring briefly to FIGS. 24–27, when the contact 480 is in the mounting position shown in FIG. 29, the legs 482, 484 and 486 defining the contact itself are aligned with one slot 418 in the shield 400 thereby allowing a blade terminal from the watthour meter to be inserted through the slot 418 in the safety shield 400 into contact with the jaw contact legs 482, 484, and 486. At the same time, the support flange 492 as well as the fast-on tab 496 are accessible through the aperture 418 in the shield 400 to allow electrical connections with external electrical conductors.

Referring again to FIGS. 29 and 30, there is depicted another embodiment of an electrical contact or blade terminal 504 which can be mounted in the socket adapter 402. The jaw blade terminal 504 has a one-piece construction which combines the three finger jaw contact structure of the jaw contact 480 with an integral blade terminal similar to the separate blade terminal 500. The three legs 482, 484, and 486 are shown in FIG. 30 at one end of the elongated, planar bar 506 which is part of the jaw blade terminal 504. Shoulders 502 are formed adjacent the blade terminal end of the jaw blade terminal 502 and seat on raised portions 508 extending between adjacent tabs 476 on the base 450 of the socket adapter 402. One side edge of the upper portion of the planar bar 506 seat in the shallow notch 472 on the wall 468. The opposite side edge of the upper portion of the planar bar 506 rests against the sidewall of a post 456 to position the jaw contact 504 between one post 456 and one wall 468 and to enable the jaw contact end of the jaw blade terminal 504 to be positioned below and accessible through one slot 418 in the shield 400 as shown in FIG. 26.

Figure 31:
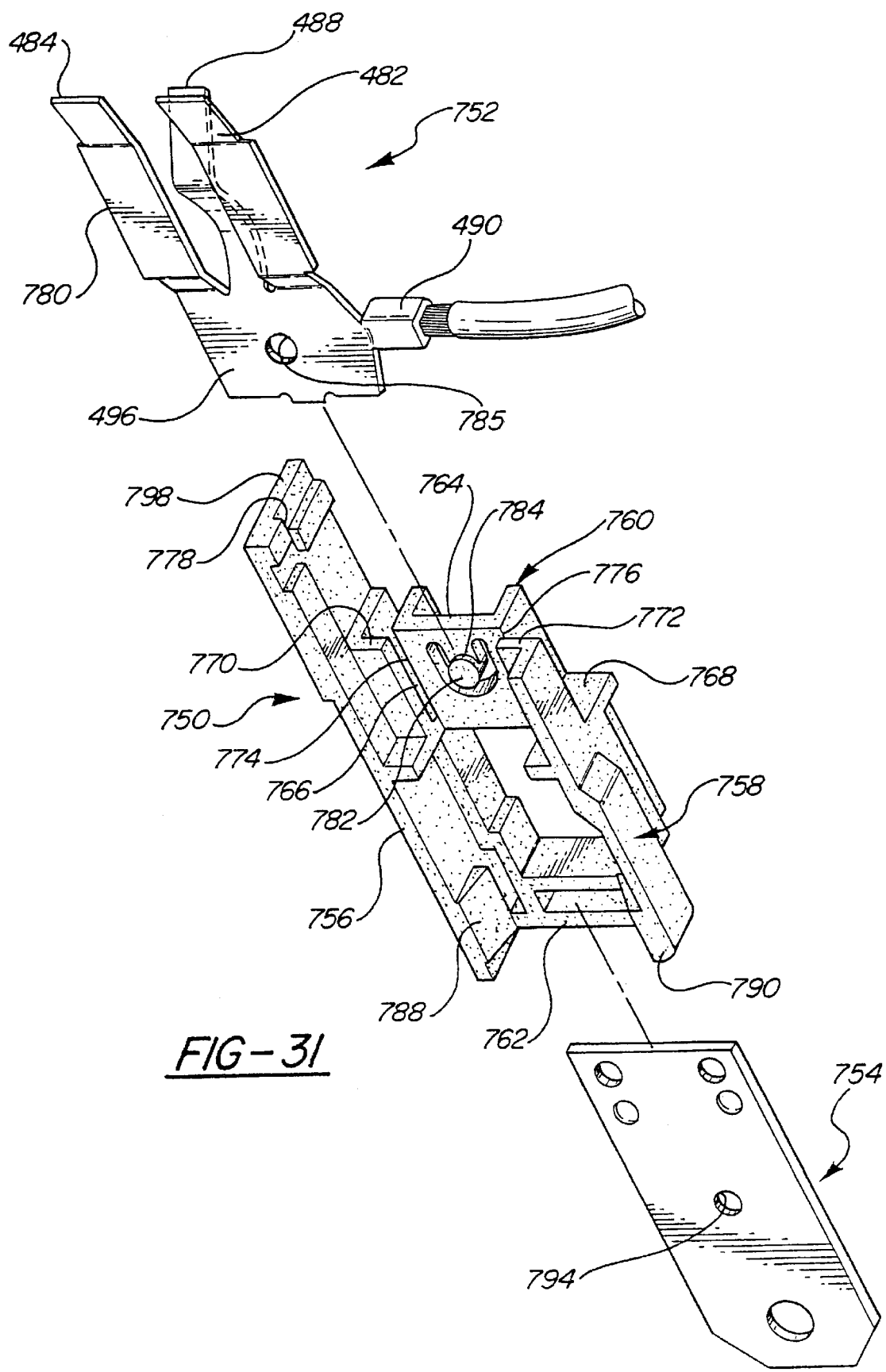
FIG. 31 is an exploded perspective view of a jaw contact and blade terminal coupler according to the present invention.
Figure 33:
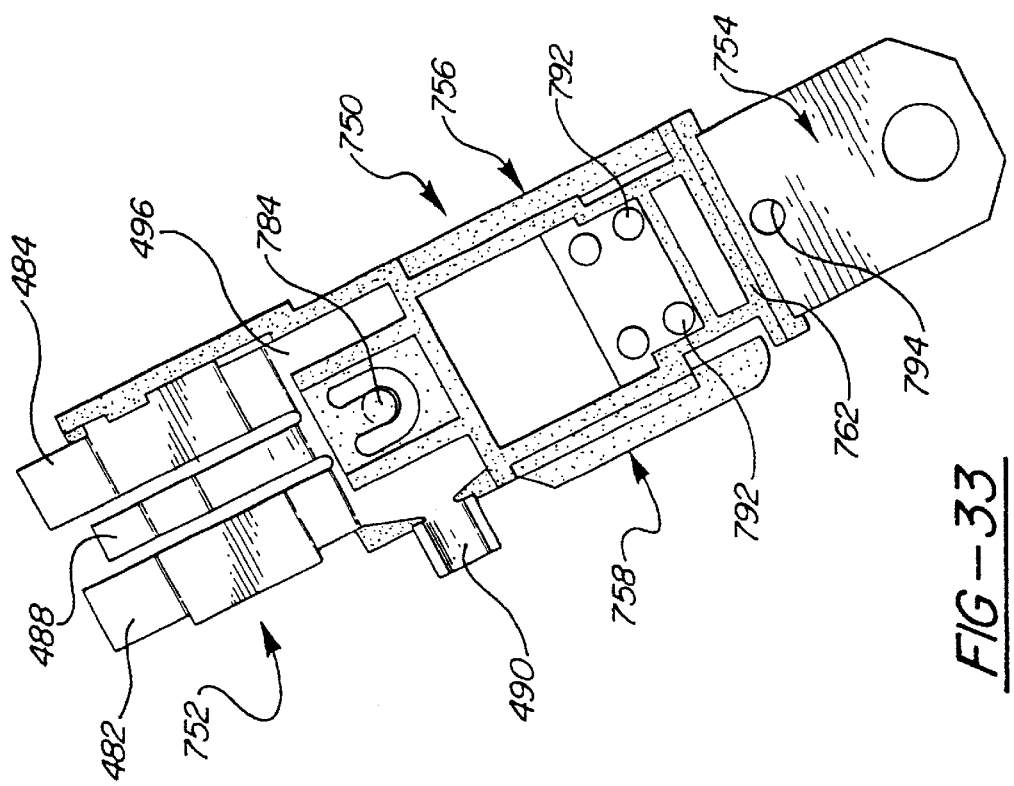
FIG. 33 is a perspective view of the assembled jaw contact and blade terminal coupler of FIG. 31 taken from a second opposite side.
Figure 32:
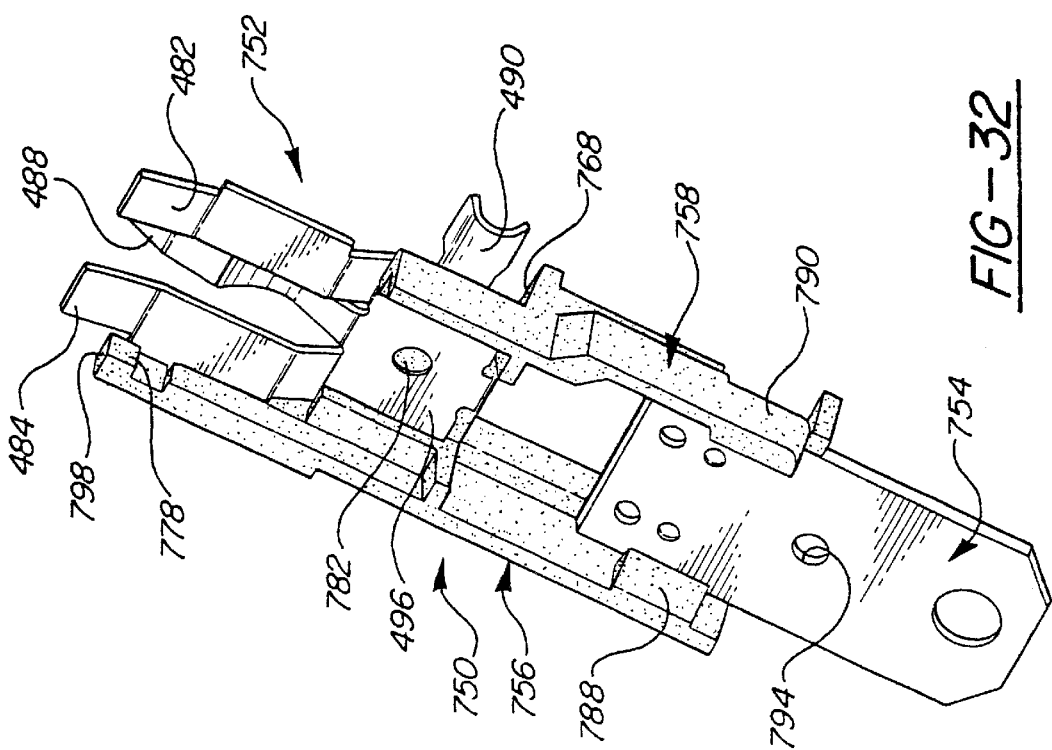
FIG. 32 is a perspective view of the assembled jaw contact and blade terminal coupler of FIG. 31 of the present invention taken from a first side of the coupler.

Finally, a coupler 750 is depicted in FIGS. 31–33 for joining an electrical contact 752 with a planar blade terminal 752 into a unitary construction which may be mounted as a unitary jaw blade terminal in the socket adapter 402 in the same manner as the jaw blade terminal 504. The coupler 750 is formed of an electrically insulating material, such as a plastic, to electrically isolate the jaw contact 752 from the blade terminal 754.

The jaw contact 752 is a modified version of jaw contact 480 and is essentially the same as the jaw contact 480 except that jaw contact 752 does not include the support flange 492 and fast-on tab 496. For convenience, the three legs 482, 484 and 488 forming the jaw portion of the jaw contact 752 are given the same reference numbers as the corresponding legs in the jaw contact 480. Likewise, a wire crimp collar 490 projects from one end of a base 496.

The coupler 750 is exemplary formed as a one piece, unitary body having a first elongated sidewall 756, and an opposed shorter sidewall 758 which are interconnected by upper and lower center walls 760 and 762, respectively, which are spaced apart along the length of the sidewalls 758 and 760.

The upper center wall 760 has a generally U-shape formed of a center portion 764 which is offset or spaced from a pair of base flanges 766 and 768 projecting from the sidewalls 756 and 758, respectively, as well as a pair of side flanges 770 and 772 which also project from the sidewalls 756 and 758, respectively, to form a slot which receives the base 486 of the jaw contact 752. The base flanges 766 and 768, the side flanges 770 and 772 as well as the center portion 764 of the upper center wall 760 interact along with a slot 778 formed between a pair of spaced projections in the upper end of the sidewall 756 to securely support the jaw contact 752 in the coupler 750. The slot 778 engages an outwardly projecting side edge 780 on the leg 482 of the jaw contact 752.

The jaw contact 752 is also retained in place in the coupler 50 by means of a projection 782 which is formed on one end of a cantilevered, resilient arm 784 which projects from one end of the center wall 764 into an opening formed in the center portion 764 as shown in FIG. 31. The projection 782 engages an aperture 785 in the base 486 of the jaw contact 752.

The lower center wall 762 is spaced from inwardly projecting side flanges 788 and 790 formed on one end of the sidewalls 756 and 758, respectively, to form openings which slidably receive the planar blade terminal 754 therein. A pair of raised dimples 792 spaced from one end of the blade terminal 754 snap over the center wall 762 of the coupler 750 to slidably trap the blade terminal 754 between an upper edge of the lower center wall 762 and inwardly facing projections on the sidewalls 756 and 758. A cotter pin or other fastener may be inserted through an aperture 794 in the blade terminal 754 to more securely retain the blade terminal 754 in the coupler 750.

Referring briefly to FIGS. 27 and 31–33, a plurality of U-shaped channels 796 project from the back surface of the top wall 403 of the safety shield 420. The U-shaped channels 796 are formed adjacent to one lateral leg of the frame 432 at one end of certain slots 410 in the safety shield 420. The U-shaped channels slidably receive the upper end 798 of the sidewall 756 of the coupler 750 to accurately mount the coupler 750 with respect to one slot 410 in the safety shield 420.

Figure 42:
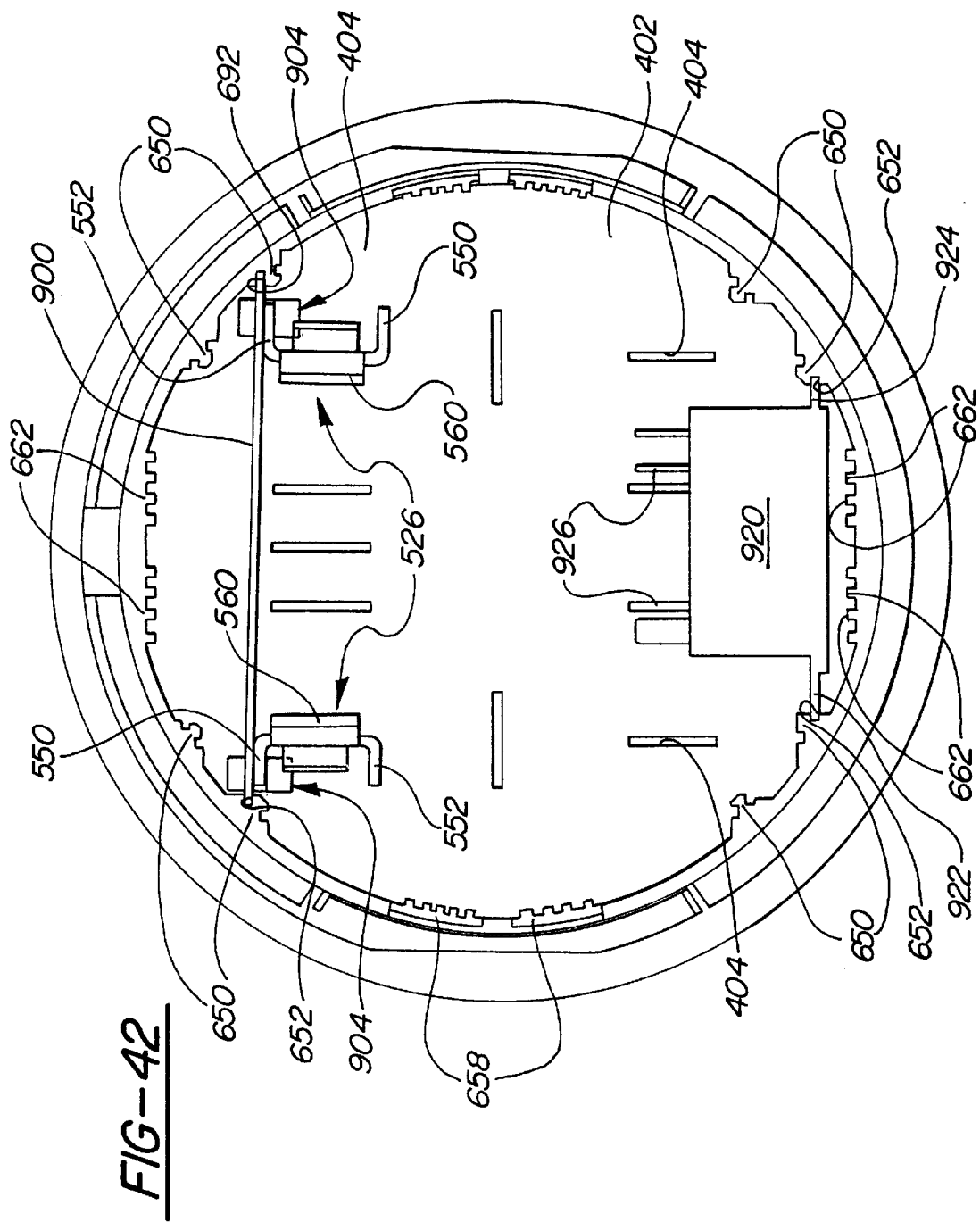
FIG. 42 is a plan view of a socket adapter with an alternate circuit board power connection and component mount according to the present invention.
Figure 43:
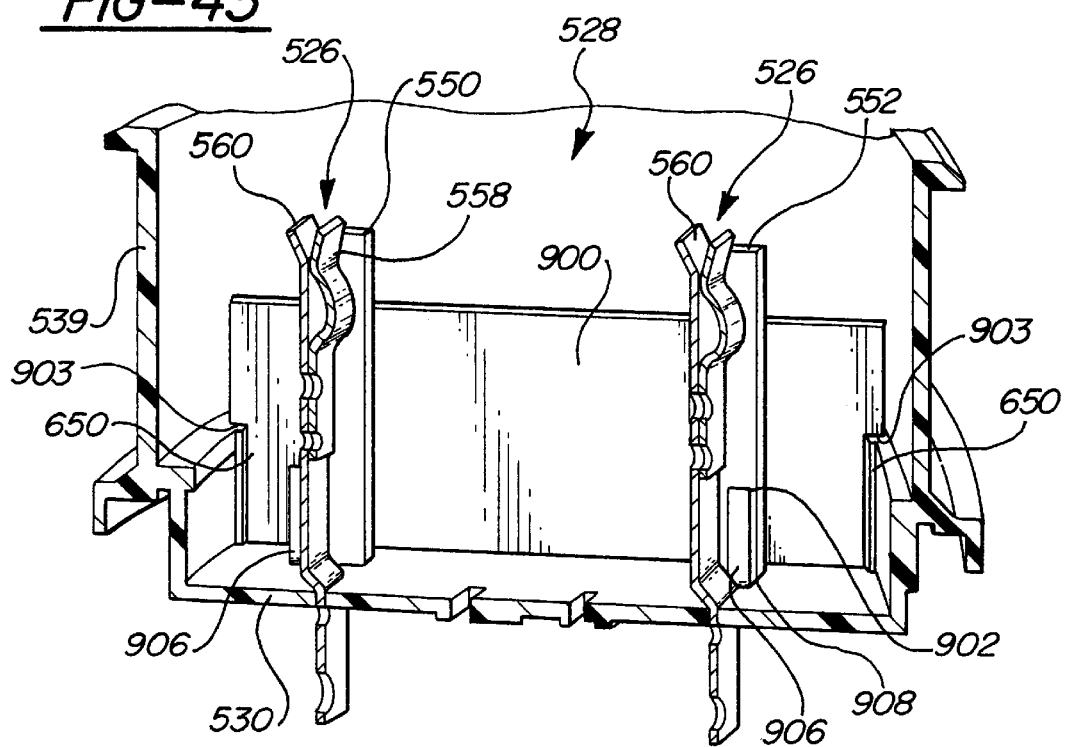
FIG. 43 is a partial, enlarged, perspective view showing the connection between the circuit board and the jaw blade depicted in FIG. 42.
Figure 44:
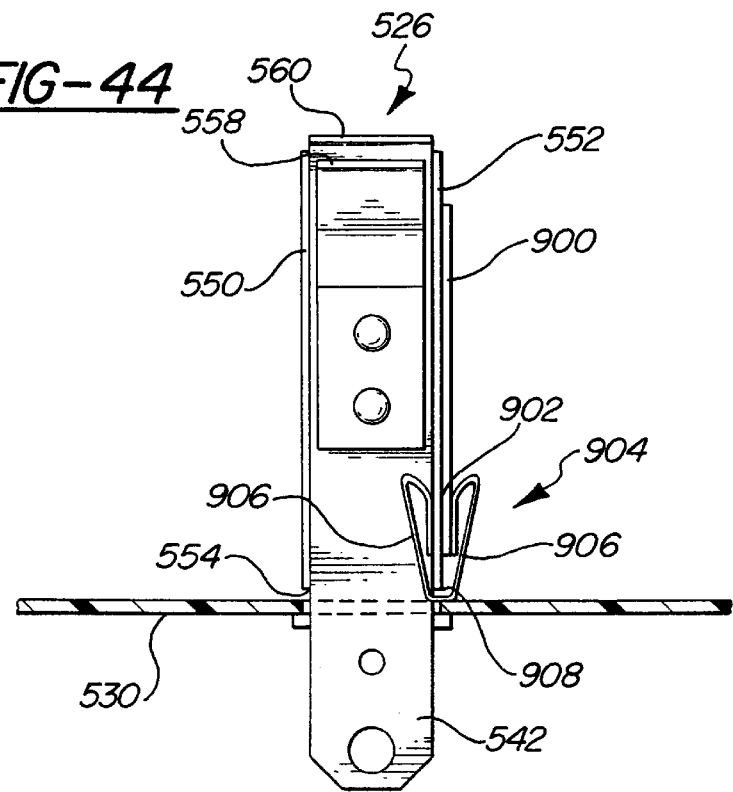
FIG. 44 is a side elevational view of the circuit board power connection shown in FIGS. 42 and 43.

Referring now to FIGS. 42–44, there is depicted yet another aspect of the present invention for mounting a circuit board 900 in the socket adapter housing with electrical connections on the circuit board 900 receiving electrical power from one of the line jaw blades, such as jaw blade 526.

In this aspect in the invention, the circuit board 900 is provided with at least one electrically conductive pad or terminal 902 on one or both surfaces of the circuit board 900. The conductive pad 902 is positioned on the circuit board 900 so as to electrically engage the flange 550 or 552 of the jaw blade 526. The pad 902 and the flange 550 or 552 are biased together in secure electrical contact by a mounting jaw 904 having opposed spring jaw portions 906 which is normally disposed on opposite sides of the mounting flange 552 of the jaw blade 526, and a central base portion 908 engaged with the end surface 554 of the mounting flange 552 as shown in FIG. 44. Alternately, a pad, not shown, can be mounted on the opposed surface of the circuit board 900 and engaged by one spring jaw 906. In this manner, the mounting jaw 904 completes an electrical circuit between the line jaw blade 526 and the conductive pad 902 on the circuit board 900 to provide electrical power to the electrical circuits and components mounted on the circuit board 900.

Although the circuit board 900 could be mounted only in one or two or more spaced mounting jaws 904 attached to each of the line blade jaws 526, as shown in FIG. 42, the outer lateral ends of the circuit board 900 are formed with a notch 903 which overlays the top end of two opposed posts 650 formed in the socket adapter housing 400. Outer edges of the circuit board 900 fit within the U-shaped channel 652 in each post 650 to add lateral support to the circuit board 900 in combination with the mounting jaws 904.

Another aspect of the present invention is shown in FIG. 42 wherein an electrical component 920, such as a relay, timer, circuit breaker, telephone modem, etc., is directly mounted in one of the supports in the socket adapter housing 400. As shown in FIG. 42, a pair of outwardly extending flanges 922 and 924 are integrally formed with the housing of the component 920 or as an attachment in the form of one or more flanges or ends of a plate securely fixed to the housing of the electrical component 920. The flanges 922 and 924 extend outward from opposite side walls of the housing of the electrical component 920 and are sized to slideably fit within opposed channels 652 in opposed posts 650 in the socket adapter 400. This provides slide in support of the electrical component 920 without the need for mechanical fasteners. Further, the operative connections or attachments to the electrical component, such as the plurality of terminals 926, can be located in an easily accessible position in the socket adapter housing 400 for connection to other electrical components, circuit boards, jaw blades, etc., within the socket adapter housing 400.

In summary, there has been disclosed a unique circuit board mounting arrangement for supporting one or more circuit boards within the housing of a watthour meter socket adapter. The various embodiments of the circuit board supports provide versatility in mounting circuit boards at a number of different locations within the socket adapter without interfering with the function of the electrical contacts or jaw blades mounted in a socket adapter. Further, unique connections or access to electrical components mounted on the circuit board is provided as well as automatic connection to one of the contacts in the socket adapter to complete a circuit between the socket adapter contact and the circuitry or components carried on the circuit board.

What is claimed is:

1. A watthour meter socket adapter including a housing having a base wall and a sidewall extending from the base wall, the socket adapter comprising:
   at least one pair of opposed slots carried in the housing and adapted for supporting a circuit board in a substantially perpendicular orientation with respect to the base wall of the housing.

2. The watthour meter socket adapter of claim 1 wherein:
   the at least one pair of slots are formed in the housing adjacent the sidewall and adapted for supporting the circuit board between two diametrically opposed portions of the sidewall of the housing.

3. The watthour meter socket adapter of claim 1 wherein the at least one pair of slots comprises a plurality of pairs of opposed slots formed in the housing.

4. The watthour meter socket adapter of claim 1 wherein:
   at least one pair of posts are formed as unitary extensions of the sidewall of the housing at the junction of the sidewall to the base wall; and
   at least one slot of the pair of slots formed in each post.

5. The watthour meter socket adapter of claim 4 wherein a plurality of slots are formed in each post.

6. The watthour meter socket adapter of claim 1 wherein:
   each slot is adapted to slidably engage a side edge of the circuit board.

7. The watthour meter socket adapter of claim 1 wherein:
   the slots define an opening adapted for receiving a portion of the circuit board therein.

8. The watthour meter socket adapter of claim 6 wherein the support member comprises:
   a plurality of posts mounted on the base wall, each post having an end spaced from the base wall adapted to engage the circuit board.

9. A watthour meter socket adapter including a housing having a base wall and a sidewall extending from the base wall, the socket adapter comprising:
 a support carried in the housing;
 at least one aperture formed in the base wall of the watthour meter socket adapter; and
 a circuit board mounted in the support and having at least one leg projecting therefrom, an electrically conductive element carried on the at least one leg, the leg insertable through the at least one aperture in the base wall and extending exteriorly of the base wall for electrical connection of the electrically conductive element on the at least one leg external of the base wall.

10. The watthour meter socket adapter of claim 9 wherein the at least one leg on the circuit board comprises:
 a pair of spaced legs projecting from one edge of the printed circuit board; and
 electrically conductive elements carried on each of the pair of legs.

11. The watthour meter socket adapter of claim 9 wherein:
 the electrically conductive element on the at least one leg comprises an electrically conductive foil fixedly mounted on the at least one leg.

12. The watthour meter socket adapter of claim 9 wherein the electrically conductive member on the at least one leg comprises:
 an electrically conductive plate overlaying the one leg.

13. The watthour meter socket adapter of claim 9 wherein the electrically conductive member on the at least one leg comprises:
 an electrically conductive plate projecting from the circuit board and forming the leg on the circuit board.

14. The watthour meter socket adapter of claim 9 further comprising:
 an electrical contact carried on the circuit board for receiving a terminal therein.

15. A watthour meter socket adapter having a base wall and a sidewall projecting from the base wall, the watthour meter socket adapter comprising:
 a circuit board carrying an electrical component, the circuit board fixedly mounted in the watthour meter socket adapter in a predetermined orientation with respect to the base wall; and
 means for providing external access to the electrical component on the circuit board through one of the base wall and the sidewall of the socket adapter, the accessing means including:
  an aperture formed in at least one of the base wall and the sidewall of the watthour meter socket adapter; and
  an electrical connector mounted in the aperture, the connector electrically connected to the electrical component on the circuit board internally of the watthour meter socket adapter.

16. The watthour meter socket adapter of claim 15 wherein the means for accessing the electrical component on the circuit board comprises:
 an aperture formed in at least one of the base wall and the sidewall of the watthour meter socket adapter; and
 a switch mounted in the aperture, the switch electrically connected to the electrical component for controlling an operation of the electrical component.

17. The watthour meter socket adapter of claim 15 further comprising:
 a shield mounted internally within the watthour meter socket adapter and adapted to substantially prevent access to electrical contacts mounted in the base wall of the watthour meter socket adapter; and
 the means for accessing the electrical component on the circuit board including at least one aperture formed in the shield.

18. The watthour meter socket adapter of claim 17 further comprising:
 an electrical control element mounted in the at least one aperture in the shield and electrically connected to the electrical component.

19. A watthour meter socket adapter including a housing having a base wall and a sidewall extending from the base wall, the socket adapter comprising:
 a support carried in the housing;
 at least one aperture formed in the base wall of the watthour meter socket adapter;
 a circuit board mounted in the support and having at least one leg projecting therefrom, an electrically conductive element carried on the at least one leg, the leg insertable through the at least one aperture in the base wall for electrical connection external of the base wall, an open-ended notch formed on at least one side of the circuit board; and
 a surge ground conductor mounted on the sidewall of the watthour meter socket adapter, the surge ground conductor having a tab disposed at one end bendable into engagement with the open notch in the circuit board to fixedly mount the circuit board in the watthour meter socket adapter.

20. A watthour meter socket adapter including a housing having a base wall and a sidewall extending from the base wall, the socket adapter comprising:
 a support carried in the housing;
 at least one aperture formed in the base wall of the watthour meter socket adapter;
 a circuit board mounted in the support and having at least one leg projecting therefrom, an electrically conductive element carried on the at least one leg, the leg insertable through the at least one aperture in the base wall for electrical connection external of the base wall;
 the at least one leg on the circuit board including a pair of spaced legs projecting from one edge of the printed circuit board;
 electrically conductive elements carried on each of the pair of legs; and
 a pair of diametrically opposed surge ground conductors mounted on the sidewall of the watthour meter socket adapter, each surge ground conductor having a tab bendable into engagement with one notch in the circuit board to fixedly mount the circuit board in the watthour meter socket adapter.

21. A watthour meter socket adapter including a housing having a base wall and a sidewall extending from the base wall, the socket adapter comprising:
 a support carried in the housing;
 at least one aperture formed in the base wall of the watthour meter socket adapter;
 a circuit board mounted in the support and having at least one leg projecting therefrom, an electrically conductive element carried on the at least one leg, the leg insertable through the at least one aperture in the base wall for electrical connection external of the base wall; and an electrical contact carried on the circuit board for receiving a terminal therein, the electrical contact including first and second contact clips fixedly mounted on the circuit board and having spaced ends defining a spring jaw there between for receiving a terminal.

22. A watthour meter socket adapter including a housing having a base wall and a sidewall extending from the base wall, the socket adapter comprising:

a support carried in the housing;

at least one aperture formed in the base wall of the watthour meter socket adapter;

a circuit board mounted in the support and having at least one leg projecting therefrom, an electrically conductive element carried on the at least one leg, the leg insertable through the at least one aperture in the base wall for electrical connection external of the base wall; and an electrical contact carried on the circuit board for receiving a terminal therein, the electrical contact including first and second contact clips fixedly mounted on the circuit board and having spaced ends defining a spring jaw therebetween for receiving a terminal.

* * * * *